(12) United States Patent
Mukai et al.

(10) Patent No.: US 6,347,050 B1
(45) Date of Patent: Feb. 12, 2002

(54) SEMICONDUCTOR MEMORY CELL AND METHOD OF MANUFACTURING THE SAME

(75) Inventors: Mikio Mukai, Kanagawa; Yutaka Hayashi, Ibaraki, both of (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 09/538,369

(22) Filed: Mar. 29, 2000

Related U.S. Application Data

(62) Division of application No. 09/053,026, filed on Apr. 1, 1998, now Pat. No. 6,055,182.

(30) Foreign Application Priority Data

| Apr. 2, 1997 | (JP) | 9-083790 |
| Oct. 20, 1997 | (JP) | 9-287136 |
| Feb. 23, 1998 | (JP) | 10-040369 |

(51) Int. Cl.$^7$ .............................................. G11C 16/04
(52) U.S. Cl. .......................... 365/185.05; 365/185.01; 257/365; 257/369; 257/311; 257/314; 257/300; 257/272; 257/263; 257/288; 257/262
(58) Field of Search ...................... 365/185.01, 185.05; 257/365, 369, 311, 314, 272, 300, 263, 288, 262

(56) References Cited

U.S. PATENT DOCUMENTS

| 4,330,849 A | 5/1982 | Togei et al. |
| 4,434,433 A | 2/1984 | Nishizawa |
| 4,568,957 A | 2/1986 | Zuleeg et al. |
| 4,641,280 A | 2/1987 | Horiguchi et al. |
| 5,095,347 A | 3/1992 | Kirsch |
| 5,216,294 A | 6/1993 | Ryu |
| 5,281,842 A | 1/1994 | Yasuda et al. |
| 5,338,949 A | 8/1994 | Schoofs et al. |
| 5,393,998 A | 2/1995 | Ishii et al. |
| 5,412,234 A | 5/1995 | Schoofs et al. |
| 5,428,238 A | 6/1995 | Hayashi et al. |
| 5,448,513 A | 9/1995 | Hu et al. |
| 5,578,852 A | * 11/1996 | Hayashi et al. ............. 257/351 |
| 5,581,106 A | 12/1996 | Hayashi et al. |
| 5,698,874 A | * 12/1997 | Hayashi ..................... 257/232 |
| 5,712,498 A | 1/1998 | Reich et al. |
| 6,055,182 A | * 4/2000 | Mukai et al. .......... 365/185.05 |
| 6,240,010 B1 | * 5/2001 | Mukai et al. ............... 365/175 |

FOREIGN PATENT DOCUMENTS

| JP | 58064696 | 4/1983 |
| JP | 60-1695 | 7/1985 |

* cited by examiner

Primary Examiner—Viet Q. Nguyen
(74) Attorney, Agent, or Firm—Ronald P. Kananen; Rader, Fishman & Grauer PLLC

(57) ABSTRACT

A semiconductor memory cell comprising (1) a first transistor of a first conductivity type for read-out having source/drain regions composed of a surface region of a third region and a second region and a channel forming region composed of a surface region of a first region, (2) a second transistor of a second conductivity type for write-in having source/drain regions composed of the first region and a fourth region and a channel forming region composed of a surface region of the third region, and (3) a junction-field-effect transistor of a first conductivity type for current control having gate regions composed of the fourth region and a portion of the first region facing the fourth region, a channel region composed of the third region sandwiched by the fourth region and the first region and source/drain regions composed of the third region.

44 Claims, 56 Drawing Sheets

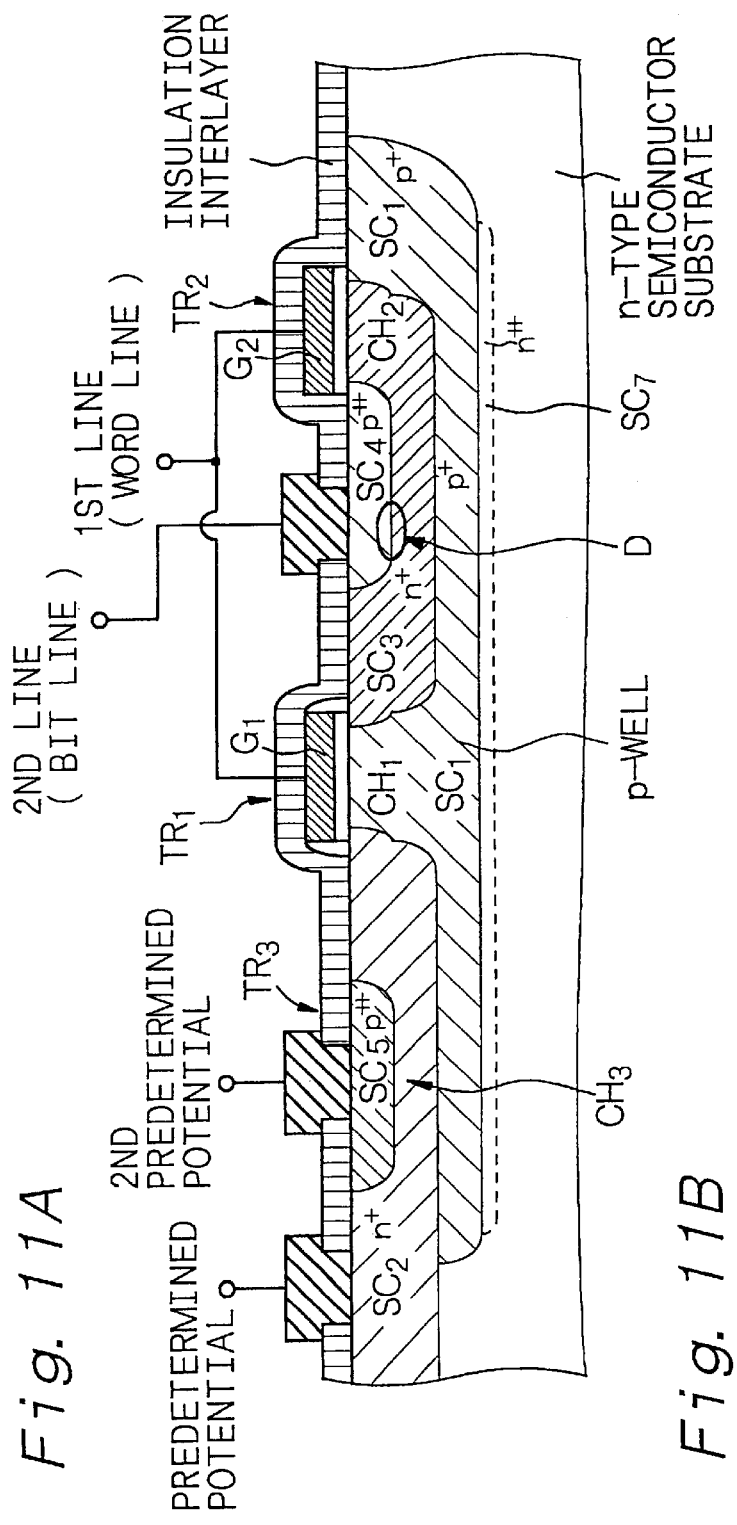
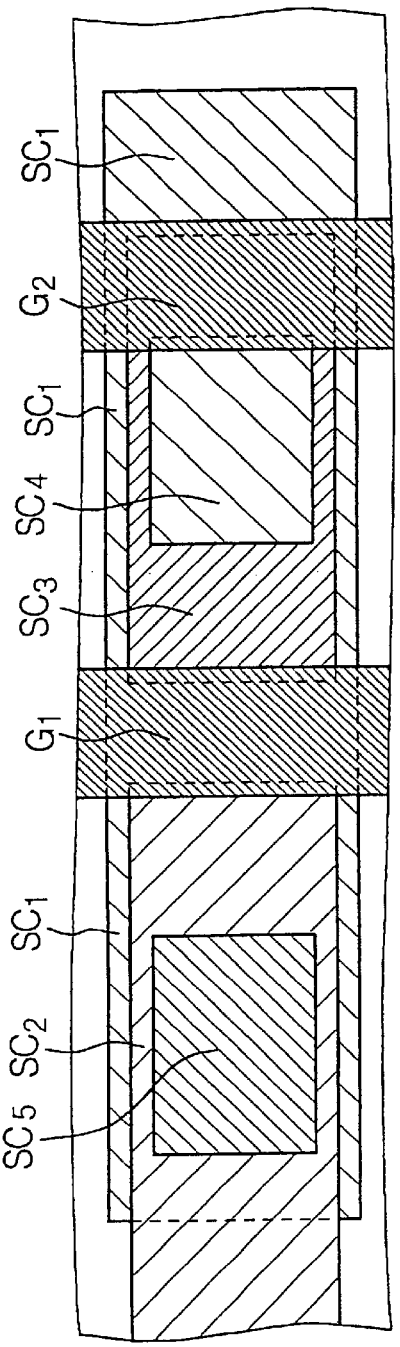
Fig. 11A
Fig. 11B

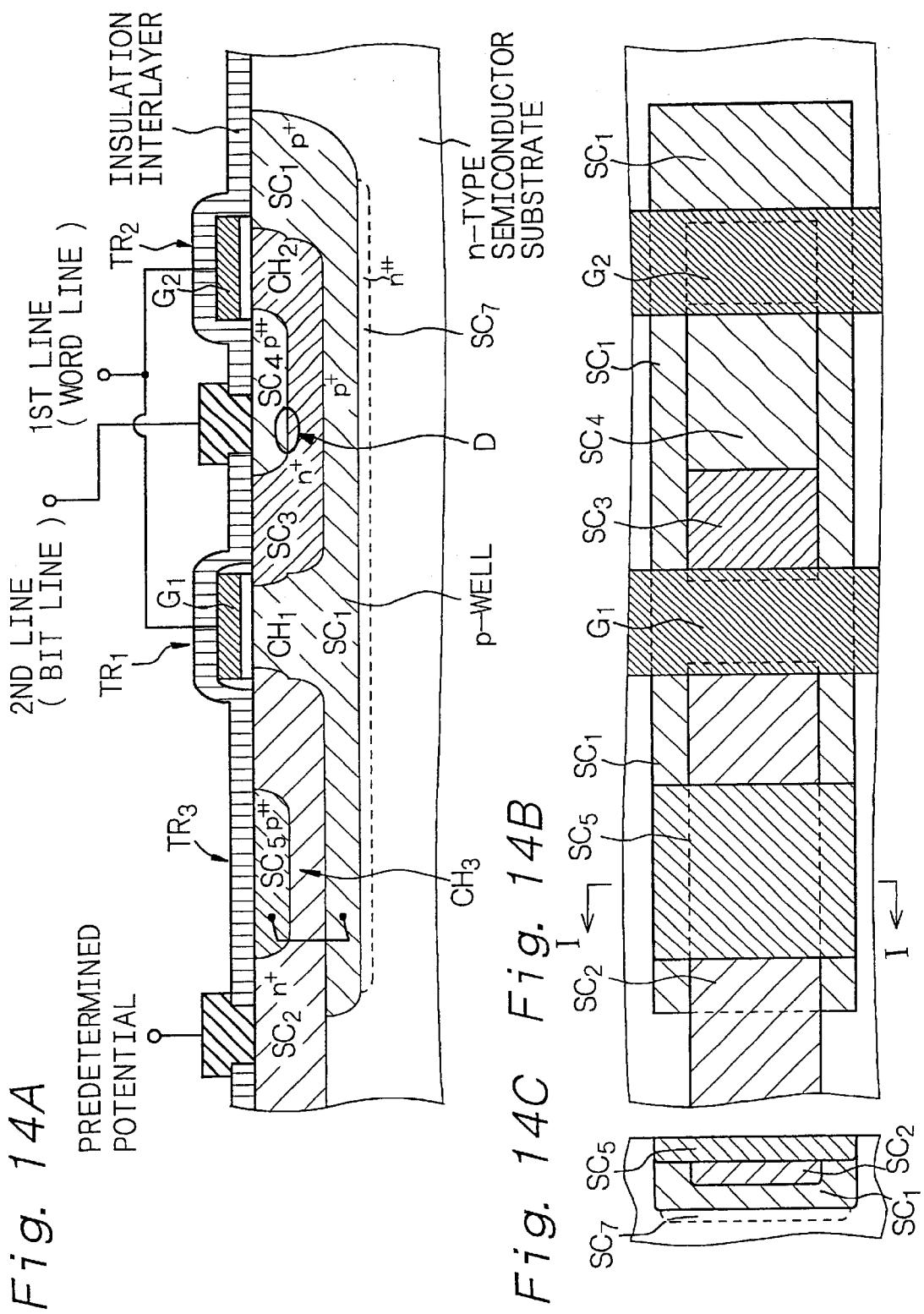

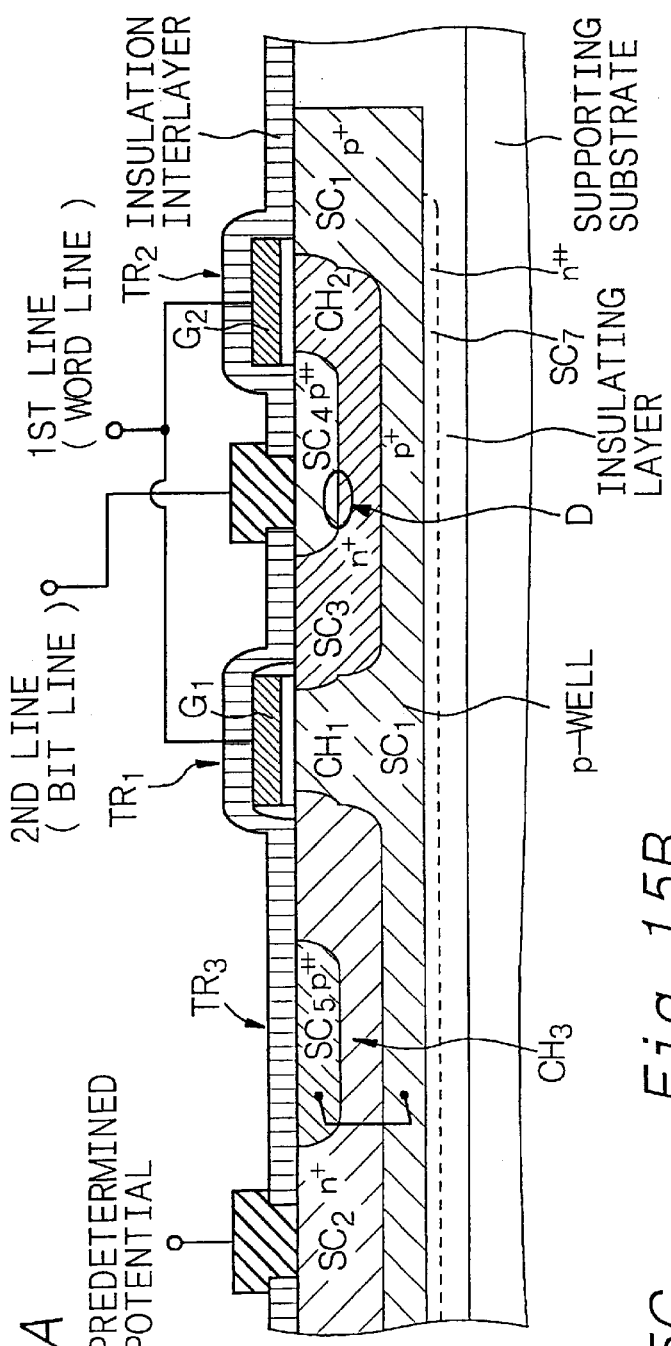
Fig. 15A
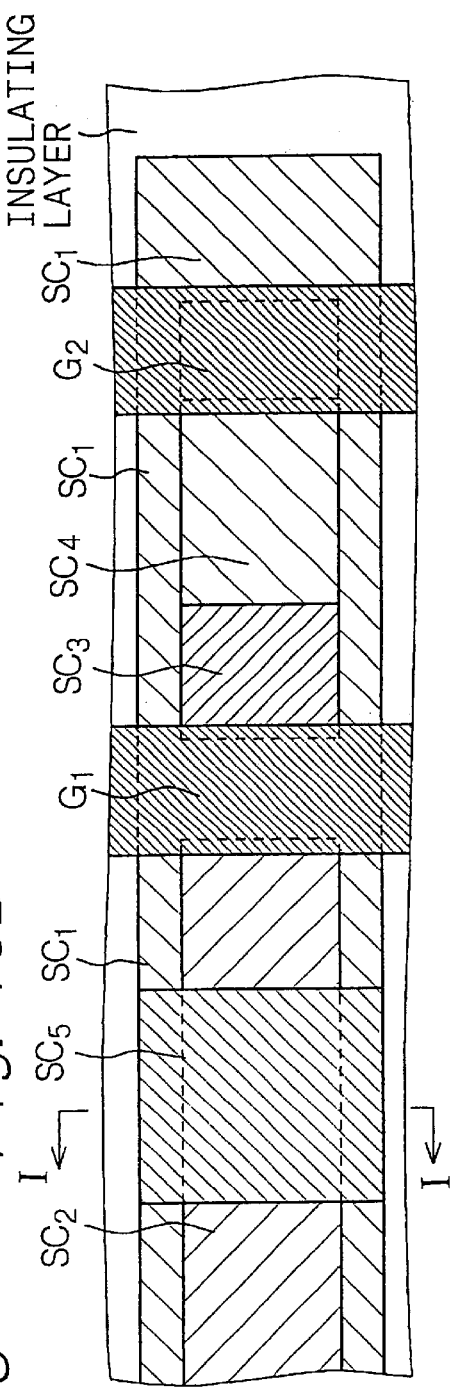
Fig. 15B
Fig. 15C

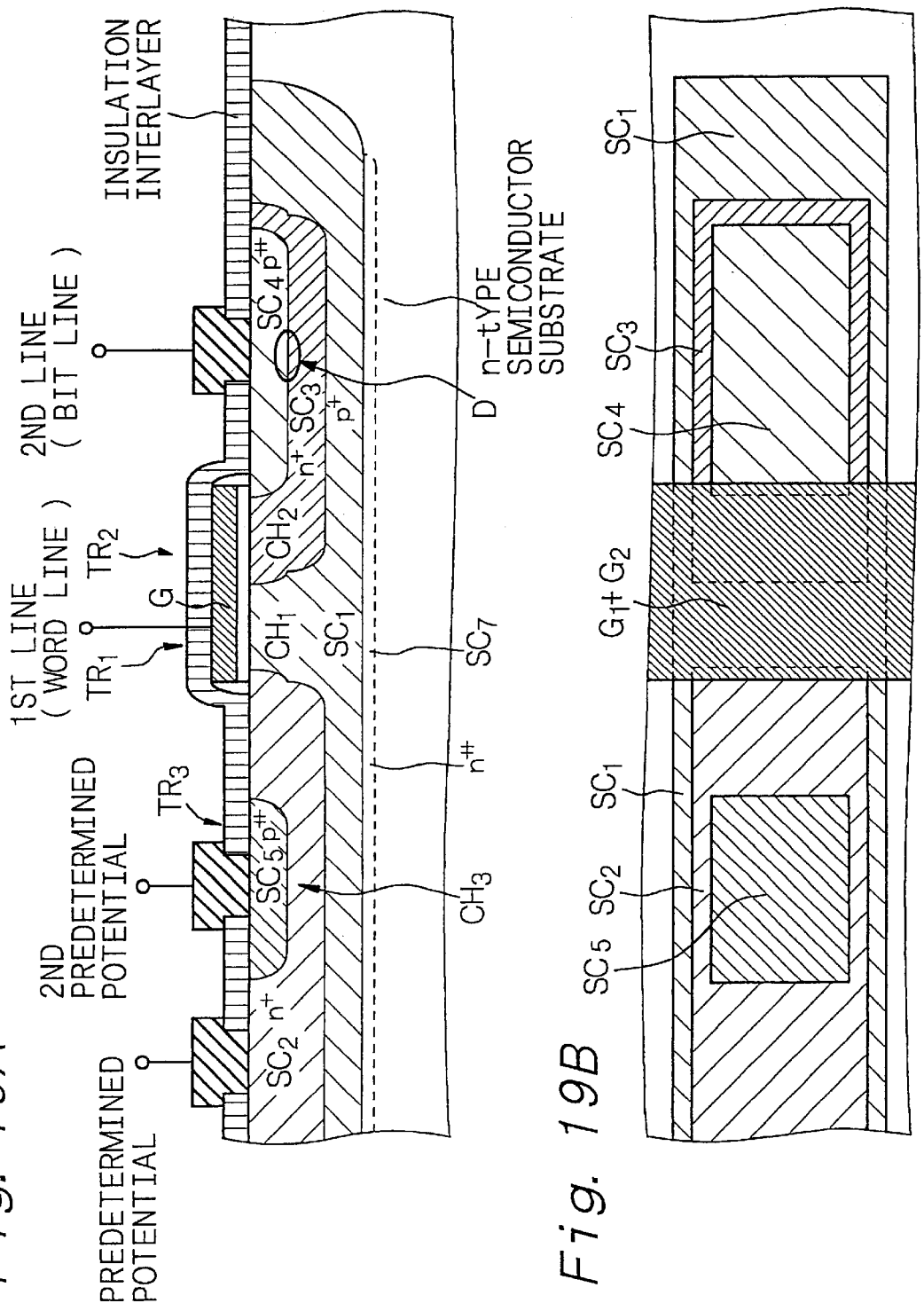

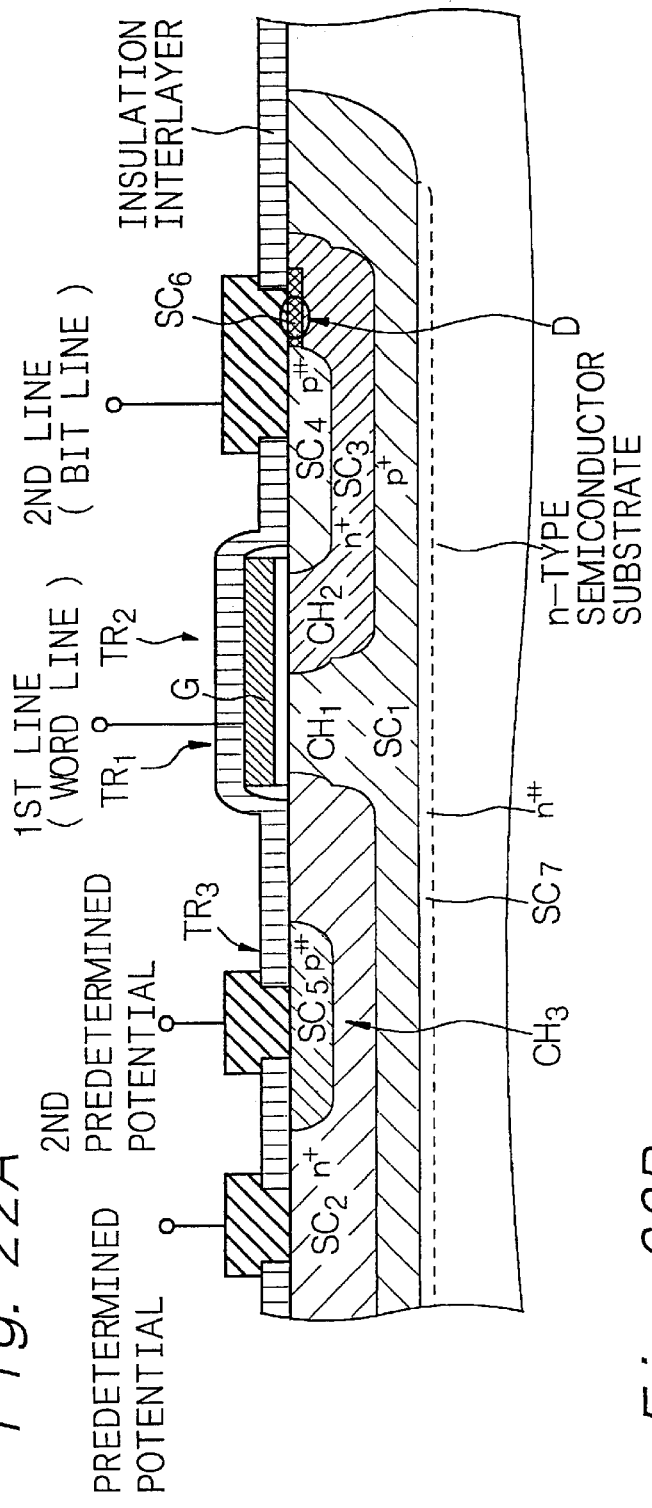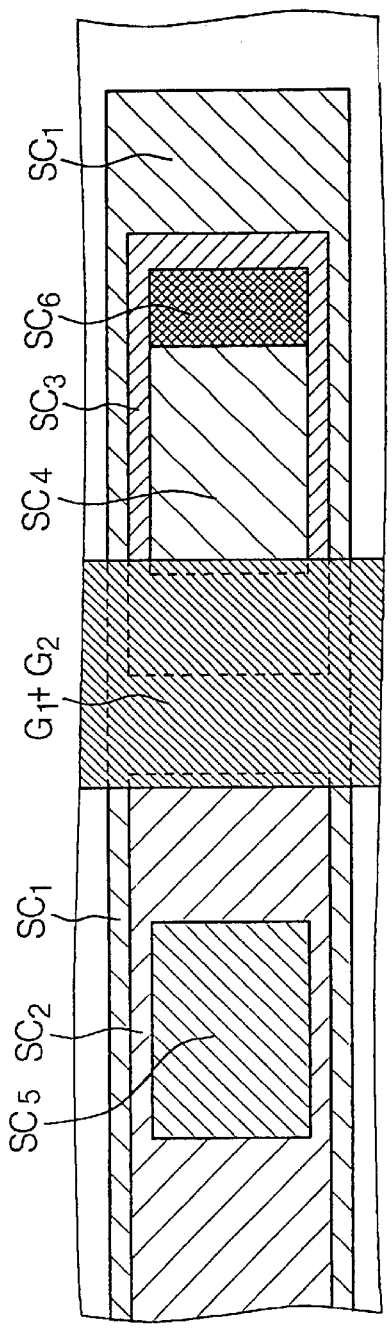

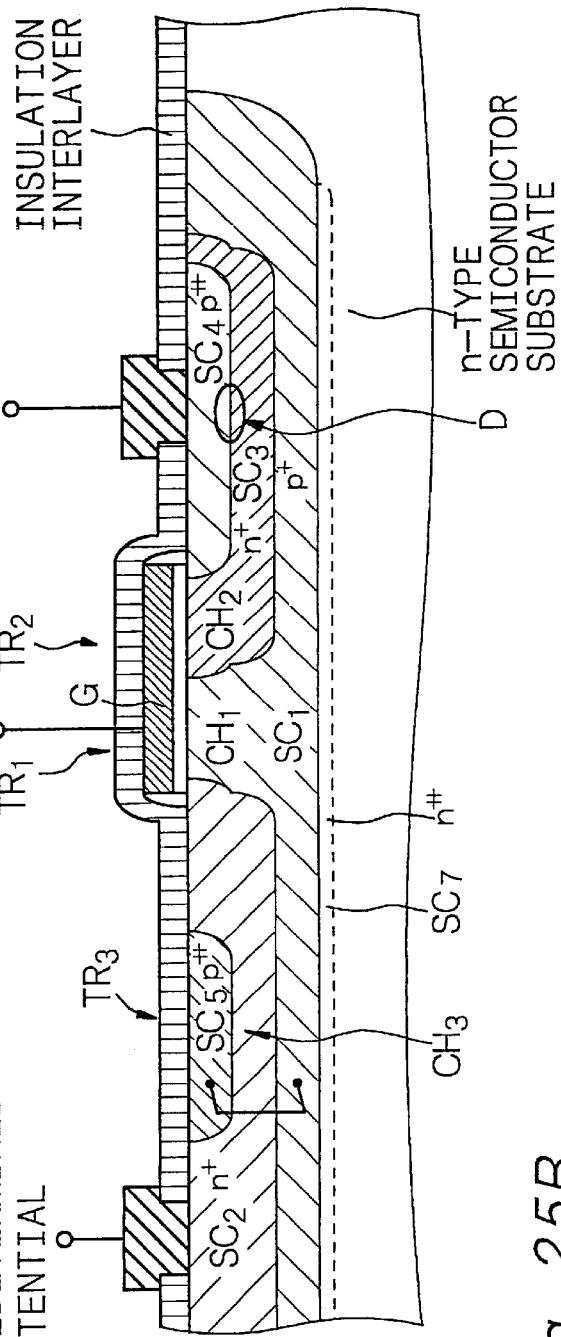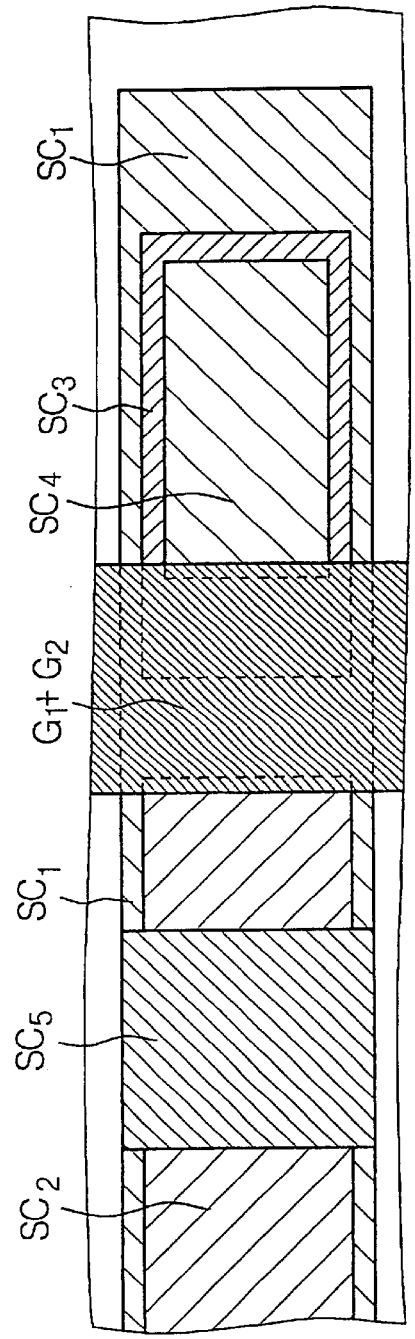
Fig. 25A
Fig. 25B

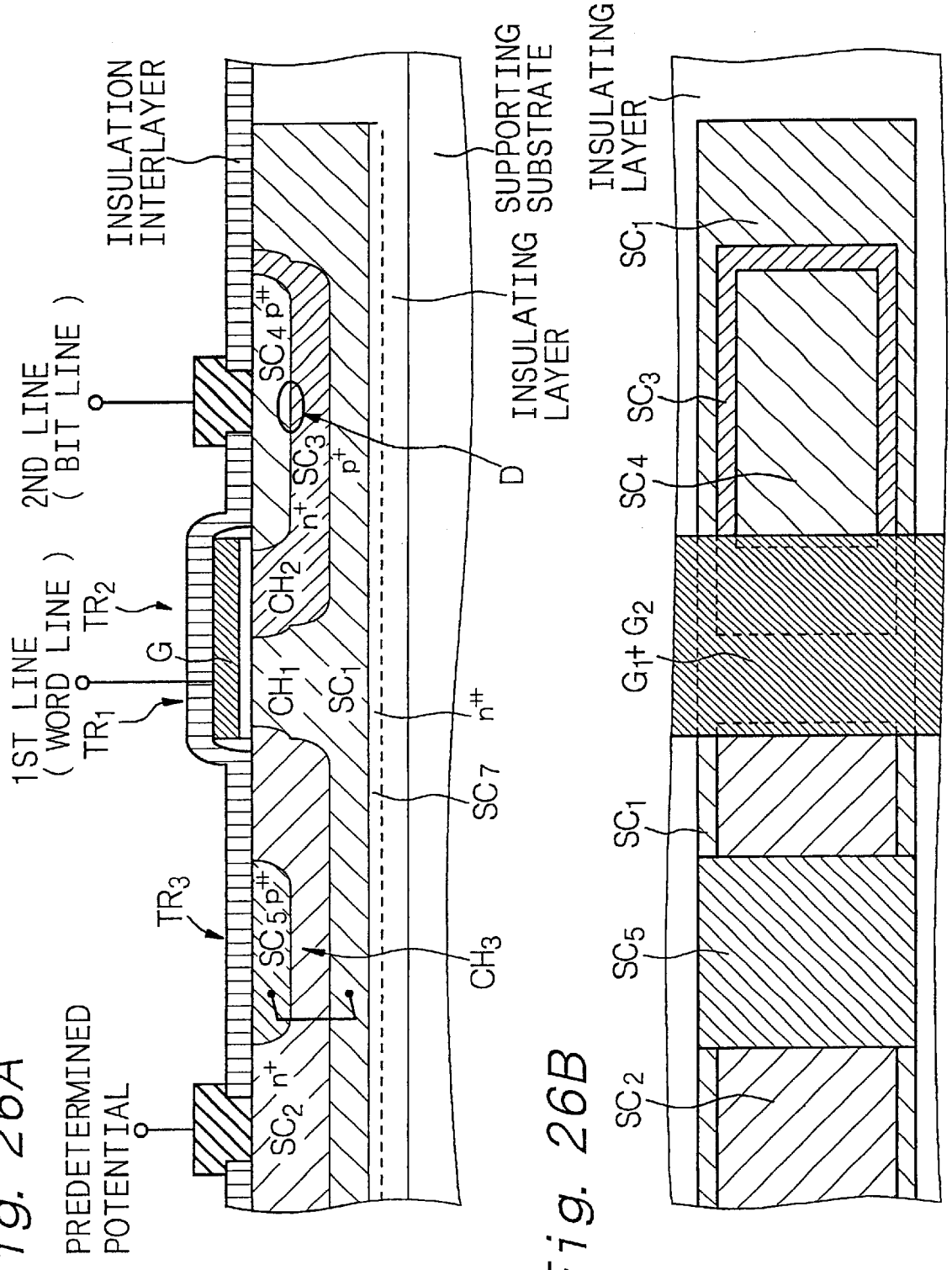

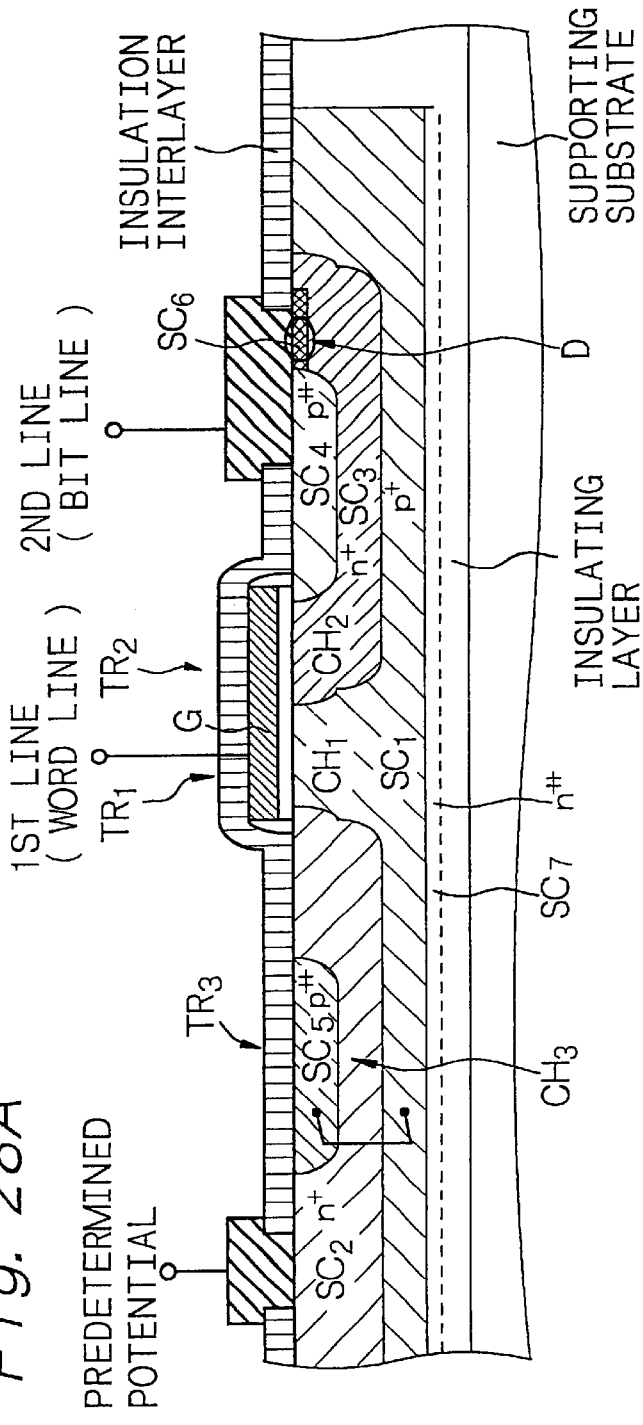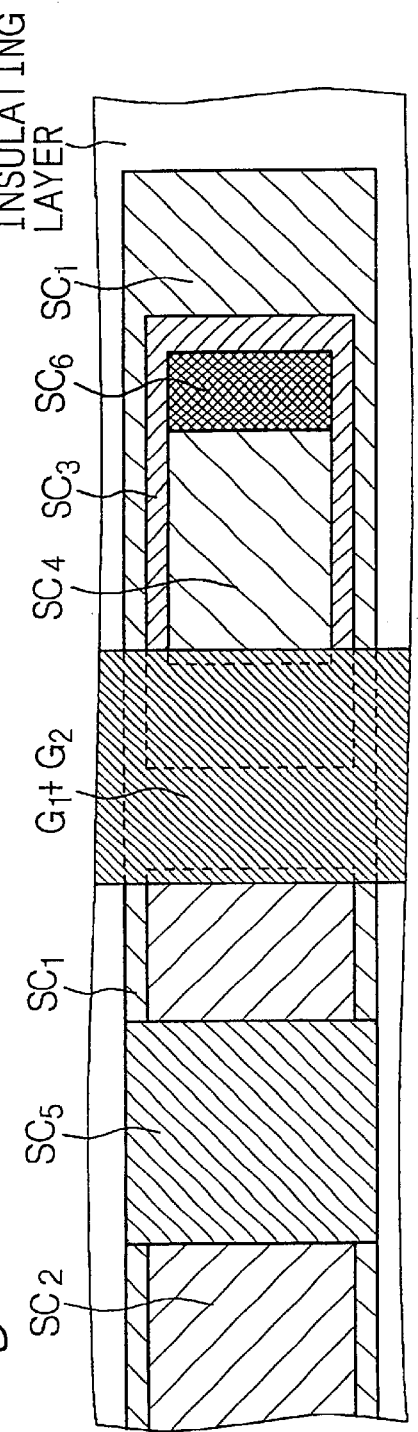

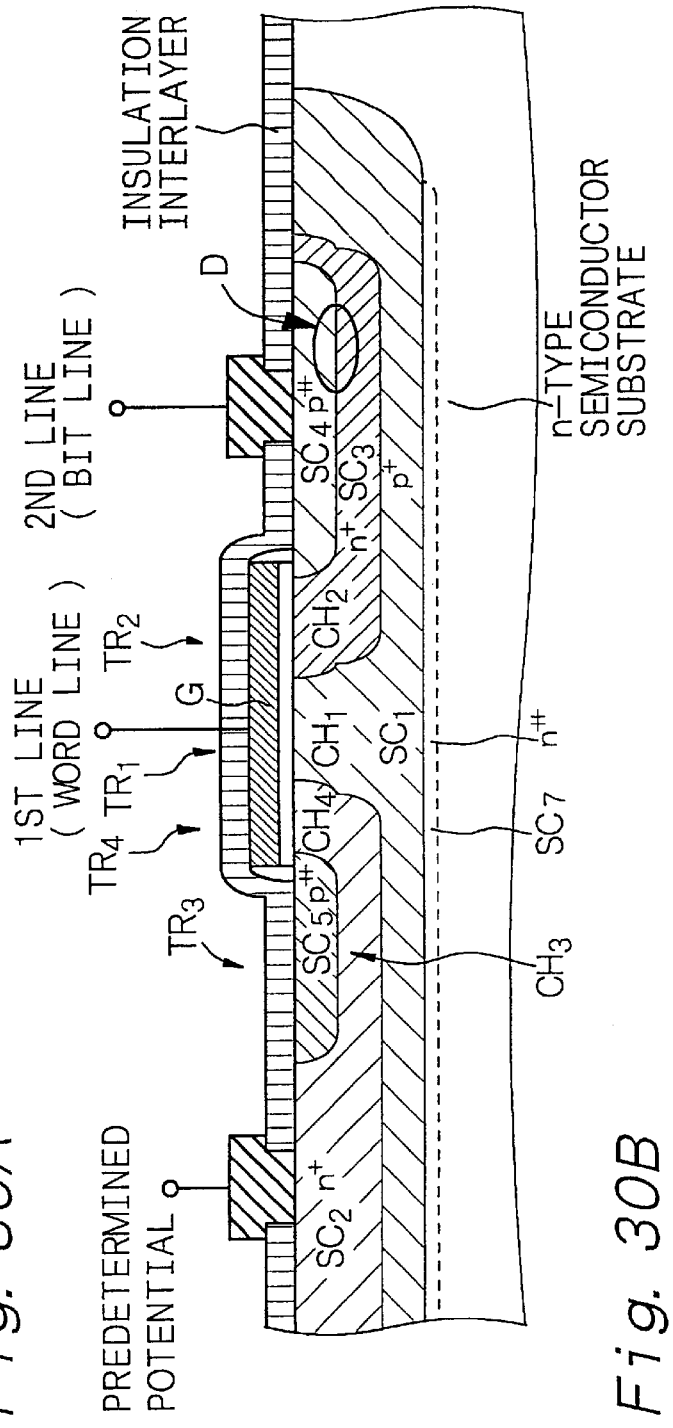
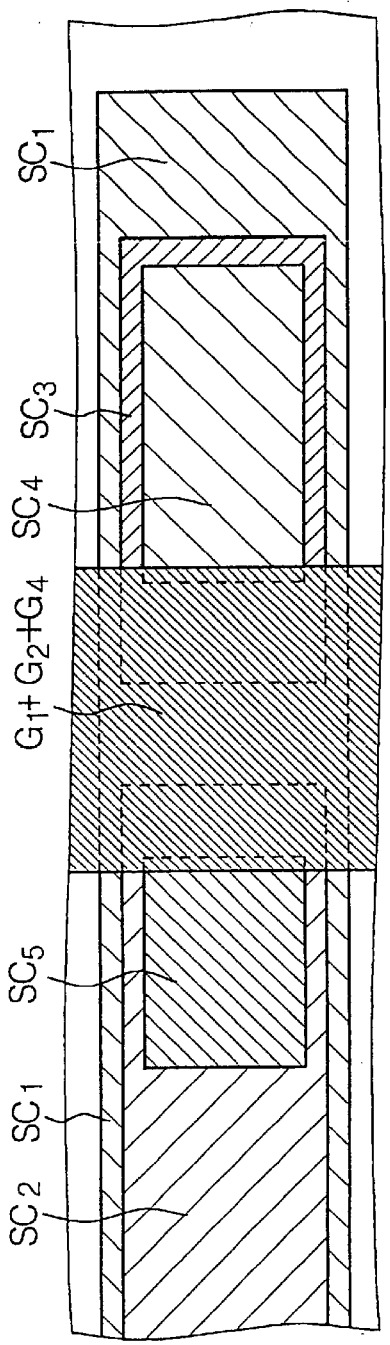
Fig. 30A
Fig. 30B

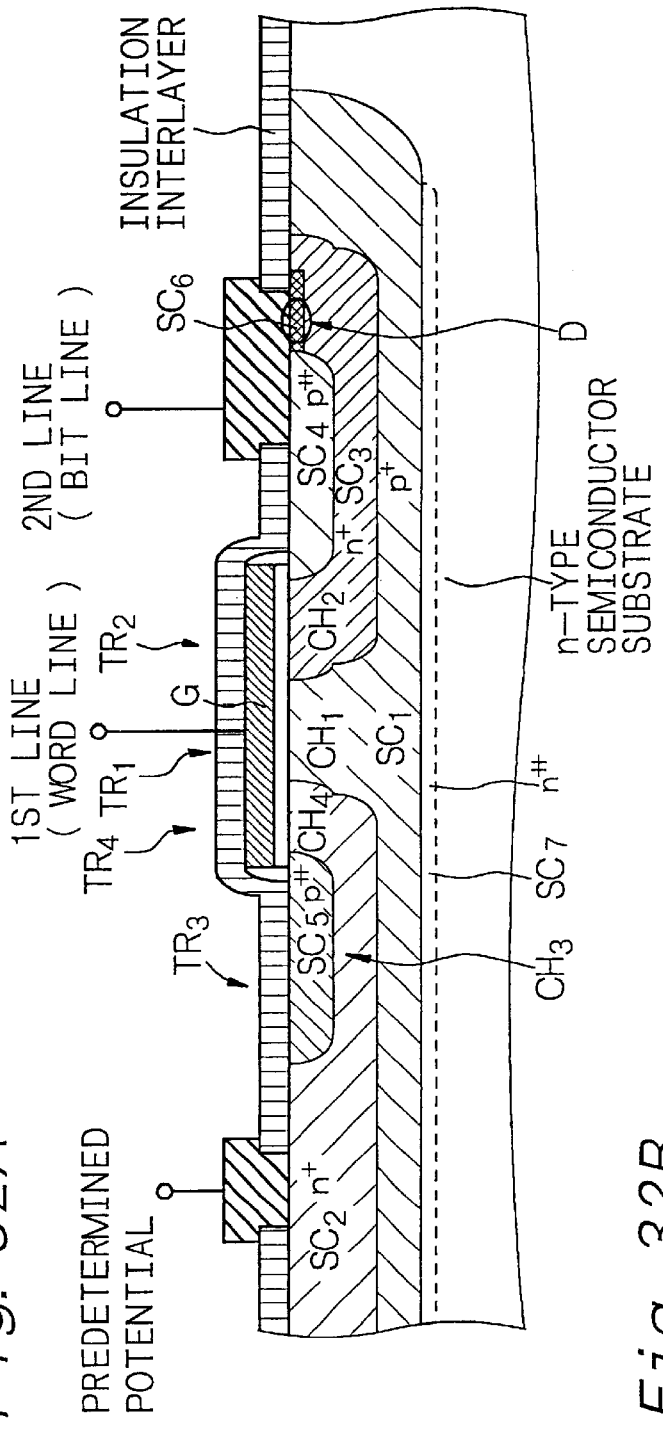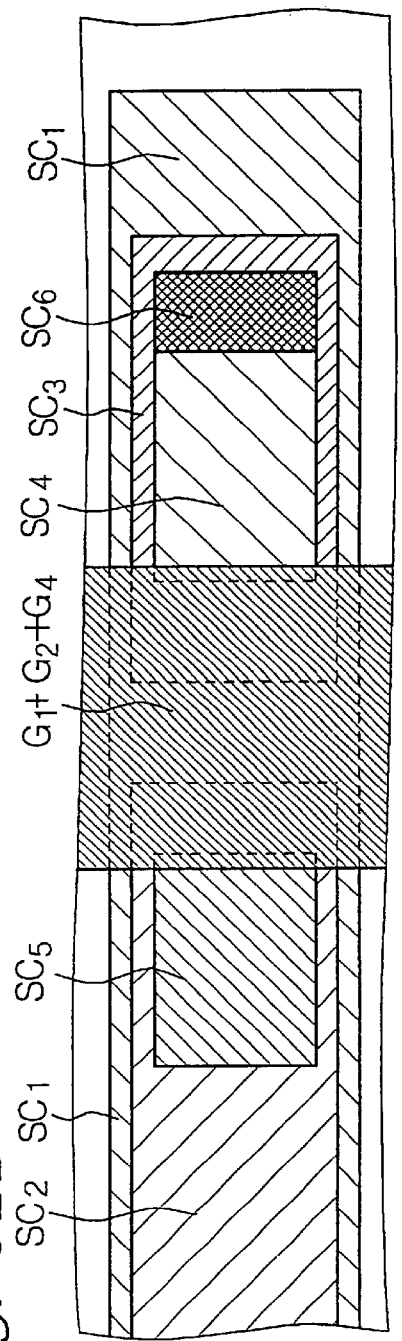
Fig. 32A
Fig. 32B

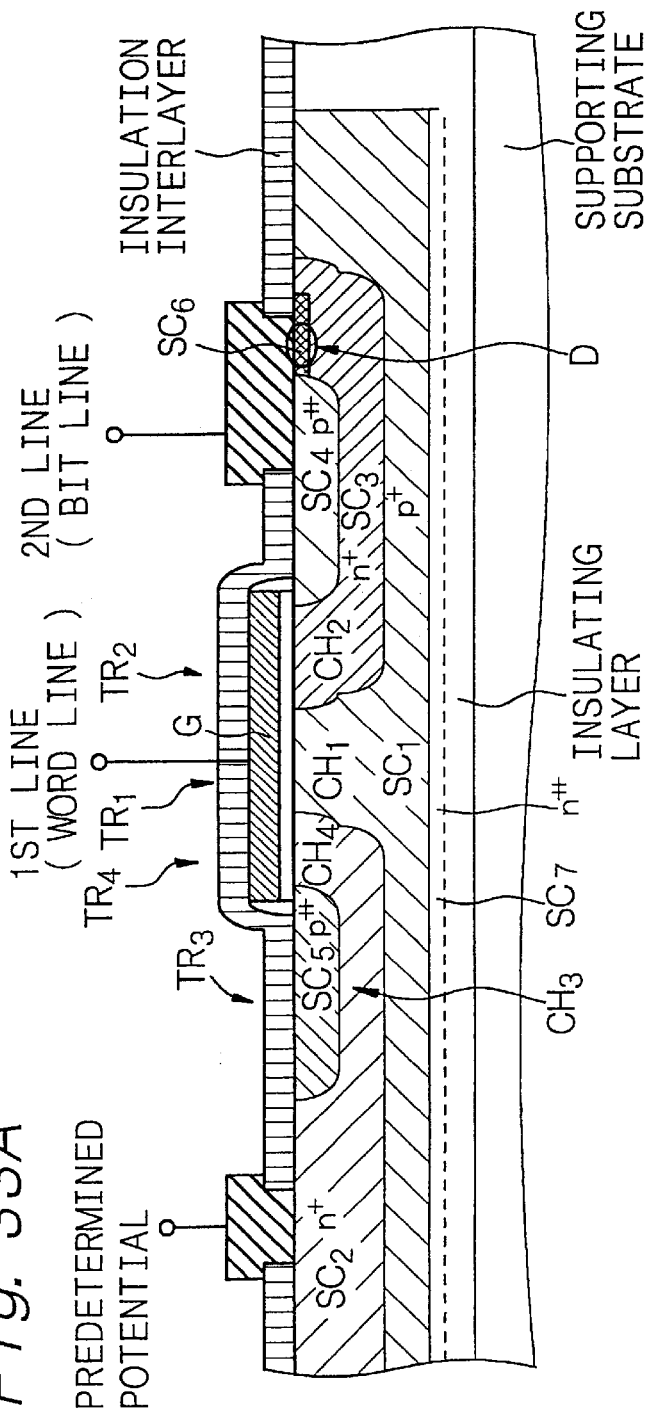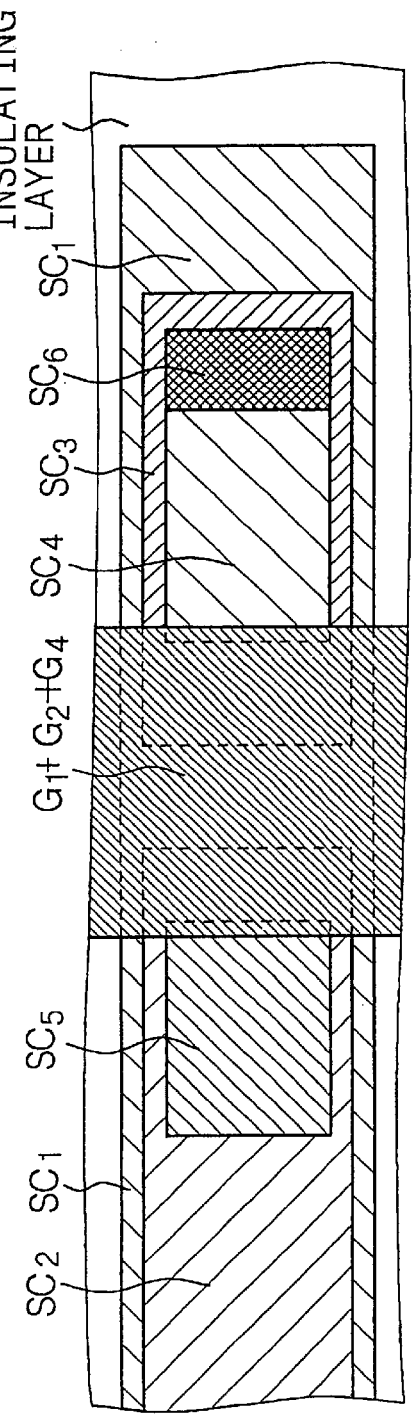

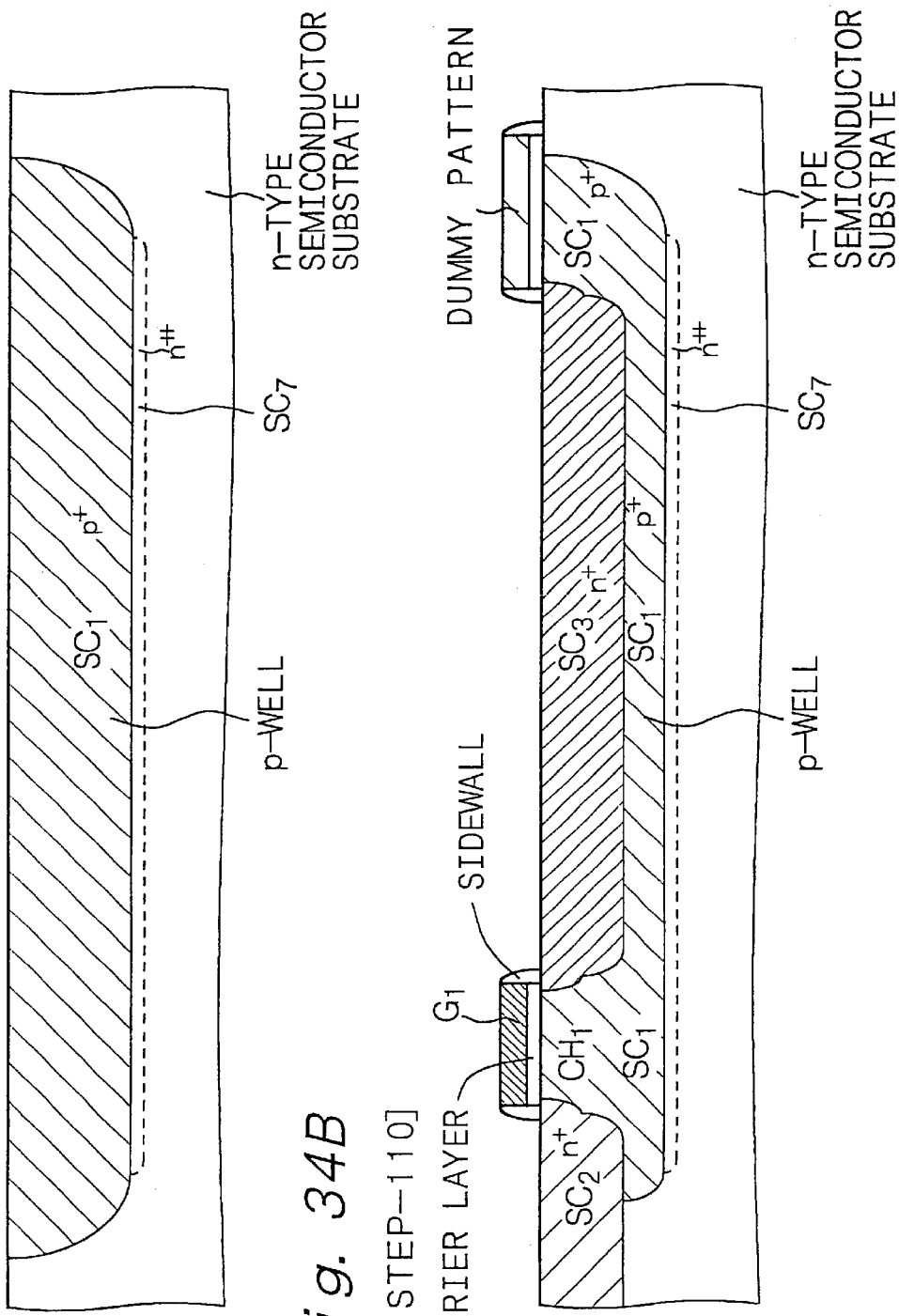

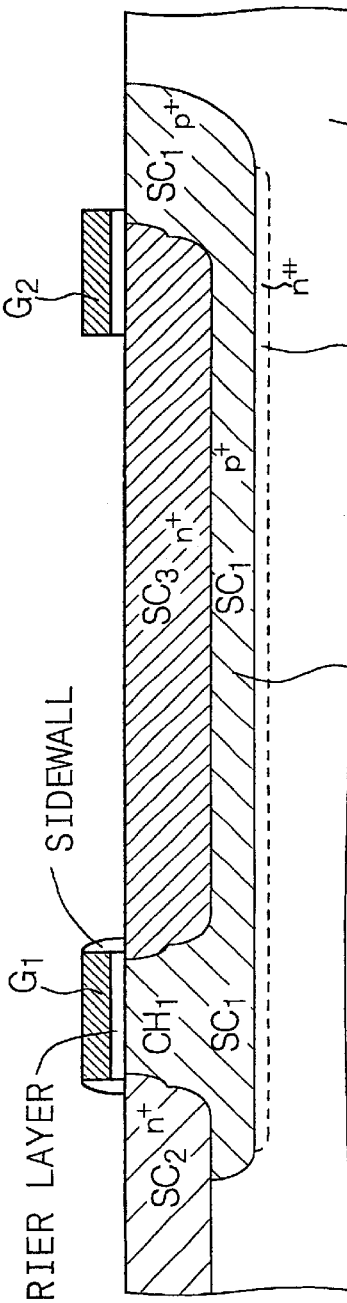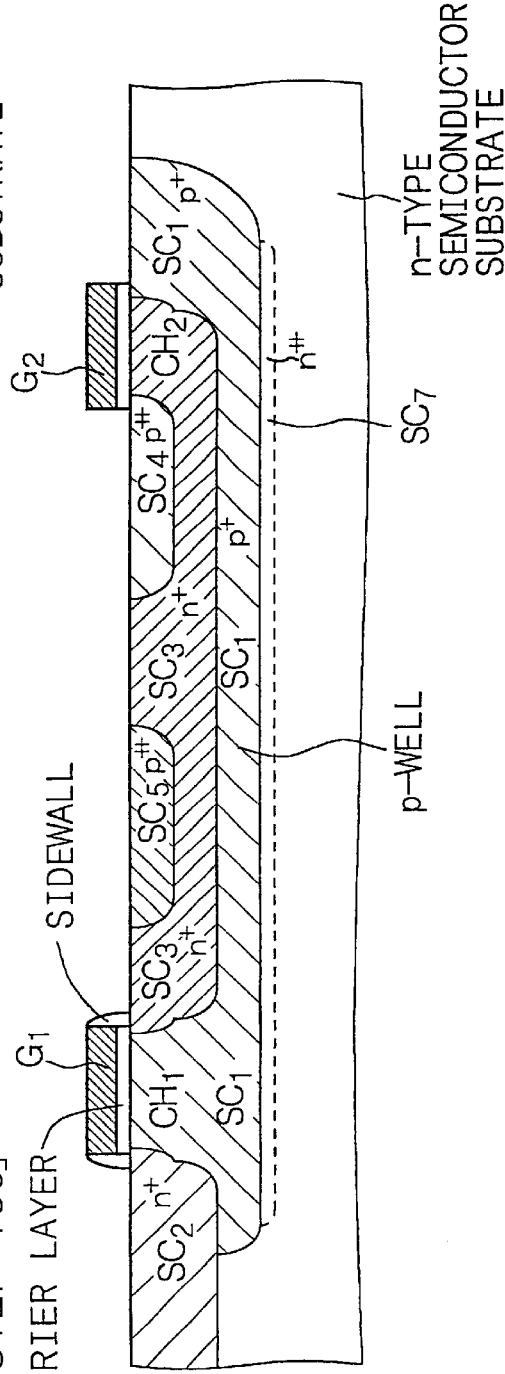
Fig. 35A [STEP-120]
Fig. 35B [STEP-130]

[STEP-300]

[STEP-310]

[STEP-320]

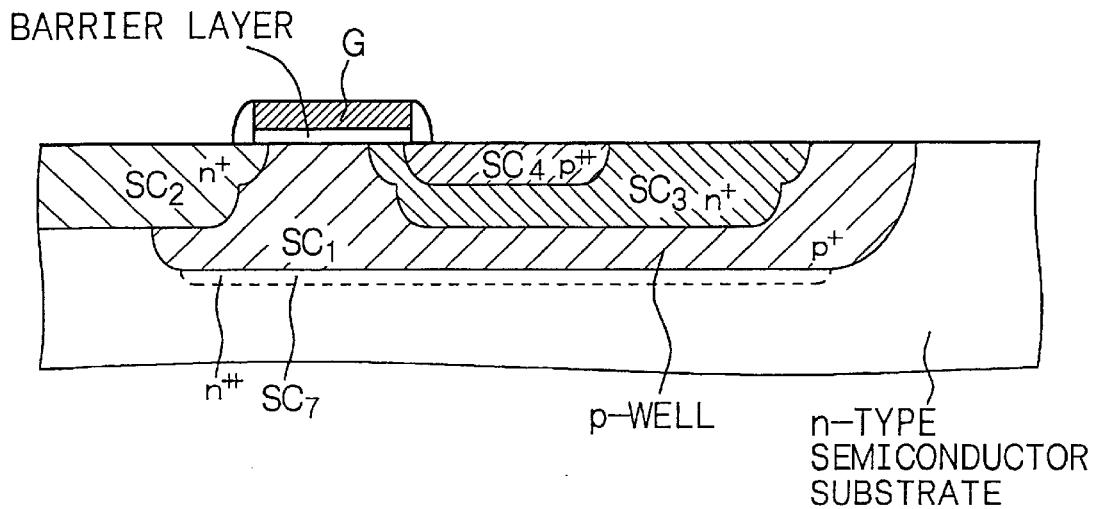
Fig. 37A [STEP-330]
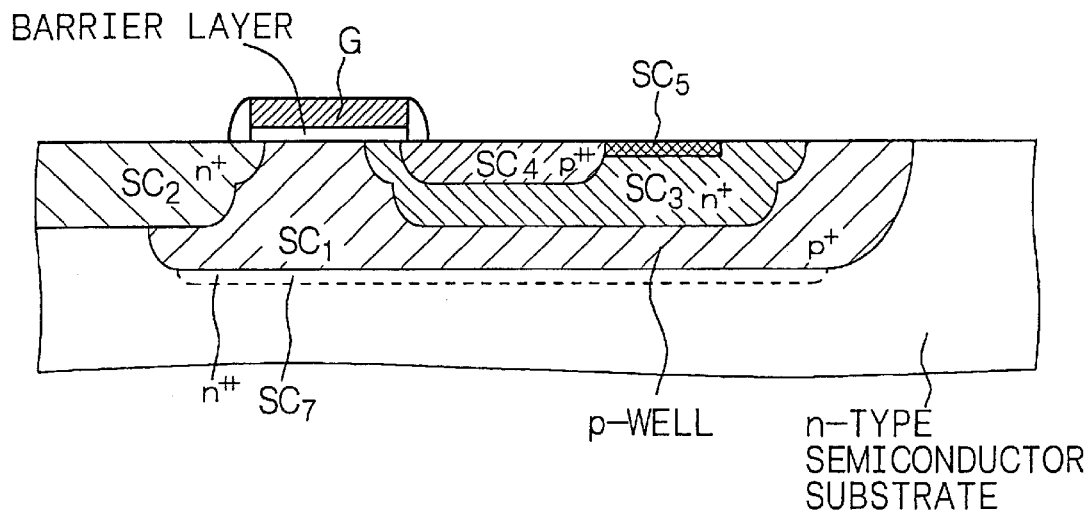
Fig. 37B [STEP-340]

SEMICONDUCTOR MEMORY CELL AND METHOD OF MANUFACTURING THE SAME

This application is a divisional of application Ser. No. 09/053,026 filed on Apr. 1, 1998, now U.S. Pat. No. 6,055,182.

BACKGROUND OF THE INVENTION AND RELATED ART STATEMENT

The present invention relates to a semiconductor memory cell comprising at least 3 transistors, a transistor for read-out, a transistor for write-in and a junction-field-effect transistor for current control, a semiconductor memory cell comprising a transistor for read-out, a transistor for write-in, a junction-field-effect transistor for current control and at least 1 diode, a semiconductor memory cell comprising at least 4 transistors, a transistor for read-out, a transistor for write-in, a junction-field-effect transistor for current control and a third transistor for write-in, or a semiconductor memory cell comprising a transistor for read-out, a transistor for write-in, a junction-field-effect transistor for current control, a third transistor for write-in and at least 1 diode, and a method of manufacturing the above semiconductor memory cell.

As a high-density semiconductor memory cell, there has been made available a dynamic semiconductor memory cell that can be said to be a single-transistor semiconductor memory cell including one transistor and one capacitor shown in FIG. 56. In the above semiconductor memory cell, an electric charge stored in the capacitor is required to be large enough to generate a sufficiently large voltage change on a bit line. However, as the planar dimensions of the semiconductor memory cell are reduced, the capacitor formed in a parallel planar shape decreases in size, which causes a new problem that, when information which is stored as an electric charge in the capacitor of the memory cell is read out, the read-out information is buried in noise, or that only a small voltage change is generated on the bit line since the stray capacitance of the bit line increases each time a new generation of the semiconductor memory cell is introduced. As means for solving the above problems, there has been proposed a dynamic semiconductor memory cell having a trench capacitor cell structure shown in FIG. 57 or a stacked capacitor cell structure. Since, however, the fabrication-related technology has its own limits on the depth of the trench (or the groove) or the height of the stack, the capacitance of the capacitor is also limited. For this reason, dynamic semiconductor memory cells having the above structures are said to reach the limit of dimensions smaller than those of the low sub-micron rules unless expensive new materials are introduced for the capacitor.

In the planar dimensions smaller than those of the low sub-micron rule, the transistor constituting the semiconductor memory cell also has problems of deterioration of the dielectric strength characteristic and punchthrough. There is therefore a large risk that current leakage arises even if the voltage applied to the semiconductor memory cell is still within a predetermined range. When a semiconductor memory cell is made infinitesimal in size, therefore, it is difficult to normally operate the semiconductor memory cell having a conventional transistor structure.

For overcoming the above limit problems of the capacitor, the present applicant has proposed a semiconductor memory cell comprising two transistors or two transistors physically merged into one unit, as is disclosed in Japanese Patent Application No. 246264/1993 (Japanese Patent Laid-open No. 99251/1995), corresponding to U.S. Pat. No. 5,428,238. The semiconductor memory cell shown in FIGS. 15(A) and 15(B) of Japanese Patent Laid-Open No. 99251/1995 comprises a first semi-conductive region $SC_1$ of a first conductivity type formed in a surface region of a semiconductor substrate or formed on an insulating substrate, a first conductive region $SC_2$ formed in a surface region of the first semi-conductive region $SC_1$ so as to form a rectifier junction together with the first semi-conductive region $SC_1$, a second semi-conductive region $SC_3$ of a second conductivity type formed in a surface region of the first semi-conductive region $SC_1$ and spaced from the first conductive region $SC_2$, a second conductive region $SC_4$ formed in a surface region of the second semi-conductive region $SC_3$ so as to form a rectifier junction together with the second semi-conductive region $SC_3$, and a conductive gate G formed on a barrier layer so as to bridge the first semi-conductive region SC, and the second conductive region $SC_4$ and so as to bridge the first conductive region $SC_2$ and the second semi-conductive region $SC_3$, the conductive gate G being connected to a first memory-cell-selecting line, the first conductive region $SC_2$ being connected to an information write-in setting line, and the second conductive region $SC_4$ being connected to a second memory-cell-selecting line.

The first semi-conductive region $SC_1$ (to function as a channel forming region $Ch_2$), the first conductive region $SC_2$ (to function as one source/drain region), the second semi-conductive region $SC_3$ (to function as the other source/drain region) and the conductive gate G constitute a switching transistor $TR_2$. On the other hand, the second semi-conductive region $SC_3$ (to function as a channel forming region $Ch_1$), the first semi-conductive region $SC_1$ (to function as one source/drain region), the second conductive region $SC_4$ (to function as the other source/drain region) and the conductive gate G constitute an information storing transistor $TR_1$.

When information is written in the above semiconductor memory cell, the switching transistor $TR_2$ is brought into an on-state. As a result, the information is stored in the channel forming region $Ch_1$ of the information storing transistor $TR_1$ as a potential or as an electric charge. When the information is read out, a threshold voltage of the information storing transistor $TR_1$ seen from the conductive gate G varies, depending upon the potential or the electric charge stored in the channel forming region $Ch_1$ of the information storing transistor $TR_1$. Therefore, when the information is read out, the storage state of the information storing transistor $TR_1$ can be judged from the magnitude of a channel current (including a zero magnitude) by applying a properly selected potential to the conductive gate G. The information is read out by detecting the operation state of the information storing transistor $TR_1$.

That is, when the information is read out, the information storing transistor $TR_1$ is brought into an on-state or an off-state, depending upon the information stored therein. Since the second conductive region $SC_4$ is connected to the second memory-cell-selecting line, a large current or a small current may flow in the information storing transistor $TR_1$, depending upon the stored information ("0" or "1"). In this way, the information stored in the semiconductor memory cell can be read out by utilizing the information storing transistor $TR_1$.

However, when the information is read out, the semiconductor memory cell has no mechanism for controlling the current which flows through the first semi-conductive region $SC_1$ sandwiched by the first conductive region $SC_2$ and the second semi-conductive region $SC_3$. Therefore, when the information stored in the information storing transistor $TR_1$ is detected with the conductive gate G, only a small margin of the current which flows between the first semi-conductive region $SC_1$ and the second conductive region $SC_4$ is obtained, which causes a problem that the number of the semiconductor memory cells connected to the second memory-cell-selecting line (a bit line) is limited.

OBJECT AND SUMMARY OF THE INVENTION

It is therefore an object of the present invention to provide a semiconductor memory cell which attains the stable performance of transistors, a large window (current difference) for reading out information stored therein and permits infinitesimal dimensions or to provide a logic semiconductor memory cell.

Further, it is an object of the present invention to provide a semiconductor memory cell comprising at least 3 transistors, a transistor for read-out, a transistor for write-in and a junction-field-effect transistor for current control, or a semiconductor memory cell comprising a transistor for read-out, a transistor for write-in, a junction-field-effect transistor for current control and at least 1 diode.

Further, it is another object of the present invention to provide a semiconductor memory cell comprising at least 4 transistors, a transistor for read-out, a transistor for write-in, a junction-field-effect transistor for current control and a third transistor for write-in, or a semiconductor memory cell comprising a transistor for read-out, a transistor for write-in, a junction-field-effect transistor for current control, a third transistor for write-in and at least 1 diode.

It is further another object of the present invention to provide a semiconductor memory cell having the above various transistors and diode merged into one, and a process for the manufacture thereof.

As shown in principle drawings of FIGS. 1A, 1B, 5, 16A and 16B, for achieving the above object, according to a first aspect of the present invention, there is provided a semiconductor memory cell comprising a first transistor $TR_1$ of a first conductivity type for read-out, a second transistor $TR_2$ of a second conductivity type for write-in, and a junction-field-effect transistor $TR_3$ of a first conductivity type for current control,
wherein:

(A-1) one source/drain region of the first transistor $TR_1$ is connected to a predetermined potential, (A-2) the other source/drain region of the first transistor $TR_1$ has a common region with one source/drain region of the junction-field-effect transistor $TR_3$, (A-3) a gate region $G_1$ of the first transistor $TR_1$ is connected to a first memory-cell-selecting line, (B-1) one source/drain region of the second transistor $TR_2$ is connected to a second memory-cell-selecting line, (B-2) the other source/drain region of the second transistor $TR_2$ has a common region with a channel forming region $CH_1$ of the first transistor $TR_1$ and with a first gate region of the junction-field-effect transistor $TR_3$, (B-3) a gate region $G_2$ of the second transistor $TR_2$ is connected to the first memory-cell-selecting line, (C-1) a second gate region of the junction-field-effect transistor $TR_3$ faces the first gate region thereof through a channel region $CH_3$ thereof, the channel region $CH_3$ thereof being an extended region of the other source/drain region of the first transistor $TR_1$, and (C-2) the other source/drain region of the junction-field-effect transistor $TR_3$ is positioned in the extended region of the other source/drain region of the first transistor $TR_1$ via the channel region $CH_3$.

As shown in a principle drawing of FIG. 1A, the semiconductor memory cell according to the first aspect of the present invention preferably has a configuration in which the second gate region of the junction-field-effect transistor $TR_3$ is connected to a second predetermined potential, and the other source/drain region of the junction-field-effect transistor $TR_3$ is connected to an information read-out line. Alternatively, as shown in a principle drawing of FIG. 1B, the semiconductor memory cell preferably has a configuration in which the second gate region of the junction-field-effect transistor $TR_3$ is connected to a second predetermined potential, and a junction portion of the other source/drain region of the junction-field-effect transistor $TR_3$ and one source/drain region of the second transistor $TR_2$ forms a diode D. Alternatively, as shown in a principle drawing of FIG. 5, the semiconductor memory cell may further comprise a diode D, and preferably has a configuration in which the second gate region of the junction-field-effect transistor $TR_3$ is connected to a second predetermined potential and in which the other source/drain region of the junction-field-effect transistor $TR_3$ is connected to the second predetermined potential through the diode D. In the drawings, the first memory-cell-selecting line is referred to as "1ST LINE", and the second memory-cell-selecting line is referred to as "2ND LINE".

Further, as shown in a principle drawing of FIG. 7, the semiconductor memory cell according to the first aspect of the present invention preferably has a configuration in which the first gate region and the second gate region of the junction-field-effect transistor $TR_3$ are connected to each other, a junction portion of the other source/drain region of the junction-field-effect transistor $TR_3$ and one source/drain region of the second transistor $TR_2$ forms a diode D, and one end of the diode D is connected to the second memory-cell-selecting line.

Further, as shown in principle drawings of FIGS. 16A and 16B, the semiconductor memory cell preferably has a configuration in which one source/drain region of the second transistor $TR_2$ has a common region with the second gate region of the junction-field-effect transistor $TR_3$. In this case, as shown in FIG. 16A, the semiconductor memory cell preferably has a configuration in which one source/drain region of the second transistor $TR_2$ and the second gate region of the junction-field-effect transistor $TR_3$ are connected to the second memory-cell-selecting line, and the other source/drain region of the junction-field-effect transistor $TR_3$ is connected to an information read-out line. Alternatively, as shown in FIG. 16B, the semiconductor memory cell preferably has a configuration in which one source/drain region of the second transistor $TR_2$ and the second gate region of the junction-field-effect transistor $TR_3$ are connected to the second memory-cell-selecting line, a diode D is formed in the other source/drain region of the junction-field-effect transistor $TR_3$, and one end of the diode D is connected to the second memory-cell-selecting line.

As shown in principle drawings of FIGS. 10 and 21, for achieving the above object, according to a second aspect of the present invention, there is provided a semiconductor memory cell comprising a first transistor $TR_1$ of a first conductivity type for read-out, a second transistor $TR_2$ of a second conductivity type for write-in, a junction-field-effect transistor $TR_3$ of a first conductivity type for current control, and a diode D,
wherein:

(A-1) one source/drain region of the first transistor $TR_1$ has a common region with one source/drain region of the junction-field-effect transistor $TR_3$, (A-2) the other source/drain region of the first transistor $TR_1$ is connected to a second memory-cell-selecting line through the diode D, (A-3) a gate region $G_1$ of the first transistor $TR_1$ is connected to a first memory-cell-selecting line, (B-1) one source/drain region of the second transistor $TR_2$ is connected to the second memory-cell-selecting line, (B-2) the other source/drain region of the second transistor $TR_2$ has a common region with a channel forming region $CH_1$ of the first transistor $TR_1$ and with a first gate region of the junction-field-effect transistor $TR_3$, (B-3) a gate region $G_2$ of the second transistor $TR_2$ is connected to the first memory-cell-selecting line, (C-1) a second gate region of the junction-field-effect transistor $TR_3$ faces the first gate region thereof through a channel region $CH_3$ thereof, the channel region $CH_3$ thereof being an extended region of one source/drain region of the first transistor $TR_1$, and (C-2) the other source/drain region of the junction-field-effect-transistor TR3 is positioned in an extended region of the other source/drain region of the first transistor $TR_1$ via the channel region $CH_3$, and is connected to a predetermined potential.

As shown in principle drawings of FIGS. 10 and 21, the semiconductor memory cell according to the second aspect of the present invention preferably has a configuration in which the second gate region of the junction-field-effect transistor $TR_3$ is connected to a second predetermined potential.

Alternatively, as shown in principle drawings of FIGS. 13 and 24, the semiconductor memory cell according to the second aspect of the present invention preferably has a configuration in which the second gate region of the junction-field-effect transistor $TR_3$ is connected to the first gate region thereof. As shown in principle drawings of FIGS. 29A and 29B, the semiconductor memory cell according to the second aspect of the present invention further may comprise a third transistor $TR_4$ of a second conductivity type for write-in, and preferably has a configuration in which the second gate region of the junction-field-effect transistor $TR_3$ is connected to the first gate region thereof through the third transistor $TR_4$.

For achieving the above object, according to a third aspect of the present invention, there is provided a semiconductor memory cell comprising a first transistor $TR_1$ of a first conductivity type for read-out, a second transistor $TR_2$ of a second conductivity type for write-in, and a junction-field-effect transistor $TR_3$ of a first conductivity type for current control, said semiconductor memory cell having;

(a) a first semi-conductive region $SC_1$ having a second conductivity type, (b) a second semi-conductive or conductive region $SC_2$ formed in a surface region of the first region $SC_1$, said second region $SC_2$ forming a rectifier junction together with the first region $SC_1$, (c) a third semi-conductive region $SC_3$ formed in a surface region of the first region $SC_1$ and spaced from the second region $SC_2$, said third region $SC_3$ having a first conductivity type, (d) a fourth semi-conductive or conductive region $SC_4$ formed in a surface region of the third region $SC_3$, said fourth region $SC_4$ forming a rectifier junction together with the third region $SC_3$, and (e) a fifth semi-conductive or conductive region $SC_5$ formed in a surface region of the third region $SC_3$ and spaced from the fourth region $SC_4$, said fifth region $SC_5$ forming a rectifier junction together with the third region $SC_3$, wherein;

(A-1) source/drain regions of the first transistor $TR_1$ are constituted of the second region $SC_2$ and the third region $SC_3$, (A-2) a channel forming region $CH_1$ of the first transistor $TR_1$ is constituted of a surface region of the first region $SC_1$ sandwiched by the second region $SC_2$ and the third region $SC_3$, (A-3) a gate region $G_1$ of the first transistor $TR_1$ is formed on a barrier layer formed on the surface region of the first region $SC_1$ sandwiched by the second region $SC_2$ and the third region $SC_3$, (B-1) source/drain regions of the second transistor $TR_2$ are constituted of the first region $SC_1$ and the fourth region $SC_4$, (B-2) a channel forming region $CH_2$ of the second transistor $TR_2$ is constituted of a surface region of the third region $SC_3$ sandwiched by the first region $SC_1$ and the fourth region $SC_4$, (B-3) a gate region $G_2$ of the second transistor $TR_2$ is formed on a barrier layer formed on the surface region of the third region $SC_3$ sandwiched by the first region $SC_1$ and the fourth region $SC_4$, (C-1) gate regions of the junction-field-effect transistor $TR_3$ are constituted of the fifth region $SC_5$ and a portion of the first region $SC_1$ facing the fifth region $SC_5$, (C-2) a channel region $CH_3$ of the junction-field-effect transistor $TR_3$ is constituted of part of the third region $SC_3$ sandwiched by the fifth region $SC_5$ and said portion of the first region $SC_1$, (C-3) source/drain regions of the junction-field-effect transistor $TR_3$ are constituted of the third region $SC_3$ extending from both ends of the channel region $CH_3$ of the junction-field-effect transistor $TR_3$, (D) the gate region $G_1$ of the first transistor $TR_1$ and the gate region $G_2$ of the second transistor $TR_2$ are connected to a first memory-cell-selecting line, (E) the second region $SC_2$ is connected to a predetermined potential, (F) the fourth region $SC_4$ is connected to a second memory-cell-selecting line, and (G) the fifth region $SC_5$ is connected to a second predetermined potential.

In a variant of the semiconductor memory cell according to the third aspect of the present invention, the fifth region $SC_5$ may be connected to the first region $SC_1$, in place of being connected to the second predetermined potential.

The semiconductor memory cell according to the third aspect of the present invention including the above variant preferably has a configuration in which a junction portion of the third region $SC_3$ and the fourth region $SC_4$ forms a diode D, and one source/drain region of the junction-field-effect transistor $TR_3$ is connected to the second memory-cell-selecting line through the diode D.

Further, the semiconductor memory cell according to the third aspect of the present invention preferably has a configuration in which a diode D is formed on the surface region of the third region $SC_3$ corresponding to (or functioning as) one source/drain region of the junction-field-effect transistor $TR_3$, and one source/drain region of the junction-field-effect transistor $TR_3$ is connected to the second predetermined potential through the diode D.

For achieving the above object, according to a fourth aspect of the present invention, there is provided a semiconductor memory cell comprising a first transistor $TR_1$ of a first conductivity type for read-out, a second transistor $TR_2$ of a second conductivity type for write-in, and a junction-field-effect transistor $TR_3$ of a first conductivity type for current control, said semiconductor memory cell having;

(a) a first semi-conductive region $SC_1$ having a second conductivity type, (b) a second semi-conductive region $SC_2$ formed in a surface region of the first region $SC_1$, said second region $SC_2$ having a first conductivity type, (c) a third semi-conductive region $SC_3$ formed in a surface region of the first region $SC_1$ and spaced from the second region $SC_2$, said third region $SC_3$ having the first conductivity type, (d) a fourth semi-conductive or conductive region $SC_4$ formed in a surface region of the third region $SC_3$, said fourth region $SC_4$ forming a rectifier junction together with the third region $SC_3$, and (e) a fifth semi-conductive or conductive region $SC_5$ formed in a surface region of the second region $SC_2$, said fifth region $SC_5$ forming a rectifier junction together with the second region $SC_2$, wherein;

(A-1) source/drain regions of the first transistor $TR_1$ are constituted of the second region $SC_2$ and the third region $SC_3$, (A-2) a channel forming region $CH_1$ of the first transistor $TR_1$ is constituted of a surface region of the first region $SC_1$ sandwiched by the second region $SC_2$ and the third region $SC_3$, (A-3) a gate region $G_1$ of the first transistor $TR_1$ is formed on a barrier layer formed on the surface region of the first region $SC_1$ sandwiched by the second region $SC_2$ and the third region $SC_3$, (B-1) source/drain regions of the second transistor $TR_2$ are constituted of the first region $SC_1$ and the fourth region $SC_4$, (B-2) a channel forming region $CH_2$ of the second transistor $TR_2$ is constituted of a surface region of the third region $SC_3$ sandwiched by the first region $SC_1$ and the fourth region $SC_4$, (B-3) a gate region $G_2$ of the second transistor $TR_2$ is formed on a barrier layer formed on the surface region of the third region $SC_3$ sandwiched by the first region $SC_1$ and the fourth region $SC_4$, (C-1) gate regions of the junction-field-effect transistor $TR_3$ are constituted of the fifth region $SC_5$ and a portion of the first region $SC_1$ facing the fifth region $SC_5$, (C-2) a channel region $CH_3$ of the junction-field-effect transistor $TR_3$ is constituted of part of the second region $SC_2$ sandwiched by the fifth region $SC_5$ and said portion of the first region $SC_1$, (C-3) source/drain regions of the junction-field-effect transistor $TR_3$ are constituted of the second region $SC_2$ extending from both ends of the channel region $CH_3$ of the junction-field-effect transistor $TR_3$, (D) the gate region $G_1$ of the first transistor $TR_1$ and the gate region $G_2$ of the second transistor $TR_2$ are connected to a first memory-cell-selecting line, (E) the second region $SC_2$ is connected to a predetermined potential, (F) the fourth region $SC_4$ is connected to a second memory cell-selecting line, and (G) the fifth region $SC_5$ is connected to a second predetermined potential.

In a variant of the semiconductor memory cell according to the fourth aspect of the present invention, the fifth region $SC_5$ may be connected to the first region $SC_1$, in place of being connected to the second predetermined potential.

The semiconductor memory cell according to the fourth aspect of the present invention including the above variant preferably has a configuration in which a junction portion of the third region $SC_3$ and the fourth region $SC_4$ forms a diode D, and one source/drain region of the first transistor $TR_1$ is connected to the second memory-cell-selecting line through the diode D.

For achieving the above object, according to a fifth aspect of the present invention, there is provided a semiconductor memory cell comprising a first transistor $TR_1$ of a first conductivity type for read-out, a second transistor $TR_2$ of a second conductivity type for write-in, and a junction-field-effect transistor $TR_3$ of a first conductivity type for current control, said semiconductor memory cell having;

(a) a first semi-conductive region $SC_1$ having a second conductivity type, (b) a second semi-conductive or conductive region $SC_2$ formed in a surface region of the first region $SC_1$, said second region $SC_2$ forming a rectifier junction together with the first region $SC_1$, (c) a third semi-conductive region $SC_3$ formed in a surface region of the first region $SC_1$ and spaced from the second region $SC_2$, said third region $SC_3$ having a first conductivity type, (d) a fourth semi-conductive region $SC_4$ formed in a surface region of the third region $SC_3$, said fourth region $SC_4$ having the second conductivity type, and (e) a gate region G shared by the first transistor $TR_1$ and the second transistor $TR_2$ and formed on a barrier layer so as to bridge the second region $SC_2$ and the third region $SC_3$ and so as to bridge the first region $SC_1$ and the fourth region $SC_4$, wherein;

(A-1) source/drain regions of the first transistor $TR_1$ are constituted of the second region $SC_2$ and a surface region of the third region $SC_3$ which surface region is sandwiched by the first region $SC_1$ and the fourth region $SC_4$, (A-2) a channel forming region $CH_1$ of the first transistor $TR_1$ is constituted of a surface region of the first region $SC_1$ sandwiched by the second region $SC_2$ and the third region $SC_3$, (B-1) source/drain regions of the second transistor $TR_2$ are constituted of the first region $SC_1$ and the fourth region $SC_4$, (B-2) a channel forming region $CH_2$ of the second transistor $TR_2$ is constituted of a surface region of the third region $SC_3$ which surface region corresponds to (or functions as) one source/drain region of the first transistor $TR_1$ and is sandwiched by the first region $SC_1$ and the fourth region $SC_4$, (C-1) gate regions of the junction-field-effect transistor $TR_3$ are constituted of the fourth region $SC_4$ and a portion of the first region $SC_1$ facing the fourth region $SC_4$, (C-2) a channel region $CH_3$ of the junction-field-effect transistor $TR_3$ is constituted of part of the third region $SC_3$ positioned under one source/drain region of the second transistor $TR_2$ and sandwiched by the first region $SC_1$ and the fourth region $SC_4$, (C-3) one source/drain region of the junction-field-effect transistor $TR_3$ is constituted of a surface region of the third region $SC_3$ which surface region extends from one end of the channel region $CH_3$ of the junction-field-effect transistor $TR_3$, corresponds to (or functions as) one source/drain region of the first transistor $TR_1$, corresponds to (or functions as) the channel forming region $CH_2$ of the second transistor $TR_2$ and is sandwiched by the first region $SC_1$ and the fourth region $SC_4$, (C-4) the other source/drain region of the junction-field-effect transistor $TR_3$ is constituted of the third region $SC_3$ extending from the other end of the channel region $CH_3$ of the junction-field-effect transistor $TR_3$, (D) the gate region G is connected to a first memory-cell-selecting line, (E) the second region $SC_2$ is connected to a predetermined potential, and (F) the fourth region $SC_4$ is connected to a second memory-cell-selecting line.

The semiconductor memory cell according to the fifth aspect of the present invention further may have a fifth conductive region $SC_5$ which is formed in a surface region of the third region $SC_3$ and forms a rectifier junction together with the third region $SC_3$, and preferably has a configuration in which a diode D is formed of the fifth region $SC_5$ and the third region $SC_3$ and in which the third region $SC_3$ corresponding to (or functioning as) the other source/drain region of the junction-field-effect transistor $TR_3$ is connected to the second memory-cell-selecting line through the diode D.

For achieving the above object, according to a sixth aspect of the present invention, there is provided a semiconductor memory cell comprising a first transistor $TR_1$ of a first conductivity type for read-out, a second transistor $TR_2$ of a second conductivity type for write-in, and a junction-field-effect transistor $TR_3$ of a first conductivity type for current control, said semiconductor memory cell having;

(a) a first semi-conductive region $SC_1$ having a second conductivity type, (b) a second semi-conductive region $SC_2$ formed in a surface region of the first region $SC_1$, said second region $SC_2$ having a first conductivity type, (c) a third semi-conductive region $SC_3$ formed in a surface region of the first region $SC_1$ and spaced from the second region $SC_2$, said third region $SC_3$ having the first conductivity type, (d) a fourth semi-conductive or conductive region $SC_4$ formed in a surface region of the third region $SC_3$, said fourth region $SC_4$ forming a rectifier junction together with the third region $SC_3$, (e) a fifth semi-conductive or conductive region $SC_5$ formed in a surface region of the second regions $SC_2$, said fifth region $SC_5$ forming a rectifier junction together with the second region $SC_2$, and (f) a gate region G shared by the first transistor $TR_1$ and the second transistor $TR_2$ and formed on a barrier layer so as to bridge the second region $SC_2$ and the third region $SC_3$ and so as to bridge the first region $SC_1$ and the fourth region $SC_4$, wherein;

(A-1) source/drain regions of the first transistor $TR_1$ are constituted of the second region $SC_2$ and a surface region of the third region $SC_3$ which surface region is sandwiched by the first region $SC_1$ and the fourth region $SC_4$, (A-2) a channel forming region $CH_1$ of the first transistor $TR_1$ is constituted of a surface region of the first region $SC_1$ sandwiched by the second region $SC_2$ and the third region $SC_3$, (B-1) source/drain regions of the second transistor $TR_2$ are constituted of the first region $SC_1$ and the fourth region $SC_4$, (B-2) a channel forming region $CH_2$ of the second transistor $TR_2$ is constituted of a surface region of the third region $SC_3$ which surface region corresponds to (or functions as) one source/drain region of the first transistor $TR_1$ and is sandwiched by the first region $SC_1$ and the fourth region $SC_4$, (C-1) gate regions of the junction-field-effect transistor $TR_3$ are constituted of the fifth region $SC_5$ and a portion of the first region $SC_1$ facing the fifth region $SC_5$, (C-2) a channel region $CH_3$ of the junction-field-effect transistor $TR_3$ is constituted of part of the second region $SC_2$ sandwiched by the fifth region $SC_5$ and said portion of the first region $SC_1$, (C-3) one source/drain region of the junction-field-effect transistor $TR_3$ is constituted of the second region $SC_2$ which extends from one end of the channel region $CH_3$ of the junction-field-effect transistor $TR_3$ and corresponds to (or functions as) one source/drain region of the first transistor $TR_1$, (C-4) the other source/drain region of the junction-field-effect transistor $TR_3$ is constituted of the second region $SC_2$ extending from the other end of the channel region $CH_3$ of the junction-field-effect transistor $TR_3$, (D) the gate region G is connected to a first memory-cell-selecting line, (E) the second region $SC_2$ is connected to a predetermined potential, (F) the fourth region $SC_4$ is connected to a second memory cell-selecting line, and (G) the fifth region $SC_5$ is connected to a second predetermined potential.

The semiconductor memory cell according to the sixth aspect of the present invention further may have a sixth conductive region $SC_6$ which is formed in a surface region of the third region $SC_3$ and forms a rectifier junction together with the third region $SC_3$, and preferably has a configuration in which a diode D is formed of the sixth region $SC_6$ and the third region $SC_3$ and in which the third region $SC_3$ corresponding to (or functioning as) the other source/drain region of the first transistor $TR_1$ is connected to the second memory-cell-selecting line through the diode D.

Further, a variant of the semiconductor memory cell according to the sixth aspect of the present invention preferably has a configuration in which the fifth region $SC_5$ is connected to the first region $SC_1$, in place of being connected to the second predetermined potential. In this case, the semiconductor memory cell further may have a sixth conductive region $SC_6$ which is formed in a surface region of the third region $SC_3$ and forms a rectifier junction together with the third region $SC_3$, and preferably has a configuration in which a diode D is formed of the sixth region $SC_6$ and the third region $SC_3$ and in which the third region $SC_3$ corresponding to (or functioning as) the other source/drain region of the first transistor $TR_1$ is connected to the second memory-cell-selecting line through the diode D.

For achieving the above object, according to a seventh aspect of the present invention, there is provided a semiconductor memory cell comprising a first transistor $TR_1$ of a first conductivity type for read-out, a second transistor $TR_2$ of a second conductivity type for write-in, a junction-field-effect transistor $TR_3$ of a first conductivity type for current control, and a third transistor $TR_4$ of a second conductivity type for write-in, said semiconductor memory cell having;

(a) a first semi-conductive region $SC_1$ having a second conductivity type, (b) a second semi-conductive region $SC_2$ formed in a surface region of the first region $SC_1$, said second region $SC_2$ having a first conductivity type, (c) a third semi-conductive region $SC_3$ formed in a surface region of the first region $SC_1$ and spaced from the second region $SC_2$, said third region $SC_3$ having the first conductivity type, (d) a fourth semi-conductive or conductive region $SC_4$ formed in a surface region of the third region $SC_3$, said fourth region $SC_4$ forming a rectifier junction together with the third region $SC_3$, (e) a fifth semi-conductive or conductive region $SC_5$ formed in a surface region of the second region $SC_2$, said fifth region $SC_5$ forming a rectifier junction together with the second region $SC_2$, and (f) a gate region G shared by the first transistor $TR_1$, the second transistor $TR_2$ and the third transistor $TR_4$ and formed on a barrier layer so as to bridge the first region $SC_1$ and the fourth region $SC_4$, so as to bridge the second region $SC_2$ and the third region $SC_3$ and so as to bridge the third region $SC_3$ and the fifth region $SC_5$, wherein;

(A-1) source/drain regions of the first transistor $TR_1$ are constituted of the second region $SC_2$ and a surface region of the third region $SC_3$ which surface region is sandwiched by the first region $SC_1$ and the fourth region $SC_4$, (A-2) a channel forming region $CH_1$ of the first transistor $TR_1$ is constituted of a surface region of the first region $SC_1$ sandwiched by the second region $SC_2$ and the third region $SC_3$, (B-1) source/drain regions of the second transistor $TR_2$ are constituted of the first region $SC_1$ and the fourth region $SC_4$, (B-2) a channel forming region $CH_2$ of the second transistor $TR_2$ is constituted of a surface region of the third region $SC_3$ which surface region corresponds to (or functions as) one source/drain region of the first transistor $TR_1$ and is sandwiched by the first region $SC_1$ and the fourth region $SC_4$, (C-1) gate regions of the junction-field-effect transistor $TR_3$ are constituted of the fifth region $SC_5$ and a portion of the first region $SC_1$ facing the fifth region $SC_5$, (C-2) a channel region $CH_3$ of the junction-field-effect transistor $TR_3$ is constituted of part of the second region $SC_2$ sandwiched by the fifth region $SC_5$ and said portion of the first region $SC_1$, (C-3) one source/drain region of the junction-field-effect transistor $TR_3$ is constituted of the second region $SC_2$ which extends from one end of the channel region $CH_3$ of the junction-field-effect transistor $TR_3$ and corresponds to (or functions as) one source/drain region of the first transistor $TR_1$, (C-4) the other source/drain region of the junction-field-effect transistor $TR_3$ is constituted of the second region $SC_2$ extending from the other end of the channel region $CH_3$ of the junction-field-effect transistor $TR_3$, (D-1) one source/drain region of the third transistor $TR_4$ is constituted of the surface region of the first region $SC_1$ corresponding to (or functioning as) the channel forming region $CH_1$ of the first transistor $TR_1$, (D-2) the other source/drain region of the third transistor $TR_4$ is constituted of the fifth region $SC_5$, (D-3) a channel forming region $CH_4$ of the third transistor $TR_4$ is constituted of the second region $SC_2$ corresponding to (or functioning as) one source/drain region of the first transistor $TR_1$, (E) the gate region G is connected to a first memory-cell-selecting line, (F) the second region $SC_2$ is connected to a predetermined potential, and (G) the fourth region $SC_4$ is connected to a second memory cell-selecting-line.

For achieving the above object, according to a eighth aspect of the present invention, there is provided a semiconductor memory cell comprising a first transistor $TR_1$ of a first conductivity type for read-out, a second transistor $TR_2$ of a second conductivity type for write-in, and a junction-field-effect transistor $TR_3$ of a first conductivity type for current control, said semiconductor memory cell having;

(a) a third semi-conductive region $SC_3$ having a first conductivity type, (b) a fourth semi-conductive or conductive region $SC_4$ formed in a surface region of the third region $SC_3$, said fourth region $SC_4$ forming a rectifier junction together with the third region $SC_3$, (c) a first semi-conductive region $SC_1$ formed in a surface region of the third region $SC_3$ and spaced from the fourth region $SC_4$, said first region $SC_1$ having a second conductivity type, (d) a second semi-conductive region $SC_2$ formed in a surface region of the first region $SC_1$, said second region $SC_2$ having the first conductivity type, (e) a fifth semi-conductive or conductive region $SC_5$ formed in a surface region of the second region $SC_2$, said fifth region $SC_5$ forming a rectifier junction together with the second region $SC_2$, and (f) a gate region G shared by the first transistor $TR_1$ and the second transistor $TR_2$ and formed on a barrier layer so as to bridge the second region $SC_2$ and the third region $SC_3$ and so as to bridge the first region $SC_1$ and the fourth region $SC_4$, wherein;

(A-1) source/drain regions of the first transistor $TR_1$ are constituted of the second region $SC_2$ and the third region $SC_3$, (A-2) a channel forming region $CH_1$ of the first transistor $TR_1$ is constituted of a surface region of the first region $SC_1$ sandwiched by the second region $SC_2$ and the third region $SC_3$, (B-1) source/drain regions of the second transistor $TR_2$ are constituted of the first region $SC_1$ and the fourth region $SC_4$, (B-2) a channel forming region $CH_2$ of the second transistor $TR_2$ is constituted of a surface region of the third region $SC_3$ sandwiched by the first region $SC_1$ and the fourth region $SC_4$, (C-1) gate regions of the junction-field-effect transistor $TR_3$ are constituted of the fifth region $SC_5$ and a portion of the first region $SC_1$ facing the fifth region $SC_5$, (C-2) a channel region $CH_3$ of the junction-field-effect transistor $TR_3$ is constituted of part of the second region $SC_2$ sandwiched by the fifth region $SC_5$ and said portion of the first region $SC_1$, (C-3) source/drain regions of the junction-field-effect transistor $TR_3$ are constituted of the second region $SC_2$ extending from both ends of the channel region $CH_3$ of the junction-field-effect transistor $TR_3$, (D) the gate region G is connected to a first memory-cell-selecting line, (E) the second region $SC_2$ is connected to a predetermined potential, (F) the fourth region $SC_4$ is connected to a second memory-cell-selecting line, and (G) the fifth region $SC_5$ is connected to a second predetermined potential.

The semiconductor memory cell according to the eighth aspect of the present invention may have a configuration in which the fifth region $SC_5$ is connected to the first region $SC_1$, in place of being connected to the second predetermined potential. Further, the semiconductor memory cell according to the eighth aspect of the present invention may have a configuration in which a junction portion of the third region $SC_3$ and the fourth region $SC_4$ forms a diode D, and one source/drain region of the first transistor $TR_1$ is connected to the second memory-cell-selecting line through the diode D. Further, the semiconductor memory cell according to the eighth aspect of the present invention may have a sixth conductive region $SC_6$ which is formed in a surface region of the third region $SC_3$ and forms a rectifier junction together with the third region $SC_3$, and preferably has a configuration in which a diode D is formed of the sixth region $SC_6$ and the third region $SC_3$ and in which the third region $SC_3$ corresponding to (or functioning as) the other source/drain region of the first transistor $TR_1$ is connected to the second memory-cell-selecting line through the diode D.

For achieving the above object, according to a ninth aspect of the present invention, there is provided a semiconductor memory cell comprising a first transistor $TR_1$ of a first conductivity type for read-out, a second transistor $TR_2$ of a second conductivity type for write-in, a junction-field-effect transistor $TR_3$ of a first conductivity type for current control, and a third transistor $TR_4$ of a second conductivity type for write-in, said semiconductor memory cell having;

(a) a third semi-conductive region $SC_3$ having a first conductivity type, (b) a fourth semi-conductive or conductive region $SC_4$ formed in a surface region of the third region $SC_3$, said fourth region $SC_4$ forming a rectifier junction together with the third region $SC_3$, (c) a first semi-conductive region $SC_1$ formed in a surface region of the third region $SC_3$ and spaced from the fourth region $SC_4$, said first region $SC_1$ having a second conductivity type, (d) a second semi-conductive region $SC_2$ formed in a surface region of the first region $SC_1$, said second region $SC_2$ having the first conductivity type, (e) a fifth semi-conductive or conductive region $SC_5$ formed in a surface region of the second region $SC_2$, said fifth region $SC_5$ forming a rectifier junction together with the second region $SC_2$, and (f) a gate region G shared by the first transistor $TR_1$, the second transistor $TR_2$ and the third transistor $TR_4$ and formed on a barrier layer so as to bridge the first region $SC_1$ and the fourth region $SC_4$, so as to bridge the second region $SC_2$ and the third region $SC_3$ and so as to bridge the third region $SC_3$ and the fifth region $SC_5$, wherein;

(A-1) source/drain regions of the first transistor $TR_1$ are constituted of the second region $SC_2$ and a surface region of the third region $SC_3$ which surface region is sandwiched by the first region $SC_1$ and the fourth region $SC_4$, (A-2) a channel forming region $CH_1$ of the first transistor $TR_1$ is constituted of a surface region of the first region $SC_1$ sandwiched by the second region $SC_2$ and the third region $SC_3$, (B-1) source/drain regions of the second transistor $TR_2$ are constituted of the first region $SC_1$ and the fourth region $SC_4$, (B-2) a channel forming region $CH_2$ of the second transistor $TR_2$ is constituted of a surface region of the third region $SC_3$ which surface region corresponds to (or functions as) one source/drain region of the first transistor $TR_1$ and is sandwiched by the first region $SC_1$ and the fourth region $SC_4$, (C-1) gate regions of the junction-field-effect transistor $TR_3$ are constituted of the fifth region $SC_5$ and a portion of the first region $SC_1$ facing the fifth region $SC_1$, (C-2) a channel region $CH_3$ of the junction-field-effect transistor $TR_3$ is constituted of part of the second region $SC_2$ sandwiched by the fifth region $SC_5$ and said portion of the first region $SC_1$, (C-3) one source/drain region of the junction-field-effect transistor $TR_3$ is constituted of the second region $SC_2$ which extends from one end of the channel region $CH_3$ of the junction-field-effect transistor $TR_3$ and corresponds to (or functions as) one source/drain region of the first transistor $TR_1$, (C-4) the other source/drain region of the junction-field-effect transistor $TR_3$ is constituted of the second region $SC_2$ extending from the other end of the channel region $CH_3$ of the junction-field-effect transistor $TR_3$, (D-1) one source/drain region of the third transistor $TR_4$ is constituted of the surface region of the first region $SC_1$ corresponding to (or functioning as) the channel forming region $CH_1$ of the first transistor $TR_1$, (D-2) the other source/drain region of the third transistor $TR_4$ is constituted of the fifth region $SC_5$, (D-3) a channel forming region $CH_4$ of the third transistor $TR_4$ is constituted of the second region $SC_2$ corresponding to (or functioning as) one source/drain region of the first transistor $TR_1$, (E) the gate region G is connected to a first memory-cell-selecting line, (F) the second region $SC_2$ is connected to a predetermined potential, and (G) the fourth region $SC_4$ is connected to a second memory-cell-selecting line.

The semiconductor memory cell according to the ninth aspect of the present invention may have a configuration in which a junction portion of the third region $SC_3$ and the fourth region $SC_4$ forms a diode D, and one source/drain region of the first transistor $TR_1$ is connected to the second memory-cell-selecting line through the diode D. Further, the semiconductor memory cell according to the ninth aspect of the present invention may have a sixth conductive region $SC_6$ which is formed in a surface region of the third region $SC_3$ and forms a rectifier junction together with the third region $SC_3$, and preferably has a configuration in which a diode D is formed of the sixth region $SC_6$ and the third region $SC_3$ and in which the third region $SC_3$ corresponding to (or functioning as) the other source/drain region of the first transistor $TR_1$ is connected to the second memory-cell-selecting line through the diode D.

The semiconductor memory cell of the present invention can be formed in a surface region of a semiconductor substrate, on an insulating layer formed on a semiconductor substrate, in a well of the second conductivity type formed in a semiconductor substrate (in the first to seventh aspects of the present invention), in a well of the first conductivity type formed in a semiconductor substrate (in the eighth and ninth aspects of the present innovation), or on an electric insulator, and is preferably formed in a well or formed on an insulator including an insulating layer and an insulating substrate for preventing α-ray soft error.

The junction-field-effect transistor (JFET) $TR_3$ in the semiconductor memory cell of the present invention can be formed by (1) optimizing the distance between the facing gate regions of the junction-field-effect transistor $TR_3$, that is, the thickness of the channel region $CH_3$, and (2) optimizing impurity concentrations of the facing gate regions and the channel region $CH_3$ of the junction-field-effect transistor $TR_3$. It should be noted that if neither the distance between the facing gate regions (the thickness of the channel region CH3) of the junction-field-effect transistor $TR_3$, nor the impurity concentrations of the facing gate regions and the channel region $CH_3$ of the junction-field-effect transistor $TR_3$ are optimized, the depletion layer will not widened, making it impossible to bring the junction-field-effect transistor $TR_3$ into an on-state or an off-state. These optimization need to be carried out by computer simulation or experiments.

For achieving the above object, according to the first aspect of the present invention, there is provided a method for manufacturing a semiconductor memory cell comprising a first transistor $TR_1$ of a first conductivity type for read-out, a second transistor $TR_2$ of a second conductivity type for write-in, and a junction-field-effect transistor $TR_3$ of a first conductivity type for current control, said semiconductor memory cell having;

(a) a first semi-conductive region $SC_1$ having a second conductivity type, (b) a second semi-conductive or conductive region $SC_2$ formed in a surface region of the first region $SC_1$, said second region $SC_2$ forming a rectifier junction together with the first region $SC_1$, (c) a third semi-conductive region $SC_3$ formed in a surface region of the first region $SC_1$ and spaced from the second region $SC_2$, said third region $SC_3$ having a first conductivity type, (d) a fourth semi-conductive region $SC_4$ formed in a surface region of the third region $SC_3$, said fourth region $SC_4$ having the second conductivity type, and (e) a gate region G shared by the first transistor $TR_1$ and the second transistor $TR_2$ and formed on a barrier layer so as to bridge the second region $SC_2$ and the third region $SC_3$ and so as to bridge the first region $SC_1$ and the fourth region $SC_4$, the first transistor $TR_1$ having;

(A-1) source/drain regions constituted of the second region $SC_2$ and a surface region of the third region $SC_3$ which surface region is sandwiched by the first region $SC_1$ and the fourth region $SC_4$, and (A-2) a channel forming region $CH_1$ constituted of a surface region of the first region $SC_1$ sandwiched by the second region $SC_2$ and the third region $SC_3$, the second transistor $TR_2$ having;

(B-1) source/drain regions constituted of the first region $SC_1$ and the fourth region $SC_4$, and (B-2) a channel forming region $CH_2$ constituted of a surface region of the third region $SC_3$ which surface region corresponds to (or functions as) one source/drain region of the first transistor $TR_1$ and is sandwiched by the first region $SC_1$ and the fourth region $SC_4$, and the junction-field-effect transistor $TR_3$ having;

(C-1) gate regions constituted of the fourth region $SC_4$ and a portion of the first region $SC_1$ facing the fourth region $SC_4$, (C-2) a channel region $CH_3$ constituted of part of the third region $SC_3$ positioned under one source/drain region of the second transistor $TR_2$ and sandwiched by the first region SC1 and the fourth region $SC_4$, (C-3) one source/drain region constituted of a surface region of the third region $SC_3$ which surface region extends from one end of the channel region $CH_3$ of the junction-field-effect transistor $TR_3$, corresponds to (or functions as) one source/drain region of the first transistor $TR_1$, corresponds to (or functions as) the channel forming region $CH_2$ of the second transistor $TR_2$ and is sandwiched by the first region $SC_1$ and the fourth region $SC_4$, and (C-4) the other source/drain region constituted of the third region $SC_3$ extending from the other end of the channel region $CH_3$ of the junction-field-effect transistor $TR_3$, said method comprising;

(1) forming the barrier layer on the surface of the first region $SC_1$, and then, forming the gate region G on the barrier layer, and (2) forming the first region $SC_1$, the third region $SC_3$ and the fourth region $SC_4$ by ion implantation in an arbitrary order so as to optimize a distance between the facing gate regions of the junction-field-effect transistor $TR_3$ and so as to optimize impurity concentrations of the facing gate regions and the channel region $CH_3$ of the junction-field-effect transistor $TR_3$.

For achieving the above object, according to the second aspect of the present invention, there is provided a method for manufacturing a semiconductor memory cell comprising a first transistor $TR_1$ of a first conductivity type for read-out, a second transistor $TR_2$ of a second conductivity type for write-in, and a junction-field-effect transistor $TR_3$ of a first conductivity type for current control, said semiconductor memory cell having;

(a) a first semi-conductive region $SC_1$ having a second conductivity type, (b) a second semi-conductive region $SC_2$ formed in a surface region of the first region $SC_1$, said second region $SC_2$ having a first conductivity type, (c) a third semi-conductive region $SC_3$ formed in a surface region of the first region $SC_1$, and spaced from the second region $SC_2$, said third region $SC_3$ having the first conductivity type, (d) a fourth semi-conductive or conductive region $SC_4$ formed in a surface region of the third region $SC_3$, said fourth region $SC_4$ forming a rectifier junction together with the third region $SC_3$, (e) a fifth semi-conductive or conductive region $SC_5$ formed in a surface region of the second region $SC_2$, said fifth region $SC_5$ forming a rectifier junction together with the second region $SC_2$, and (f) a gate region G shared by the first transistor $TR_1$ and the second transistor $TR_2$ and formed on a barrier layer so as to bridge the second region $SC_2$ and the third region $SC_3$ and so as to bridge the first region $SC_1$ and the fourth region $SC_4$, the first transistor $TR_1$ having;

(A-1) source/drain regions constituted of the second region $SC_2$ and a surface region of the third region $SC_3$ which surface region is sandwiched by the first region $SC_1$ and the fourth region $SC_4$, and (A-2) a channel forming region $CH_1$ constituted of a surface region of the first region $SC_1$ sandwiched by the second region $SC_2$ and the third region $SC_3$, the second transistor $TR_2$ having;

(B-1) source/drain regions constituted of the first region $SC_1$ and the fourth region $SC_4$, and (B-2) a channel forming region $CH_2$ constituted of a surface region of the third region $SC_3$ which surface region corresponds to (or functions as) one source/drain region of the first transistor $TR_1$ and is sandwiched by the first region $SC_1$ and the fourth region $SC_4$, and the junction-field-effect transistor $TR_3$ having;

(C-1) gate regions constituted of the fifth region $SC_5$ and a portion of the first region $SC_1$ facing the fifth region $SC_5$, (C-2) a channel region $CH_3$ constituted of part of the second region $SC_2$ sandwiched by the fifth region $SC_5$ and said portion of the first region $SC_1$, (C-3) one source/drain region constituted of the second region $SC_2$ which extends from one end of the channel region $CH_3$ of the junction-field-effect transistor $TR_3$ and corresponds to (or functions as) one source/drain region of the first transistor $TR_1$, and (C-4) the other source/drain region constituted of the second region $SC_2$ extending from the other end of the channel region $CH_3$ of the junction-field-effect transistor $TR_3$, said method comprising;

(1) forming the barrier layer on the surface of the first region $SC_1$, and then, forming the gate region G on the barrier layer, and (2) forming the first region $SC_1$, the second region $SC_2$ and the fifth region $SC_5$ by ion implantation in an arbitrary order so as to optimize a distance between the facing gate regions of the junction-field-effect transistor $TR_3$ and so as to optimize impurity concentrations of the facing gate regions and the channel region $CH_3$ of the junction-field-effect transistor $TR_3$.

In the semiconductor memory cell according to any one of the third to ninth aspects of the present invention, a region $SC_7$ containing a high concentration of an impurity having the first conductivity type is preferably formed under the first region $SC_1$, for increasing a potential or an electric charge stored in the channel forming region $CH_1$ of the first transistor $TR_1$.

The channel forming region or the channel region can be formed from a material such as silicon or GaAs by using a known process. Each gate region can be formed of a material such as a metal, a silicide, GaAs doped with an impurity at a high concentration, silicon, amorphous silicon or polysilicon doped with an impurity, or a polyside by using a known process. The barrier layer can be formed of a material such as $SiO_2$, $Si_3N_4$, $Al_2O_3$ or GaAlAs by using a known process.

Each region can be formed of silicon, amorphous silicon or polysilicon doped with an impurity, a silicide, a two-layer structure having a silicide layer and a semi-conductive layer, or GaAs doped with an impurity at a high concentration by using a known process, depending on characteristics required.

When each region in the semiconductor memory cell according to any one of the third to ninth aspects of the present invention is constituted of a conductive region, it can be formed of a silicide, a metal such as Mo or Al, or a metal compound. When the sixth conductive region $SC_6$ is formed in the semiconductor memory cell according to the third aspect of the present invention, preferably, the fifth region $SC_5$ is constituted of a semi-conductive region. Further, when the sixth conductive region $SC_6$ is formed in the semiconductor memory cell according to the sixth or seventh aspect of the present invention, preferably, the fourth region $SC_4$ is constituted of a semi-conductive region. Moreover, when the sixth conductive region $SC_6$ is formed in the semiconductor memory cell according to the eighth or ninth aspect of the present invention, preferably, the fourth region $SC_4$ is constituted of a semi-conductive region.

In the semiconductor memory cell of the present invention, each gate region of the first transistor $TR_1$ and the second transistor $TR_2$ is connected to the first memory-cell-selecting line. It is therefore sufficient to provide one first memory-cell-selecting line, so that the chip area can be decreased.

In the semiconductor memory cell according to the third aspect or the fourth aspect of the present invention, the first region $SC_1$ corresponding to (or functioning as) one source/drain region of the second transistor $TR_2$ corresponds to (or functions as) the channel forming region $CH_1$ of the first transistor $TR_1$. When information is written in, the second transistor $TR_2$ is brought into an on-state, and as a result, the information is stored in the channel forming region $CH_1$ of the first transistor $TR_1$ as a potential or an electric charge. When the information is read out, the threshold voltage of the first transistor $TR_1$ seen from the gate region varies depending upon the potential or the electric charge (the information) stored in the channel forming region $CH_1$ of the first transistor $TR_1$. Therefore, when the information is read out, the storage state of the first transistor $TR_1$ can be judged from the magnitude of a channel current (including a zero magnitude) by applying a properly selected potential to the gate region. That is, the information is read out by detecting the operation state of the first transistor $TR_1$.

In the semiconductor memory cell according to any one of the fifth to ninth aspects of the present invention, the first region $SC_1$ corresponding to (or functioning as) one source/drain region of the second transistor $TR_2$ corresponds to (or functions as) the channel forming region $CH_1$ of the first transistor $TR_1$. Further, the third region $SC_3$ corresponding to (or functioning as) the channel forming region $CH_2$ of the second transistor $TR_2$ and corresponding to (or functioning as) the source/drain region of the first transistor $TR_1$ is connected to the second memory-cell-selecting line, for example, through the diode D, or connected to the information read-out line. And, a potential in the second memory-cell-selecting line is properly selected, whereby the threshold voltage of the first transistor $TR_1$ seen from the gate region can be allowed to vary at a read-out time. As a result, the on- and off-states of the first transistor $TR_1$ and the second transistor $TR_2$ can be controlled by properly selecting a potential in the first memory-cell-selecting line.

That is, when the potential of the first memory-cell-selecting line of the semiconductor memory cell of the present invention is set at a potential at which the second transistor $TR_2$ is sufficiently brought into an on-state at a write-in time, an electric charge is charged in a capacitor formed between the first region $SC_1$ and the third region $SC_3$ in the second transistor $TR_2$ depending upon the potential of the second memory-cell-selecting line. As a result, information is stored in the channel forming region $CH_1$ (the first region $SC_1$) of the first transistor $TR_1$ as a potential difference between the first region $SC_1$ and the third region $SC_3$ or as an electric charge. When the information is read out, the potential of the third region $SC_3$ is set at a read-out potential, and in the first transistor $TR_1$, the potential or the electric charge (the information) stored in the channel forming region $CH_1$ is converted to a potential difference between the first region $SC_1$ corresponding to (or functioning as) the channel forming region $CH_1$ and the second region $SC_2$ corresponding to (or functioning as) the source/drain region or to an electric charge. As a result, the threshold voltage of the first transistor $TR_1$ seen from the gate region varies depending upon the above potential difference or electric charge (the information). When the information is read out, therefore, the on/off operation of the first transistor $TR_1$ can be controlled by applying a properly selected potential to the gate region. That is, the information can be read out by detecting the operation state of the first transistor $TR_1$.

Moreover, the semiconductor memory cell of the present invention is provided with the junction-field-effect transistor $TR_3$ in addition to the first transistor $TR_1$ and the second transistor $TR_2$. Since the on/off operation of the junction-field-effect transistor $TR_3$ is controlled when the information is read out, a large margin can be left for the current which flows between the second region $SC_2$ and the third region $SC_3$. As a result, the number of semiconductor memory cells that can be connected to the second memory-cell-selecting line is hardly limited, and further, the information holding time (retention time) of the semiconductor memory cell can be increased.

Further, when the diode D is provided, the information read-out line connected to the other source/drain region of the junction-field-effect transistor $TR_3$ can be omitted. Meanwhile, when the diode is constituted of a pn junction in the semiconductor memory cell of the present invention, and if the potential setting in each region constituting the diode or the designing of impurity concentration relationships in each region is improper, "latch-up" may take place when the information is read out. Otherwise, a bipolar pnp transistor constituted of the fourth region $SC_4$, the third region $SC_3$ and the first region $SC_1$ is brought into an on-state, and the information stored in the first region $SC_1$ may leak. For avoiding the above problems, the voltage which is applied to the second memory-cell-selecting line when the information is read out is required to be a low degree of voltage (0.4 volt or lower in a case of a pn junction) at which no large forward current flows in the junction portion of the fourth region $SC_4$ and the third region $SC_3$. The above problems can be overcome, for example, by a method in which the fifth region $SC_5$ in the semiconductor memory cell according to the fifth aspect of the present invention or the sixth region $SC_6$ in the semiconductor memory cell according to the sixth or seventh aspect of the present invention is formed in the surface region of the third region $SC_3$, a silicide, a metal or a metal compound is used to constitute the fifth region $SC_5$ or the sixth region $SC_6$, and the junction between the fifth region $SC_5$ or the sixth region $SC_6$ in an embodiment according to the above aspect of the present invention and the third region $SC_3$ is formed as a junction in which a larger number of carriers mainly constitute a forward current like a Schottky junction. That is, the fifth region $SC_5$ or the sixth region $SC_6$ in an embodiment according to the above aspect of the present invention is constituted of a silicide layer, a metal layer formed of Mo, Al or the like, or a metal compound layer, and a diode of a Schottky junction type is formed, whereby the risk of latch-up can be avoided, and the limitation on the voltage applied to the second memory-cell-selecting line is no longer necessary, or the information retention time can be increased. In some case, the fifth region $SC_5$ and the sixth region $SC_6$ in embodiments according to the above aspects of the present invention may be constituted of a semiconductor layer of the second conductivity type, and a diode of a pn junction type may be formed.

The semiconductor memory cell of the present invention retains the information as a potential, a potential difference or an electric charge, while leak current caused by junction leak, etc., attenuates them sooner or later. It is therefore necessary to refresh it, and the semiconductor memory cell is operated like DRAM.

In the semiconductor memory cell according to any one of the first to ninth aspects of the present invention, the wiring configuration can be simplified by connecting the fifth region $SC_5$ to the first region $SC_1$. In the embodiments according to the fifth to ninth aspects of the present invention, further, the first transistor $TR_1$ and the second transistor $TR_2$ are merged into one unit, and the cell area and the leak current can be decreased.

In the semiconductor memory cell according to the seventh or ninth aspect of the present invention, the third transistor $TR_4$ for write-in is provided in addition to the junction-field-effect transistor $TR_3$, and when the information is read out, the on/off operation of the third transistor $TR_4$ is controlled. A very large margin can be therefore reliably provided for a current which flows between the second region $SC_2$ and the third region $SC_3$. As a result, the limitation on the number of semiconductor memory cells that can be connected to the second memory-cell-selecting line can be further decreased.

BRIEF DESCRIPTION OF THE DRAWINGS

The present invention will be explained in detail with reference to drawings hereinafter.

FIGS. 11A and 11B are a schematic partial cross-sectional view and a schematic layout of a semiconductor memory cell in Example 2.

FIGS. 14A, 14B and 14C are schematic partial cross-sectional views and a schematic layout of a variant of the semiconductor memory cell in Example 2.

FIGS. 15A, 15B and 15C are schematic partial cross-sectional views and a schematic layout of a variant of the semiconductor memory cell in Example 2.

FIGS. 19A and 19B are a schematic partial cross-sectional view and a schematic layout of a semiconductor memory cell in Example 4.

FIGS. 22A and 22B are a schematic partial cross-sectional view and a schematic layout of a variant of the semiconductor memory cell in Example 4.

FIGS. 25A and 25B are a schematic partial cross-sectional view and a schematic layout of a variant of the semiconductor memory cell in Example 4.

FIGS. 26A and 26B are a schematic partial cross-sectional view and a schematic layout of a variant of the semiconductor memory cell in Example 4.

FIGS. 28A and 28B are a schematic partial cross-sectional view and a schematic layout of a variant of the semiconductor memory cell in Example 4.

FIGS. 30A and 30B are a schematic partial cross-sectional view and a schematic layout of a semiconductor memory cell in Example 5.

FIGS. 32A and 32B are a schematic partial cross-sectional view and a schematic layout of a variant of the semiconductor memory cell in Example 5.

FIGS. 33A and 33B are a schematic partial cross-sectional view and a schematic layout of a variant of the semiconductor memory cell in Example 5.

FIGS. 34A and 34B are schematic partial cross-sectional views of a silicon semiconductor substrate, etc., for the explanation of a manufacturing method of the semiconductor memory cell in Example 1.

FIGS. 35A and 35B, subsequent to FIG. 34B, are schematic partial cross-sectional views of a silicon semiconductor substrate, etc., for the explanation of a manufacturing method of the semiconductor memory cell in Example 1.

FIGS. 37A and 37B, subsequent to FIG. 36C, are schematic partial cross-sectional views of a silicon semiconductor substrate, etc., for the explanation of a manufacturing method of the semiconductor memory cell in Example 3.

DESCRIPTION OF THE PREFERRED EMBODIMENTS

Example 1

Figure 1B:
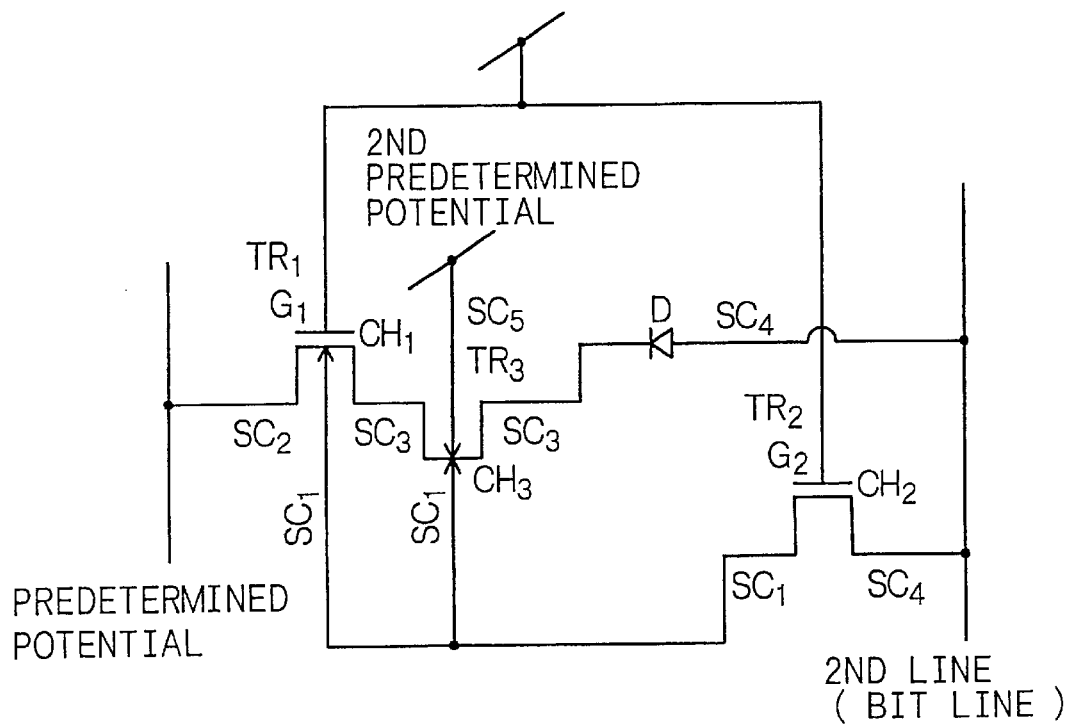
Figure 2:
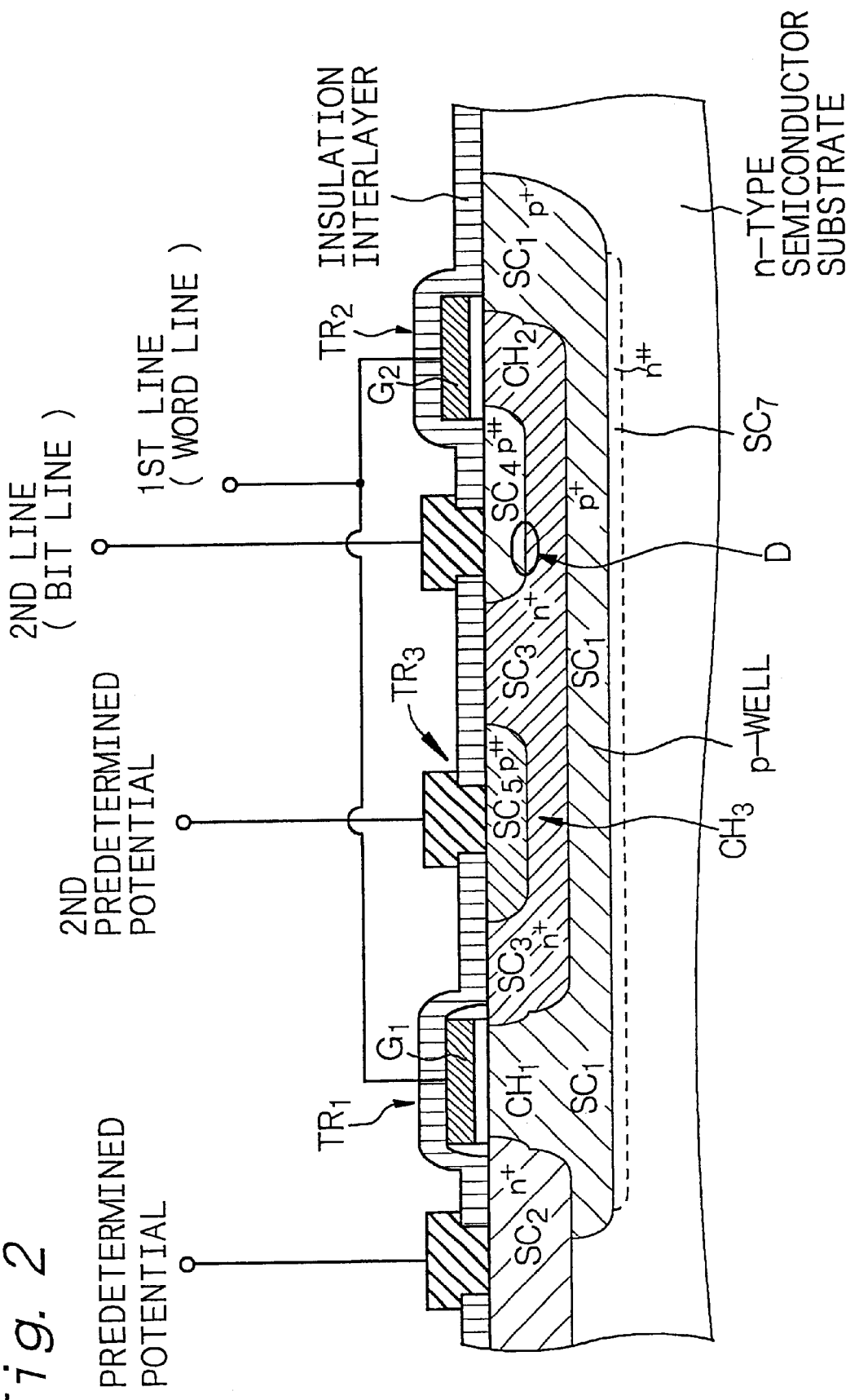
FIG. 2 is a schematic partial cross-sectional view of a semiconductor memory cell in Example 1.

Example 1 is directed to the semiconductor memory cell according to the first and third aspects of the present invention. For example, as FIG. 1B shows its principle and as FIG. 2 shows its schematic partial cross sectional view, the semiconductor memory cell of Example 1 comprises a first transistor $TR_1$ of a first conductivity type (e.g., n-type) for read-out, a second transistor $TR_2$ of a second conductivity type (e.g., p-type) for write-in, and a junction-field-effect transistor $TR_3$ of a first conductivity type (e.g., n-type) for current control. In Example 1, the first transistor $TR_1$ is composed of one transistor, the second transistor $TR_2$ is composed of another transistor, and the junction-field-effect transistor $TR_3$ is composed of a further another transistor. That is, the semiconductor memory cell in Example 1 has three transistors.

Concerning the first transistor $TR_1$;
(A-1) one source/drain region is connected to a predetermined potential,
(A-2) the other source/drain region has a common region with one source/drain region of the junction-field-effect transistor $TR_3$, and
(A-3) a gate region $G_1$ is connected to a first memory-cell-selecting line, for example, a word line.

Further, concerning the second transistor $TR_2$;
(B-1) one source/drain region is connected to a second memory-cell-selecting line, for example, a bit line,
(B-2) the other source/drain region has a common region with a channel forming region $CH_1$ of the first transistor $TR_1$ and with a first gate region of the junction-field-effect transistor $TR_3$, and
(B-3) a gate region $G_2$ is connected to the first memory-cell-selecting line, for example, the word line.

Concerning the junction-field-effect transistor $TR_3$;
(C-1) a second gate region faces the first gate region thereof through a channel region $CH_3$ thereof, the channel region $CH_3$ thereof being an extended region of the other source/drain region of the first transistor $TR_1$, and
(C-2) the other source/drain region is positioned in the extended region of the other source/drain region of the first transistor $TR_1$ via the channel region $CH_3$.

In the semiconductor memory cell of Example 1, the second gate region of the junction-field-effect transistor $TR_3$ is connected to a second predetermined potential, and a junction portion of the other source/drain region of the junction-field-effect transistor $TR_3$ and one source/drain region of the second transistor $TR_2$ forms a diode D.

Otherwise, the semiconductor memory cell of Example 1 has;
(a) a first semi-conductive region $SC_1$ having a second conductivity type, for example, p-type,
(b) a second semi-conductive region $SC_2$ having an opposite conductivity type (a first conductivity type and for example, $n^+$-type) to the second conductivity type, or a second conductive region $SC_2$ formed of a silicide, metal or a metal compound, said second region $SC_2$ being formed in a surface region of the first region $SC_1$, and said second region $SC_2$ forming a rectifier junction together with the first region $SC_1$,
(c) a third semi-conductive region $SC_3$ formed in a surface region of the first region $SC_1$ and spaced from the second region $SC_2$, said third region $SC_3$ having the first conductivity type, for example, $n^+$-type,
(d) a fourth semi-conductive region $SC_4$ having the second conductivity type, for example, $p^{++}$-type, or a fourth conductive region $SC_4$ formed of a silicide, a metal or a metal compound, said fourth region $SC_4$ being formed in a surface region of the third region $SC_3$, and said fourth region $SC_4$ forming a rectifier junction together with the third region $SC_3$, and
(e) a fifth semi-conductive region $SC_5$ having the second conductivity type, for example, $p^{++}$-type, or a fifth conductive region $SC_5$ formed of a silicide, a metal or a metal compound, said fifth region $SC_5$ being formed in a surface region of the third region $SC_3$ and spaced from the fourth region $SC_4$, and said fifth region forming a rectifier junction together with the third region $SC_3$.

And, concerning the first transistor $TR_1$;
(A-1) source/drain regions are constituted of the second region $SC_2$ and the third region $SC_3$,
(A-2) a channel forming region $CH_1$ is constituted of a surface region of the first region $SC_1$ sandwiched by the second region $SC_2$ and the third region $SC_3$, and
(A-3) a gate region $G_1$ is formed on a barrier layer formed on the surface region of the first region $SC_1$ sandwiched by the second region $SC_2$ and the third region $SC_3$.

On the other hand, concerning the second transistor $TR_2$;
(B-1) source/drain regions are constituted of the first region $SC_1$ and the fourth region $SC_4$,
(B-2) a channel forming region $CH_2$ is constituted of a surface region of the third region $SC_3$ sandwiched by the first region $SC_1$ and the fourth region $SC_4$, and
(B-3) a gate region $G_2$ is formed on a barrier layer formed on the surface region of the third region $SC_3$ sandwiched by the first region $SC_1$ and the fourth region $SC_4$.

Concerning the junction-field-effect transistor $TR_3$;
(C-1) gate regions are constituted of the fifth region $SC_5$ and a portion of the first region $SC_1$ facing the fifth region $SC_5$,
(C-2) a channel region $CH_3$ is constituted of part of the third region $SC_3$ sandwiched by the fifth region $SC_5$ and said portion of the first region $SC_1$, and
(C-3) source/drain regions are constituted of the third region $SC_3$ extending from both ends of the channel region $CH_3$ of the junction-field-effect transistor $TR_3$.

The junction-field-effect transistor $TR_3$ is formed by (1) optimizing the distance between the facing gate regions of the junction-field-effect transistor $TR_3$, that is, the thickness of the channel region $CH_3$, and (2) optimizing impurity concentrations of the facing gate regions and the channel region $CH_3$ of the junction-field-effect transistor $TR_3$.

The semiconductor memory cell of Example 1, more specifically, the first region $SC_1$ is formed in a well of the second conductivity type, for example, p-type, formed in a semiconductor substrate.

And the gate region $G_1$ of the first transistor $TR_1$ (to be referred to as "first gate region $G_1$", hereinafter) and the gate region $G_2$ of the second transistor $TR_2$ (to be referred to as "second gate region $G_2$", hereinafter) are connected to the first memory-cell-selecting line, for example, the word line. Further, the second region $SC_2$ is connected to the predetermined potential, the fourth region $SC_4$ is connected to the second memory-cell-selecting line, for example, the bit line, and the fifth region $SC_5$ is connected to the second predetermined potential.

Further, a junction portion of the third region $SC_3$ and the fourth region $SC_4$ forms a diode D, and one source/drain region of the junction-field-effect transistor $TR_3$ is connected to the second memory-cell-selecting line, for example, the bit line, through the diode D.

When a region $SC_7$ containing a high concentration of an impurity having the first conductivity type is preferably formed under the first region $SC_1$, a potential or an electric charge stored in the channel forming region $CH_1$ of the first transistor $TR_1$ can be increased.

The method for manufacturing the semiconductor memory cell of Example 1 will be explained with reference to FIGS. 34A, 34B, 35A and 35B, hereinafter.

[Step-100]

First, a first region $SC_1$ of the second conductivity type (e.g., p-type) is formed in a silicon semiconductor substrate of the first conductivity type (e.g., n-type) by an ion-implanting method (see FIG. 34A). The first semi-conductive region $SC_1$ of the second conductivity type (e.g., p-type) corresponds to a p-type well. Preferably, a region $SC_7$ having the first conductivity type (e.g., n-type) and containing a high concentration of an impurity is formed under the first region $SC_1$ before or after the formation of the first region $SC_1$.

[Step-110]

Then, an about 10 nm thick gate oxide layer corresponding to a barrier layer is formed on the surface of the silicon semiconductor substrate, e.g., by a thermal oxidation method, and then a polysilicon layer doped with an impurity is deposited on an entire surface by a CVD method. A patterned resist is formed on the above polysilicon layer, and the polysilicon layer is patterned using the resist as a mask, to form a first gate region $G_1$ and a dummy pattern. Then, a region containing an n-type impurity is formed in a surface region of the first region $SC_1$ containing a p$^+$-type impurity by ion-implanting an n-type impurity. Thereafter, for example, an SiN layer is formed on an entire surface, and then anisotropically etched to form sidewalls on the side walls of the first gate region $G_1$ and the dummy pattern. Then, a thin oxide layer is formed, and an ion-implantation with a high concentration of an n-type impurity is carried out. In the above manner, as shown in FIG. 34B, the second semi-conductive region $SC_2$ which has the first conductivity type (for example, n$^+$-type) and forms the rectifier junction together with the first region $SC_1$ can be formed in the surface region of the first region $SC_1$, and the third semi-conductive region $SC_3$ which is spaced from the second region $SC_2$ and has the first conductivity type, for example, n$^+$-type can be formed in the surface region of the first region $SC_1$.

[Step-120]

Then, a patterned resist is formed, and the dummy pattern, the sidewalls on the side walls of the dummy pattern and the barrier layer under the dummy pattern are removed with using the resist as a mask. Then, a gate oxide layer corresponding to a barrier layer and the second gate region $G_2$ formed of polysilicon doped with an impurity are formed, whereby a structure shown in FIG. 35A is obtained.

[Step-130]

Then, a patterned resist is formed, and then ion-implantation with a p-type impurity is carried out with using the resist as a mask, and the resist is removed. In this manner, as shown in FIG. 35B, the fourth semi-conductive region $SC_4$ which has the second conductivity type, for example, p$^{++}$-type and forms a rectifier junction together with the third region $SC_3$, can be formed in the surface region of the third region $SC_3$, and the fifth semi-conductive region $SC_5$ which has the second conductivity type (for example, p$^{++}$-type), is spaced from the fourth region $SC_4$ and forms a rectifier junction together with the third region $SC_3$, can be formed in the surface region of the third region $SC_3$.

[Step-140]

Then, an insulation interlayer is formed on an entire surface, opening portions are formed in the insulation interlayer, and a wiring-material layer is formed on the insulation interlayer. Then, the wiring-material layer is patterned to form each line. In the above manner, a semiconductor memory cell of Example 1 as shown in FIG. 2 can be produced.

FIGS. 3, 4, 6, 8A to 8C and 9A to 9C show variants of the semiconductor memory cell of Example 1. The semiconductor memory cell shown in FIG. 3 has a so-called SOI structure, formed on an insulator formed, e.g., of SiO$_2$. The above semiconductor memory cell can be formed in a so-called bonded substrate produced by forming a convex portion in a semiconductor substrate (a starting substrate), depositing an insulator (insulating layer) on an entire surface, attaching the insulator (insulating layer) and a supporting substrate to each other, and grinding and polishing the semiconductor substrate (the starting substrate) from its back surface. In another method, for example, a silicon semiconductor substrate is ion-implanted with oxygen and then, heat-treated to obtain an insulator (insulating layer) according to an SIMOX method, and the semiconductor memory cell can be formed in a silicon layer remaining thereon. In further another method, for example, an amorphous silicon layer or a polysilicon layer is deposited on an insulator (insulating layer) by a CVD method, then, a silicon layer is formed by any one of known single-crystallization methods such as a zone melting crystallization method using laser beam or electron beam and a lateral solid phase epitaxy method in which a crystal is grown through an opening formed in an insulator (insulating layer), and the semiconductor memory cell can be formed in the above silicon layer.

Figure 4:
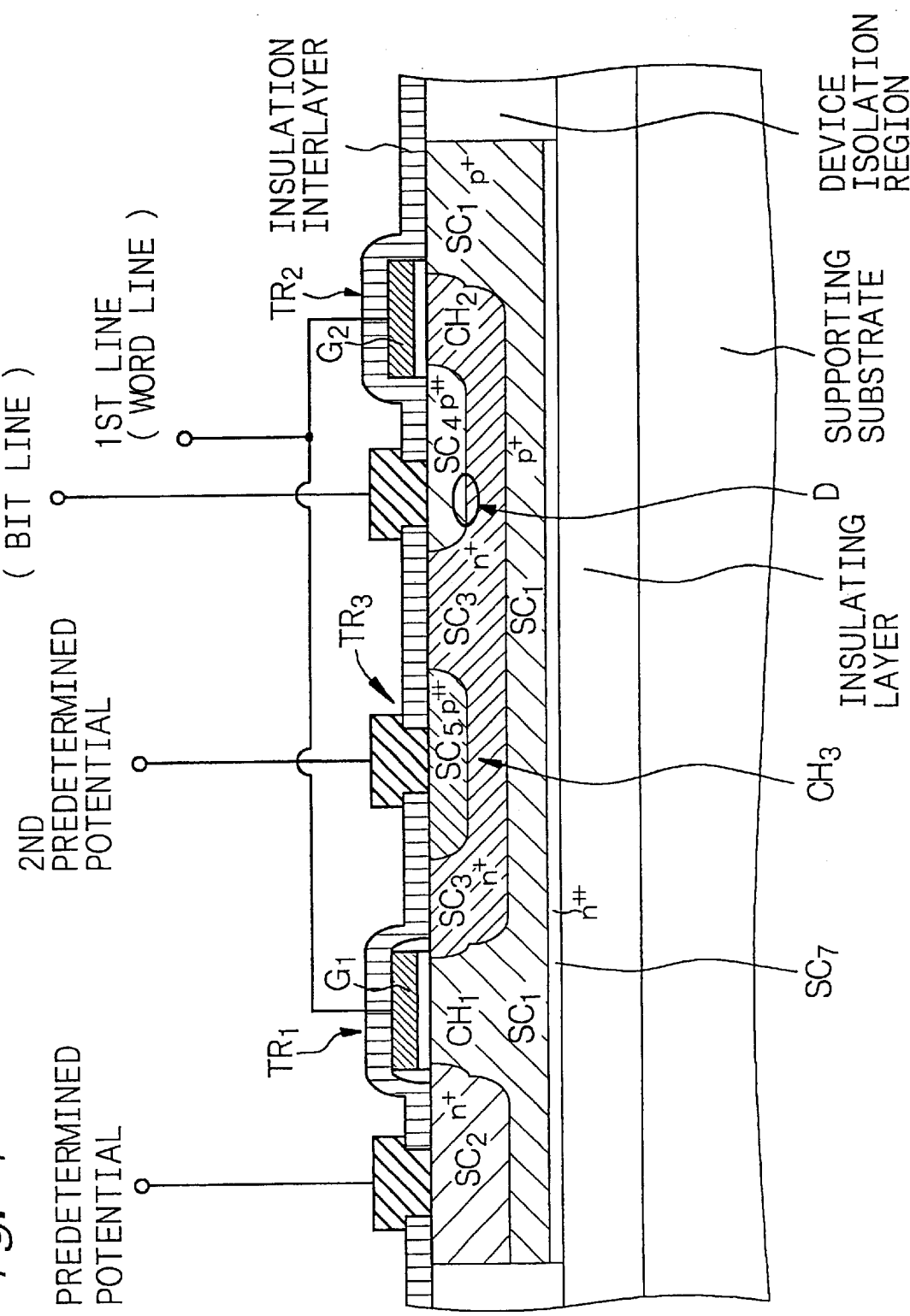
FIG. 4 is a schematic partial cross-sectional view of a variant of the semiconductor memory cell in Example 1.

Further, a semiconductor memory cell shown in FIG. 4 can be obtained by depositing, for example, a polysilicon layer or an amorphous silicon layer on an insulator (insulating layer) deposited on a supporting substrate, and manufacturing the same semiconductor memory cell as that of Example 1 in the above polysilicon layer or amorphous silicon layer. The above semiconductor memory cell has a so-called TFT structure.

Figure 5:
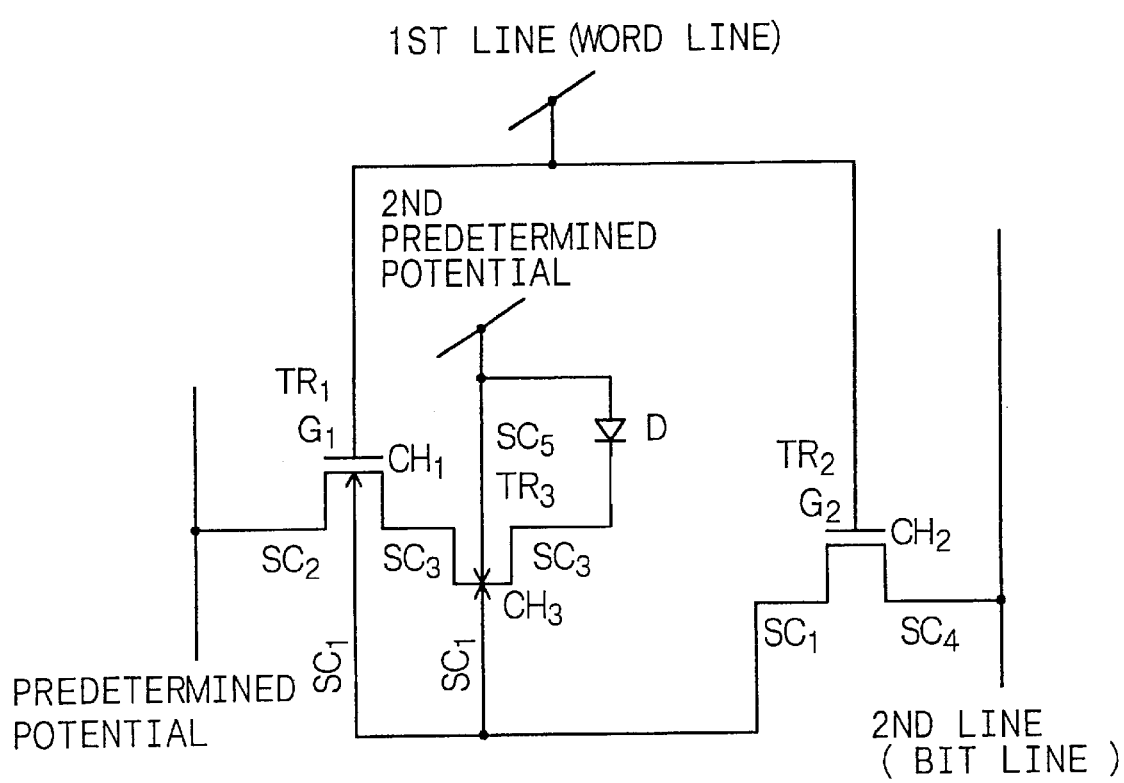
FIG. 5 shows another principle different from that in FIGS. 1A and 1B with regard to the semiconductor memory cell according to the first and third aspects of the present invention.
Figure 6:
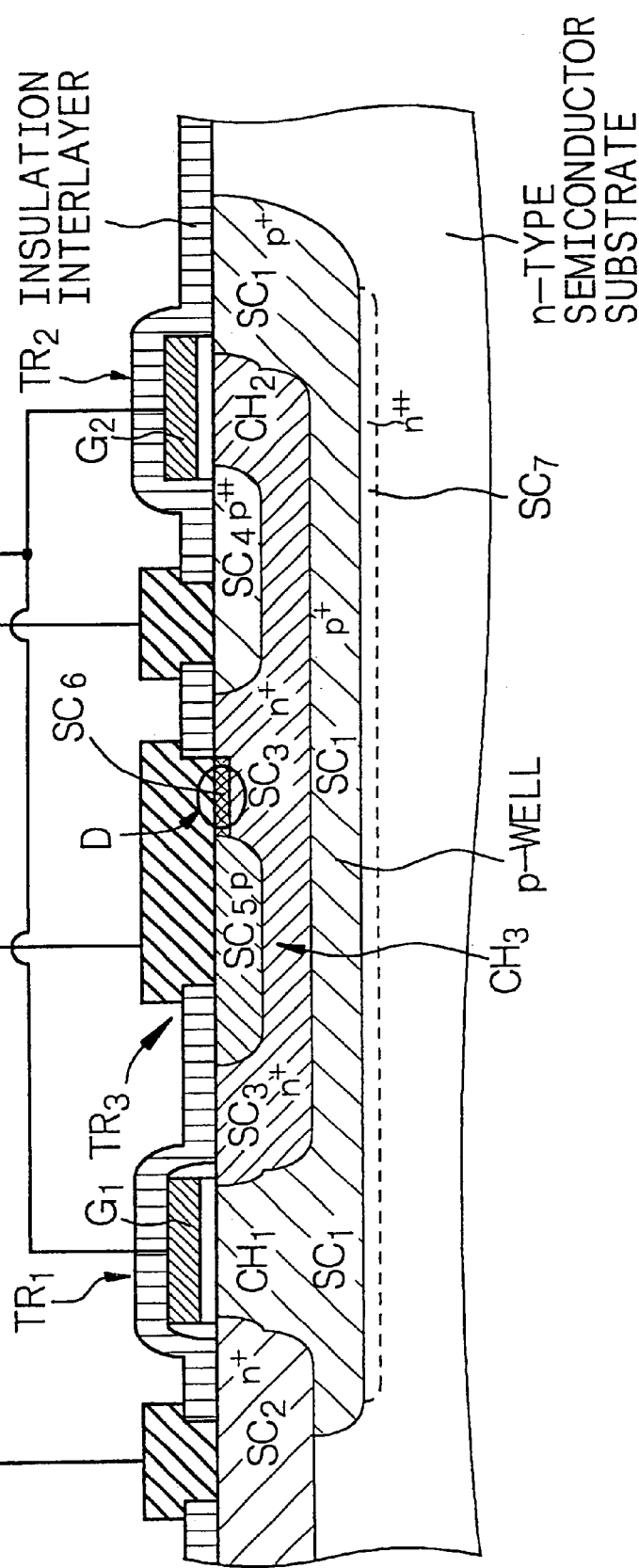
FIG. 6 is a schematic partial cross-sectional view of a variant of the semiconductor memory cell in Example 1.

In a semiconductor memory cell shown in FIG. 6 (see FIG. 5 for its principle), a diode D is formed in a surface region of the third region $SC_3$ corresponding to (or functioning as) one source/drain region of the junction-field-effect transistor $TR_3$. That is, the semiconductor memory cell further has a sixth conductive region $SC_6$ which is formed in a surface region of the third region $SC_3$ and forms a rectifier junction together with the third region $SC_3$, and has a configuration in which the diode D is formed of the sixth region $SC_6$ and the third region $SC_3$ and in which one source/drain region of the junction-field-effect transistor $TR_3$ is connected to the second predetermined potential through the diode D. The above sixth region $SC_6$ may have the same constitution as that of the sixth region $SC_6$ of the semiconductor memory cell according to the sixth aspect of the present invention. In the above constitution, the fifth region $SC_5$ is preferably to be a semi-conductive region.

Figure 7:
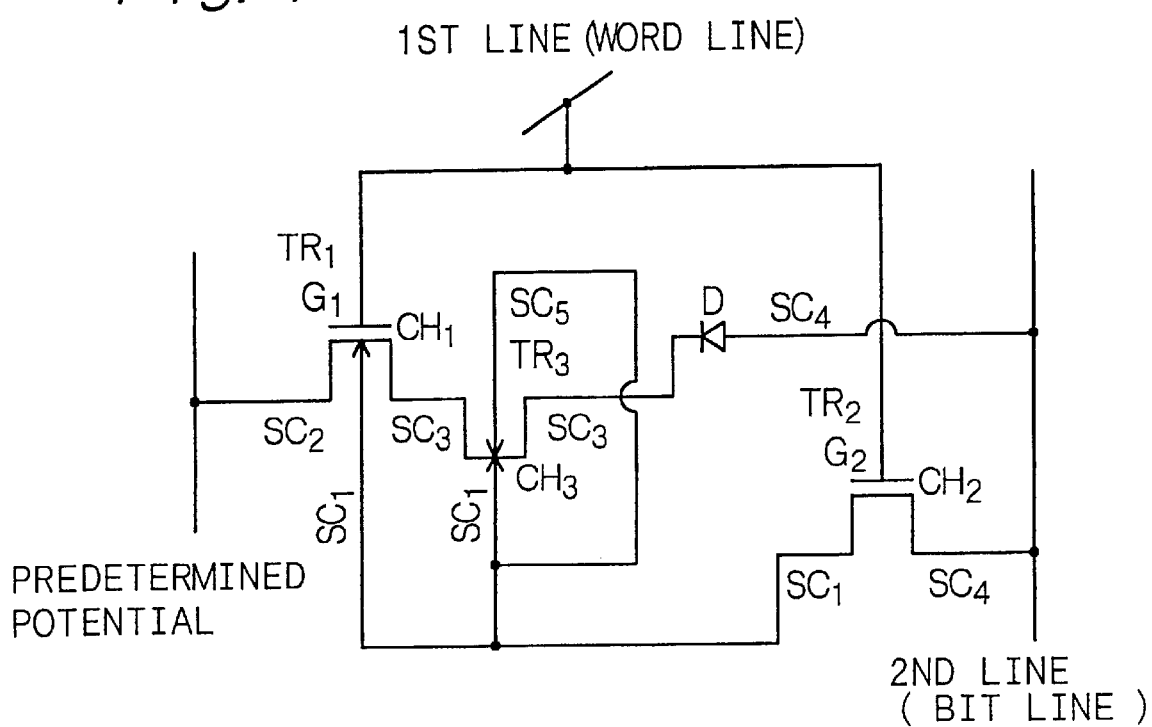
FIG. 7 shows another principle different from that in FIGS. 1A and 1B with regard to the semiconductor memory cell according to the first and third aspects of the present invention.
Figure 8:
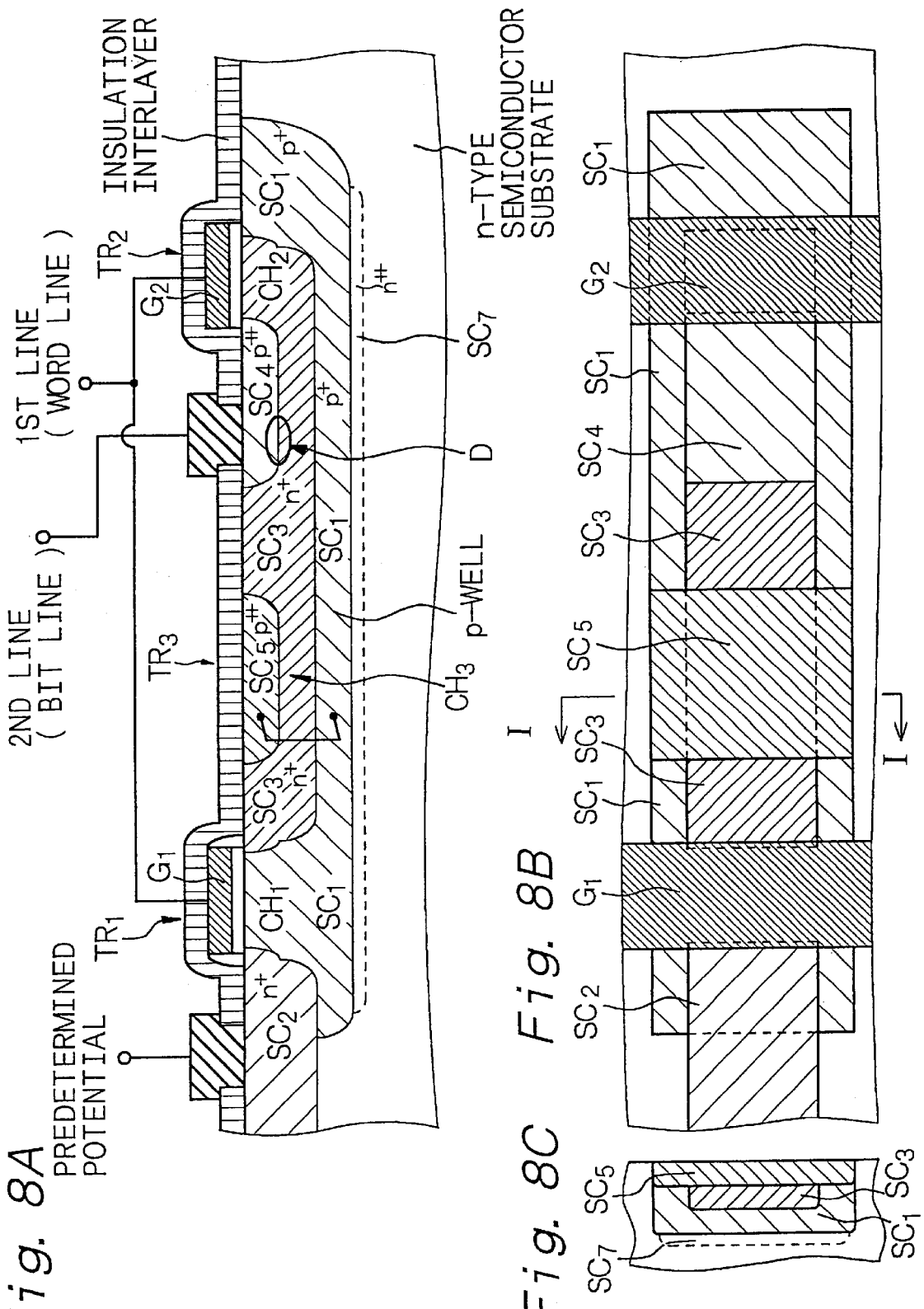
FIGS. 8A, 8B and 8C are schematic partial cross-sectional views and a schematic layout of a variant of the semiconductor memory cell in Example 1.

A semiconductor memory cell whose schematic cross-sectional view is shown in FIG. 8A (see FIG. 7 for its principle) is a variant of the semiconductor memory cell shown in FIG. 2. The fifth region $SC_5$ is connected to the first region $SC_1$, in place of being connected to the second predetermined potential. FIG. 8B schematically shows a layout of each region and the gate region. Further, FIG. 8C shows a cross-sectional view of each region taken along a line I—I in FIG. 8B. The fifth region $SC_5$ and the first region $SC_1$ can be connected to each other, e.g., by providing a structure in which part of the first region $SC_1$ is extended up to the vicinity of the surface of the semiconductor substrate so that the fifth region $SC_5$ and the extending portion of the first region $SC_1$ come in contact with each other outside the third region $SC_3$ as shown in FIGS. 8B and 8C. The wiring configuration of the semiconductor memory cell can be simplified by structuring the semiconductor memory cell as explained above. There may be formed a structure in which a junction portion of the third region $SC_3$ and the fourth region $SC_4$ constitutes a diode D and one source/drain region of the junction-field-effect transistor $TR_3$ is connected to the second memory-cell-selecting line through the diode D.

Figure 3:
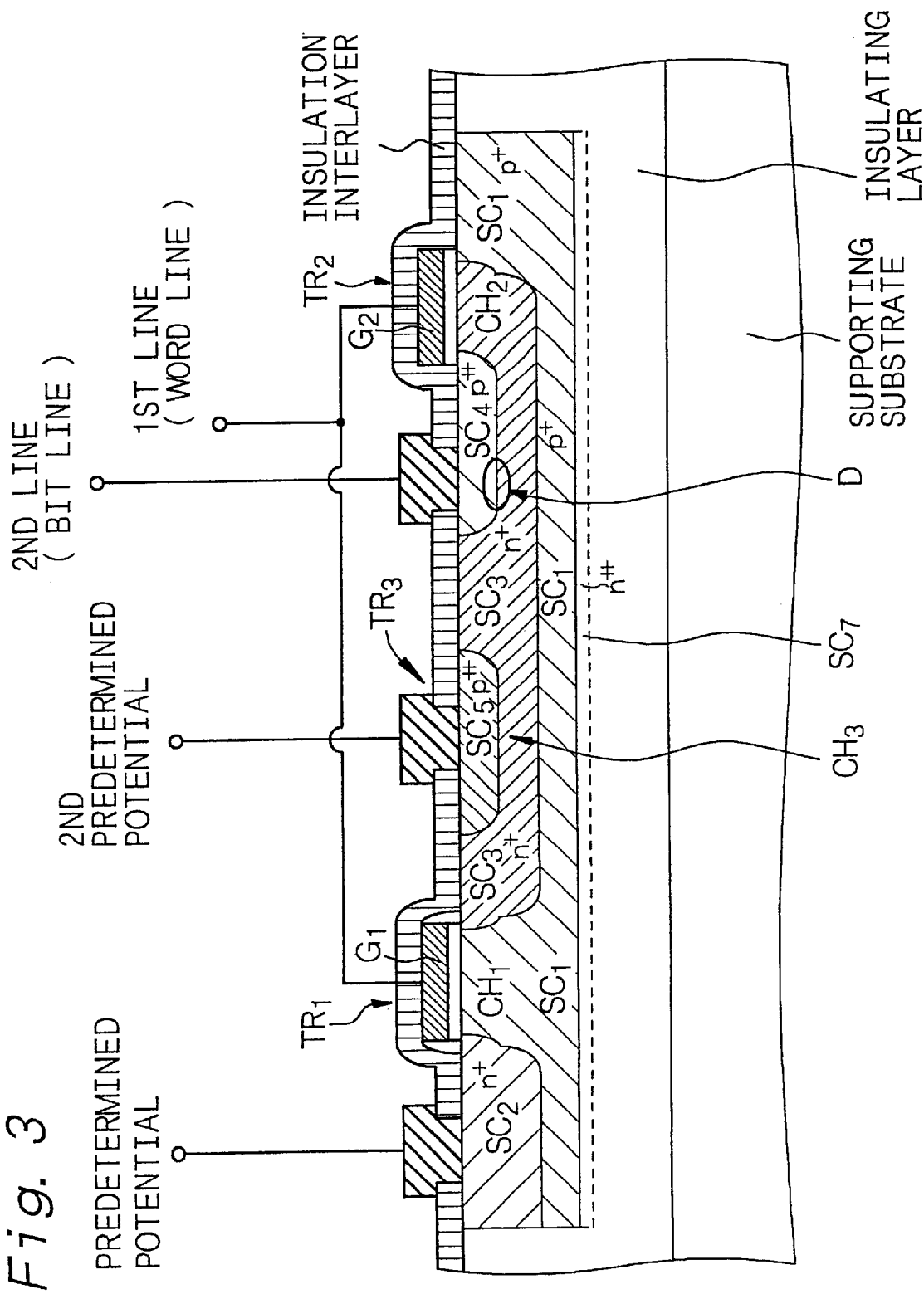
FIG. 3 is a schematic partial cross-sectional view of a variant of the semiconductor memory cell in Example 1.
Figure 9:
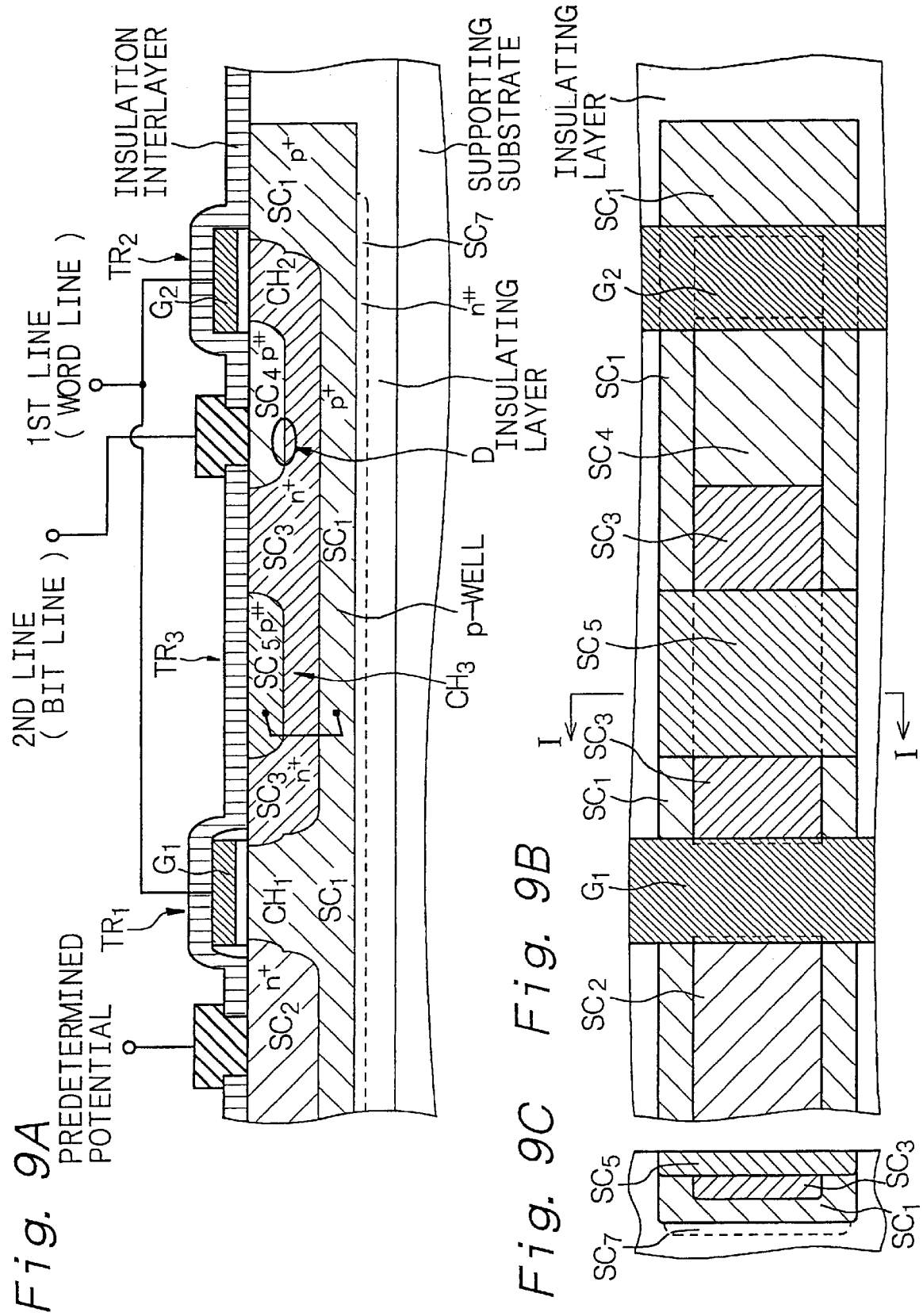
FIGS. 9A, 9B and 9C are schematic partial cross-sectional views and a schematic layout of a variant of the semiconductor memory cell in Example 1.

A semiconductor memory cell shown in FIGS. 9A, 9B and 9C (see FIG. 7 for its principle) is a variant of the semiconductor memory cell shown in FIG. 3, and further, it is a variant of the semiconductor memory cell shown in FIGS. 8A, 8B and 8C. The above semiconductor memory cell has a so-called SOI structure in which it is formed on an insulator composed, e.g., of $SiO_2$. In addition, a semiconductor memory cell having a so-called TFT structure can be also obtained by depositing, e.g., a polysilicon layer or an amorphous silicon layer on an insulator (insulating layer) formed on a supporting substrate and then forming a semiconductor memory cell on the polysilicon layer or the amorphous silicon layer.

Example 2

Figure 10:
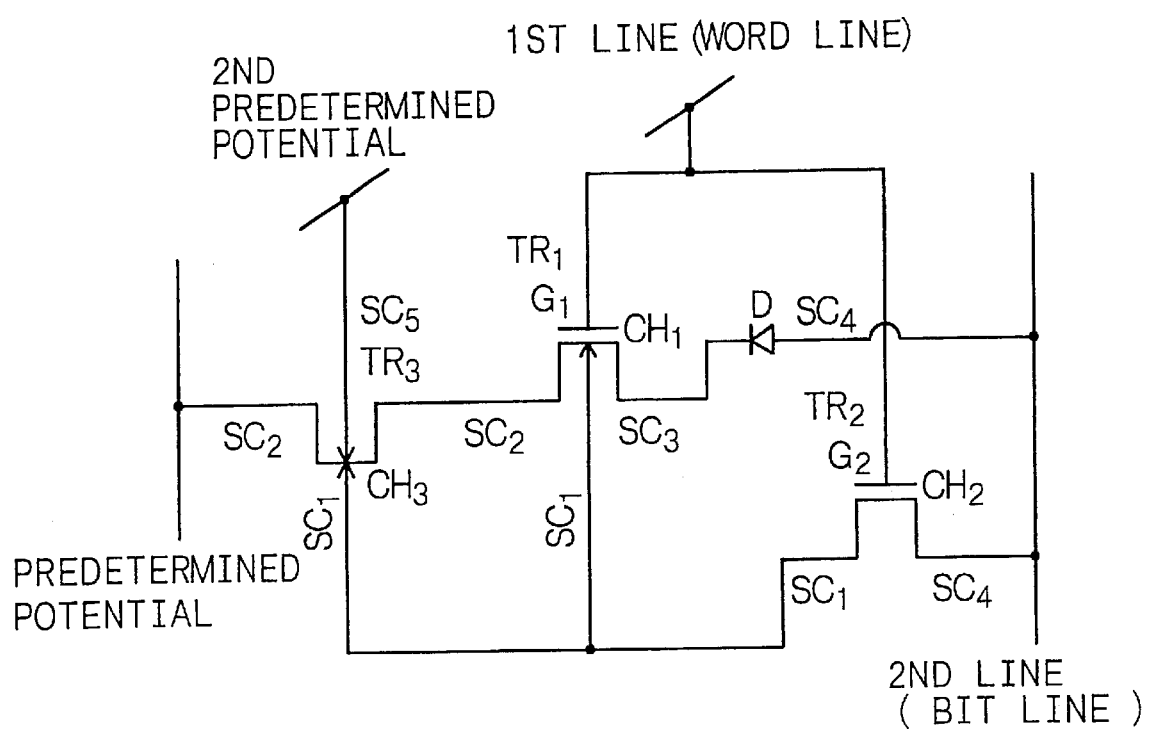
FIG. 10 shows the principle of the semiconductor memory cell according to the second and fourth aspects of the present invention or the second and sixth aspects of the present invention.

Example 2 is directed to the semiconductor memory cell according to the second and fourth aspects of the present invention. As FIG. 10 shows its principle and as FIGS. 11A and 11B show its schematic partial cross-sectional view and layout, the semiconductor memory cell of Example 2 comprises a first transistor $TR_1$ of a first conductivity type (for example, n-type) for read-out, a second transistor $TR_2$ of a second conductivity type (for example, p-type) for write-in, a junction-field-effect transistor $TR_3$ of a first conductivity type (for example, n-type) for current control, and a diode D. In Example 2 as well, the first transistor $TR_1$ is composed of one transistor, the second transistor $TR_2$ is composed of another transistor, and the junction-field-effect transistor $TR_3$ is composed of a further another transistor. That is, the semiconductor memory cell of Example 2 has three transistors. The semiconductor memory cell of Example 2 differs from the semiconductor memory cell of Example 1 in that the fifth region $SC_5$ is formed in a surface region of the second region $SC_2$.

Concerning the first transistor $TR_1$;

(A-1) one source/drain region has a common region with one source/drain region of the junction-field-effect transistor $TR_3$, (A-2) the other source/drain region is connected to a second memory-cell-selecting line, for example, a bit line, through the diode D, and (A-3) a gate region $G_1$ is connected to a first memory-cell-selecting line, for example, a word line.

Further, concerning the second transistor $TR_2$;

(B-1) one source/drain region is connected to the second memory-cell-selecting line, for example, the bit line, (B-2) the other source/drain region has a common region with a channel forming region $CH_1$ of the first transistor $TR_1$ and with a first gate region of the junction-field-effect transistor $TR_3$, and (B-3) a gate region $G_2$ is connected to the first memory-cell-selecting line, for example, the word line. Concerning the junction-field-effect transistor $TR_3$;

(C-1) a second gate region faces the first gate region of the junction-field-effect transistor $TR_3$ through a channel region $CH_3$ of the junction-field-effect transistor $TR_3$, the channel region $CH_3$ being an extended region of one source/drain region of the first transistor $TR_1$, and (C-2) the other source/drain region is positioned in an extended region of the other source/drain region of the first transistor $TR_1$ via the channel region $CH_3$, and is connected to a predetermined potential.

In the semiconductor memory cell of Example 2, the second gate region of the junction-field-effect transistor $TR_3$ is connected to a second predetermined potential, and a junction portion of the other source/drain region of the first transistor $TR_1$ and one source/drain region of the second transistor $TR_2$ formed the diode D.

Otherwise, the semiconductor memory cell of Example 2 (see FIGS. 11A and 11B) has;

(a) a first semi-conductive region $SC_1$ having a second conductivity type, for example, p-type, (b) a second semi-conductive region $SC_2$ formed in a surface region of the first region $SC_1$, said second region $SC_2$ having a first conductivity type, for example, $n^+$-type, (c) a third semi-conductive region $SC_3$ formed in a surface region of the first region $SC_1$ and spaced from the second region $SC_2$, said third region $SC_3$ having the first conductivity type, for example, $n^+$-type, (d) a fourth semi-conductive region $SC_4$ having the second conductivity type, for example, $p^{++}$-type, or a fourth conductive region $SC_4$ formed of a silicide, a metal or a metal compound, said fourth region $SC_4$ being formed in a surface region of the third region $SC_3$, and said fourth region $SC_4$ forming a rectifier junction together with the third region $SC_3$, and (e) a fifth semi-conductive region $SC_5$ having the second conductivity type, for example, $p^{++}$-type, or a fifth conductive region $SC_5$ formed of a silicide, a metal or a metal compound, said fifth region $SC_5$ being formed in a surface region of the second region $SC_2$, and said fifth region $SC_5$ forming a rectifier junction together with the second region $SC_2$.

Concerning the first transistor $TR_1$;

(A-1) source/drain regions are constituted of the second region $SC_2$ and the third region $SC_3$, (A-2) a channel forming region $CH_1$ is constituted of a surface region of the first region $SC_1$ sandwiched by the second region $SC_2$ and the third region $SC_3$, and (A-3) a gate region $G_1$ is formed on a barrier layer formed on the surface region of the first region $SC_1$ sandwiched by the second region $SC_2$ and the third region $SC_3$.

Concerning the second transistor $TR_2$;

(B-1) source/drain regions are constituted of the first region $SC_2$ and the fourth region $SC_4$, (B-2) a channel forming region $CH_2$ is constituted of a surface region of the third region $SC_3$ sandwiched by the first region $SC_1$ and the fourth region $SC_4$, and (B-3) a gate region $G_2$ is formed on a barrier layer formed on the surface region of the third region $SC_3$ sandwiched by the first region $SC_1$ and the fourth region $SC_4$.

Further, concerning the junction-field-effect transistor $TR_3$;

(C-1) gate regions are constituted of the fifth region $SC_5$ and a portion of the first region $SC_1$ facing the fifth region $SC_5$, (C-2) a channel region $CH_3$ is constituted of part of the second region $SC_2$ sandwiched by the fifth region $SC_5$ and said portion of the first region $SC_1$, and (C-3) source/drain regions are constituted of the second region $SC_2$ extending from both ends of the channel region $CH_3$ of the junction-field-effect transistor $TR_3$.

The junction-field-effect transistor $TR_3$ is formed by (1) optimizing the distance between the facing gate regions of the junction-field-effect transistor $TR_3$, that is, the thickness of the channel region $CH_3$, and (2) optimizing impurity concentrations of the facing gate regions and the channel region $CH_3$ of the junction-field-effect transistor $TR_3$.

The semiconductor memory cell of Example 2, more specifically, the first region $SC_1$ is formed in a well of the second conductivity type, for example, p-type, formed in a semiconductor substrate.

The gate region $G_1$ (first gate region $G_1$) of the first transistor $TR_1$ and the gate region $G_2$ (second gate region $G_2$) of the second transistor $TR_2$ are connected to the first memory-cell-selecting line (e.g., the word line). Further, the second region $SC_2$ is connected to the predetermined potential, the fourth region $SC_4$ is connected to the second memory-cell-selecting line (e.g., the bit line), and the fifth region $SC_5$ is connected to the second predetermined potential.

Further, a junction portion of the third region $SC_3$ and the fourth region $SC_4$ forms a diode D, and the third region $SC_3$ corresponding to (or functioning as) one source/drain region of the first transistor $TR_1$ is connected to the second memory-cell-selecting line (e.g., the bit line) through the diode D.

When a region $SC_7$ containing a high concentration of an impurity having the first conductivity type is preferably formed under the first region $SC_1$, a potential or an electric charge stored in the channel forming region $CH_1$ of the first transistor $TR_1$ can be increased.

The method of manufacturing the semiconductor memory cell of Example 2 can be substantially the same as the method of manufacturing the semiconductor memory cell of Example 1 except for a position where the fifth region $SC_5$ is to be formed. The detailed explanation thereof is therefore omitted.

Figures 12A, 12B:
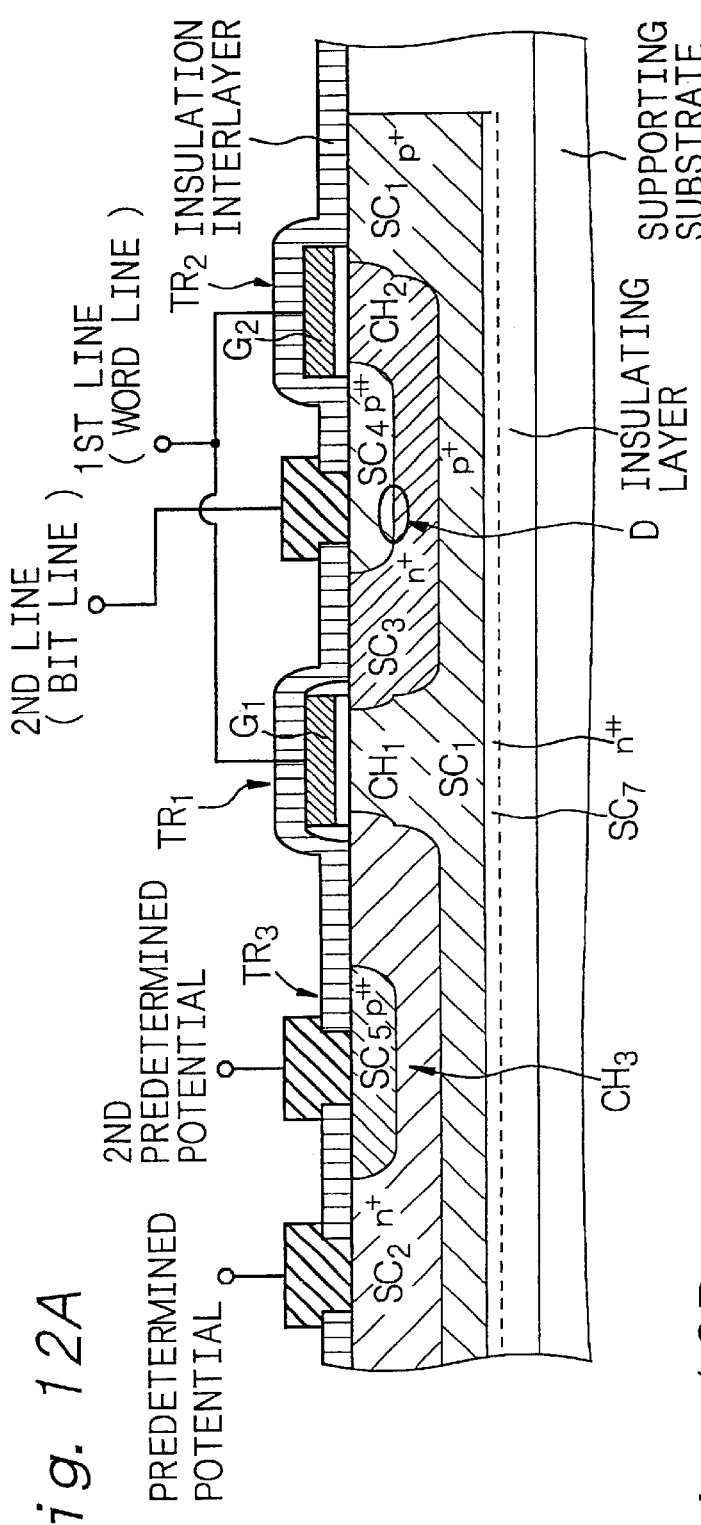
FIGS. 12A and 12B are a schematic partial cross-sectional view and a schematic layout of a variant of the semiconductor memory cell in Example 2.

A semiconductor memory cell shown in FIGS. 12A and 12B (see FIG. 10 for its principle) is a variant of the semiconductor memory cell shown in FIGS. 11A and 11B, and has a so-called SOI structure in which it is formed on an insulator formed, e.g., of $SiO_2$. In addition, a semiconductor memory cell having a so-called TFT structure can be obtained as well by depositing, for example, a polysilicon layer or an amorphous silicon layer on an insulator (insulating layer) formed on a supporting substrate, and then manufacturing a semiconductor memory cell in the above polysilicon layer or amorphous silicon layer.

Further, in a semiconductor memory cell shown in FIGS. 14A to 14C and FIGS. 15A to 15C (see FIG. 13 for its principle), the fifth region $SC_5$ is connected to the first region $SC_1$, in place of being connected to the second predetermined potential. FIGS. 14A and 15A schematically show its partial cross-sectional view, and FIGS. 14B and 15B schematically show the layout of each region and the gate region. Further, FIGS. 14C and 15C show schematic cross-sectional views taken along lines I—I in FIGS. 14B and 15B. The fifth region $SC_5$ and the first region $SC_1$ can be connected to each other, e.g., by providing a structure in which part of the first region $SC_1$ is extended up to the vicinity of the surface of the semiconductor substrate so that the fifth region $SC_5$ and the extending portion of the first region $SC_1$ come in contact with each other outside the second region $SC_2$. The wiring configuration of the semiconductor memory cell can be simplified by structuring the semiconductor memory cell as explained above.

Example 3

Example 3 is directed to the semiconductor memory cell according to the first and fifth aspect of the present invention, and is further directed to the method of manufacturing the semiconductor memory cell according to the first aspect of the present invention. The semiconductor memory cell of Example 3 differs from the semiconductor memory cell of Example 1 in the following point. In the semiconductor memory cell of Example 1, one semiconductor memory cell is constituted of 3 transistors and 1 diode. In contrast, in the semiconductor memory cell of Example 3, one semiconductor memory cell is constituted of 3 transistors merged into 1 transistor and 1 diode.

Figure 16A:
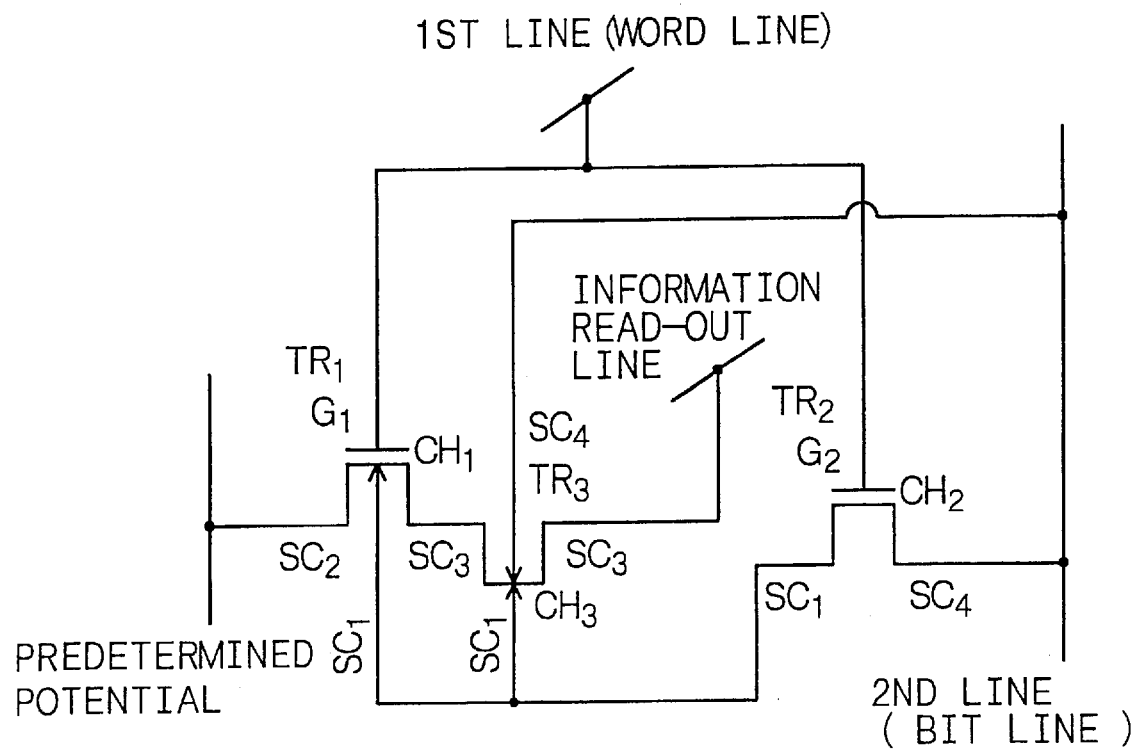
FIGS. 16A and 16B show the principles of the semiconductor memory cell according to the first and fifth aspects of the present invention.
Figure 16B:
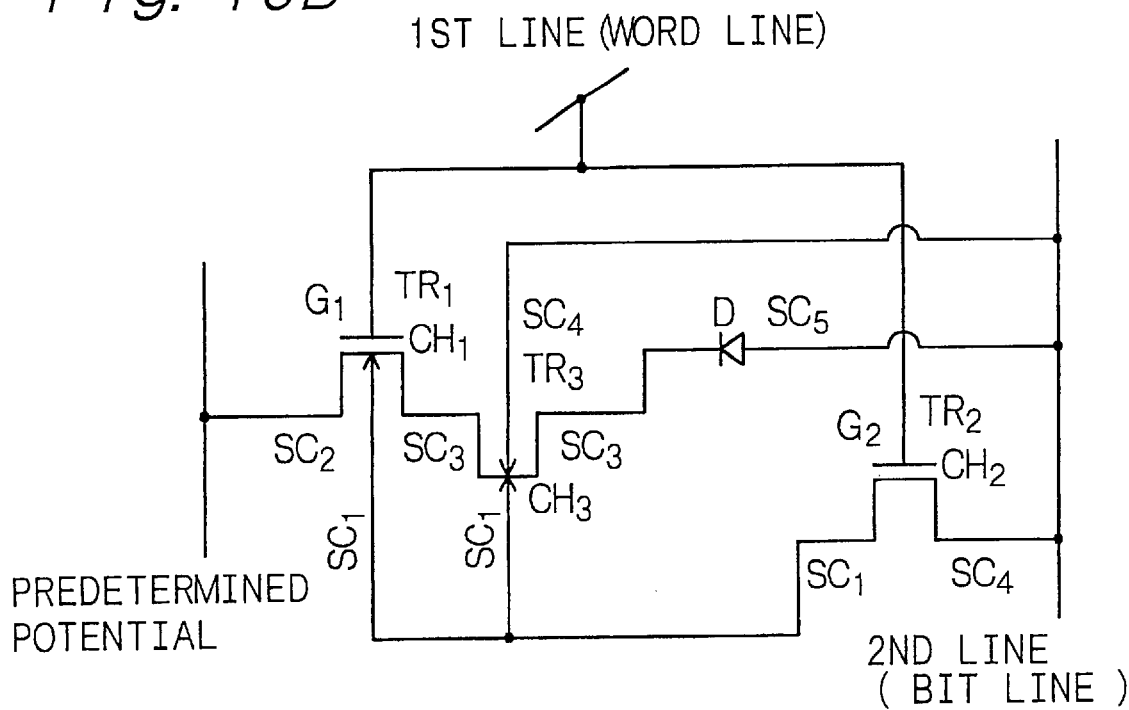
Figure 17:
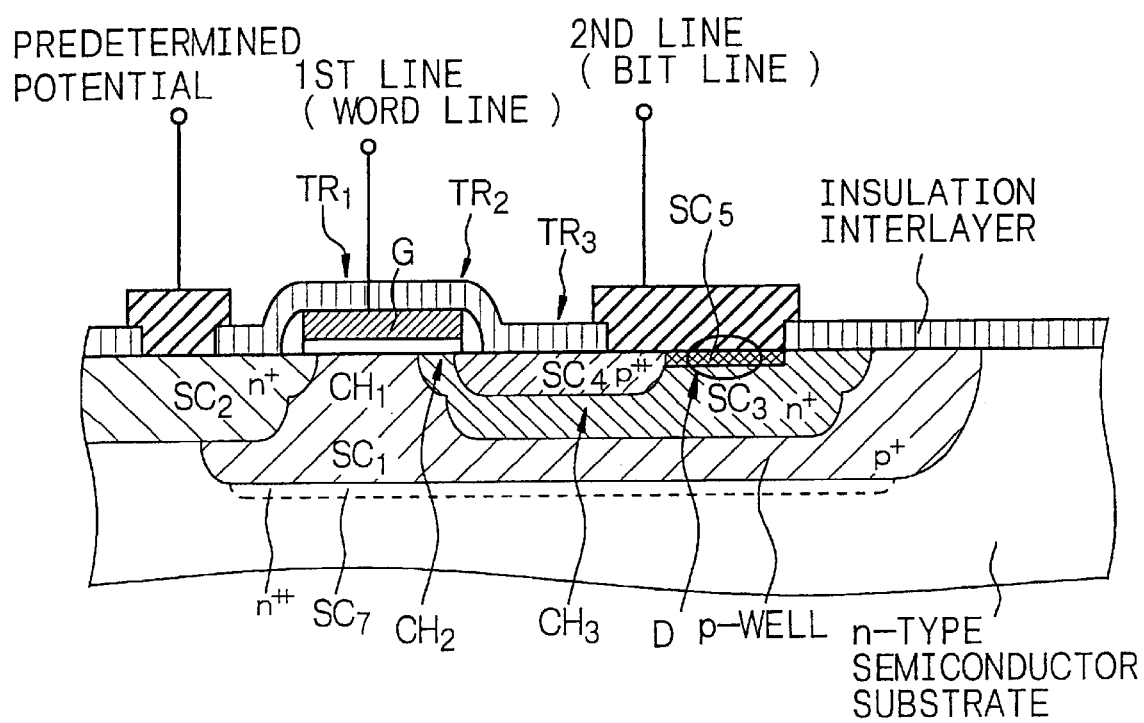
FIG. 17 is a schematic partial cross-sectional view of a semiconductor memory cell in Example 3.

As FIG. 16B shows its principle and as FIG. 17 schematically shows one example of its partial cross-sectional view, the semiconductor memory cell of Example 3 comprises a first transistor $TR_1$ of a first conductivity type (for example, n-type) for read-out, a second transistor $TR_2$ of a second conductivity type (for example, p-type) for write-in, and a junction-field-effect transistor $TR_3$ of a first conductivity type (for example, n-type) for current control. The semiconductor memory cell has;

(a) a first semi-conductive region $SC_1$ having a second conductivity type, for example, p-type, (b) a second semi-conductive region $SC_2$ having an opposite conductivity type (first conductivity type and for example, $n^+$-type) to the second conductivity type, or a second conductive region $SC_2$ formed of a silicide, a metal or a metal compound, said second region $SC_2$ being formed in a surface region of the first region $SC_1$, and said second region $SC_2$ forming a rectifier junction together with the first region $SC_1$, (c) a third semi-conductive region $SC_3$ formed in a surface region of the first region $SC_1$ and spaced from the second region $SC_2$, said third region $SC_3$ having the first conductivity type, for example, $n^+$-type, (d) a fourth semi-conductive region $SC_4$ formed in a surface region of the third region $SC_3$, said fourth region $SC_4$ having the second conductivity type, for example, $p^{++}$-type, and (e) a gate region G shared by the first transistor $TR_1$ and the second transistor $TR_2$ and formed on a barrier layer so as to bridge the second region $SC_2$ and the third region $SC_3$ and so as to bridge the first region $SC_1$ and the fourth region $SC_4$.

Concerning the first transistor $TR_1$;

(A-1) source/drain regions are constituted of the second region $SC_2$ and a surface region of the third region $SC_3$ which surface region is sandwiched by the first region $SC_1$ and the fourth region $SC_4$, and (A-2) a channel forming region $CH_1$ is constituted of a surface region of the first region $SC_1$ sandwiched by the second region $SC_2$ and the third region $SC_3$.

Concerning the second transistor $TR_2$;

(B-1) source/drain regions are constituted of the first region $SC_1$ and the fourth region $SC_4$, and (B-2) a channel forming region $CH_2$ is constituted of a surface region of the third region $SC_3$ which surface region corresponds to (or functions as) one source/drain region of the first transistor $TR_1$ and is sandwiched by the first region $SC_1$ and the fourth region $SC_4$.

Further, concerning the junction-field-effect transistor $TR_3$;

(C-1) gate regions are constituted of the fourth region $SC_4$ and a portion of the first region $SC_1$ facing the fourth region $SC_4$, (C-2) a channel region $CH_3$ is constituted of part of the third region $SC_3$ positioned under one source/drain region of the second transistor $TR_2$ and sandwiched by the first region $SC_1$ and the fourth region $SC_4$, (C-3) one source/drain region is constituted of a surface region of the third region $SC_3$ which surface region extends from one end of the channel region $CH_3$ of the junction-field-effect transistor $TR_3$, corresponds to (or functions as) one source/drain region of the first transistor $TR_1$, corresponds to (or functions as) the channel forming region $CH_2$ of the second transistor $TR_2$ and is sandwiched by the first region $SC_1$ and the fourth region $SC_4$, and (C-4) the other source/drain region is constituted of the third region $SC_3$ extending from the other end of the channel region $CH_3$ of the junction-field-effect transistor $TR_3$.

And, the gate region G is connected to a first memory-cell-selecting line (for example, a word line), the fourth region $SC_4$ is connected to a second memory-cell-selecting line (for example, a bit line), and the second region $SC_2$ is connected to a predetermined potential.

Further, the semiconductor memory cell of Example 3 has a fifth conductive region $SC_5$ which is formed in a surface region of the third region $SC_3$ and forms a rectifier junction together with the third region $SC_3$, and has a configuration in which a diode D of Schottky junction type is formed of the fifth region $SC_5$ and the third region $SC_3$ and in which the third region $SC_3$ corresponding to (or functioning as) the other source/drain region of the junction-field-effect transistor $TR_3$ is connected to the second memory-cell-selecting line (for example, the bit line) through the diode D.

The semiconductor memory cell of Example 3, more specifically, the first region $SC_1$ is formed in a well of the second conductivity type, for example, p-type, formed in a semiconductor substrate.

The junction-field-effect transistor $TR_3$ is formed by (1) optimizing the distance between the facing gate regions of the junction-field-effect transistor $TR_3$, that is, the thickness of the channel region $CH_3$, and (2) optimizing impurity concentrations of the facing gate regions and the channel region $CH_3$ of the junction-field-effect transistor $TR_3$.

When a region $SC_7$ containing a high concentration of an impurity having the first conductivity type is preferably formed under the first region $SC_1$, a potential or an electric charge stored in the channel forming region $CH_1$, of the first transistor $TR_1$ can be increased.

The method of manufacturing the semiconductor memory cell of Example 3, will be explained with reference to FIGS. 36A, 36B, 36C, 37A and 37B, hereinafter.

[Step-300]

Figure 36A:
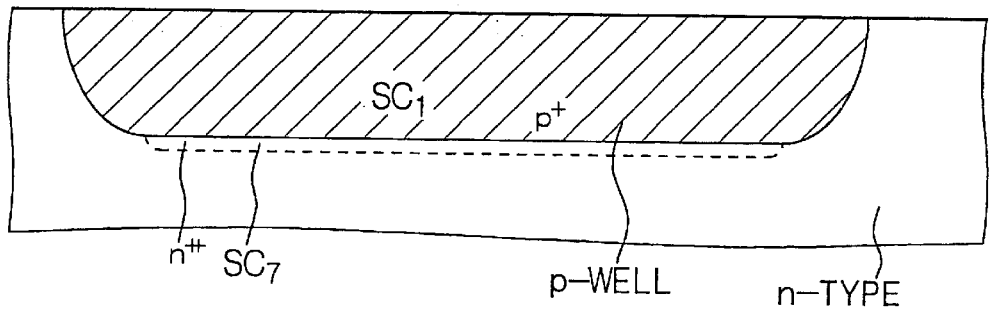
FIGS. 36A, 36B and 36C are schematic partial cross-sectional views of a silicon semiconductor substrate, etc., for the explanation of a manufacturing method of the semiconductor memory cell in Example 3.

First, a first semi-conductive region $SC_1$ of a second conductivity type (e.g., p-type) is formed in a silicon semiconductor substrate of the first conductivity type (e.g., n-type) by an ion-implanting method (see FIG. 36A). The first region $SC_1$ of the second conductivity type (e.g., p-type) corresponds to a p-type well. Preferably, a region $SC_7$ having the first conductivity type (e.g., n-type) and containing a high concentration of an impurity is formed under the first region $SC_1$ before or after the formation of the first region $SC_1$.

[Step-310]

Figure 36B:
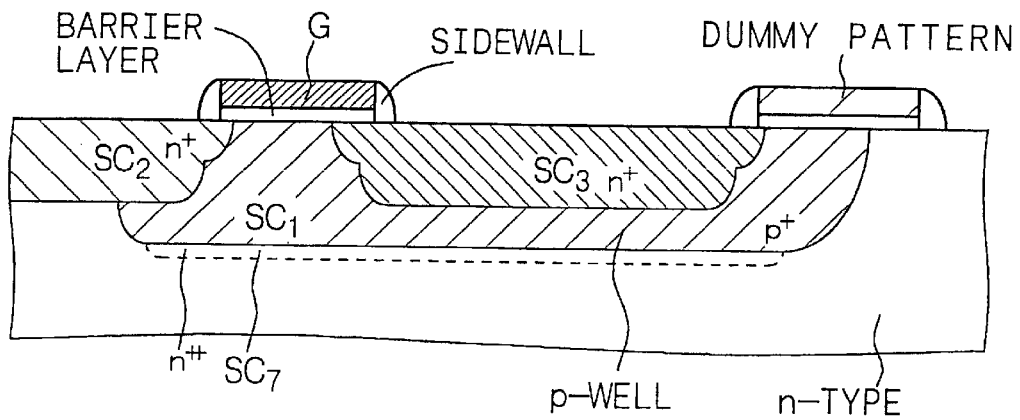

Then, an about 10 nm thick oxide layer (gate oxide layer) corresponding to a barrier layer is formed on the silicon semiconductor substrate surface, e.g., by a thermal oxidation method, and then a polysilicon layer doped with an impurity is deposited on an entire surface by a CVD method. A patterned resist is formed on the above polysilicon layer, and the polysilicon layer is patterned using the resist as a mask, to form a gate region G and a dummy pattern. Then, a region containing an n-type impurity is formed in a surface region of the first region $SC_1$ containing a $p^+$-type impurity by ion-implanting an n-type impurity. Thereafter, for example, an SiN layer is formed on an entire surface, and then anisotropically etched to form sidewalls on the side walls of the gate region G and the dummy pattern. Then, a thin oxide layer is formed, and an ion-implantation with a high concentration of an n-type impurity is carried out. In the above manner, as shown in FIG. 36B, the second semi-conductive region $SC_2$ which has an $n^+$ conductivity type and forms a rectifier junction together with the first region $SC_1$ can be formed in a surface region of the first region $SC_1$, and the third semi-conductive region $SC_3$ which has the first conductivity type (for example, $n^+$-type) and is spaced from the second region $SC_2$ can be formed in a surface region of the first region $SC_1$.

[Step-320]

Figure 36C:
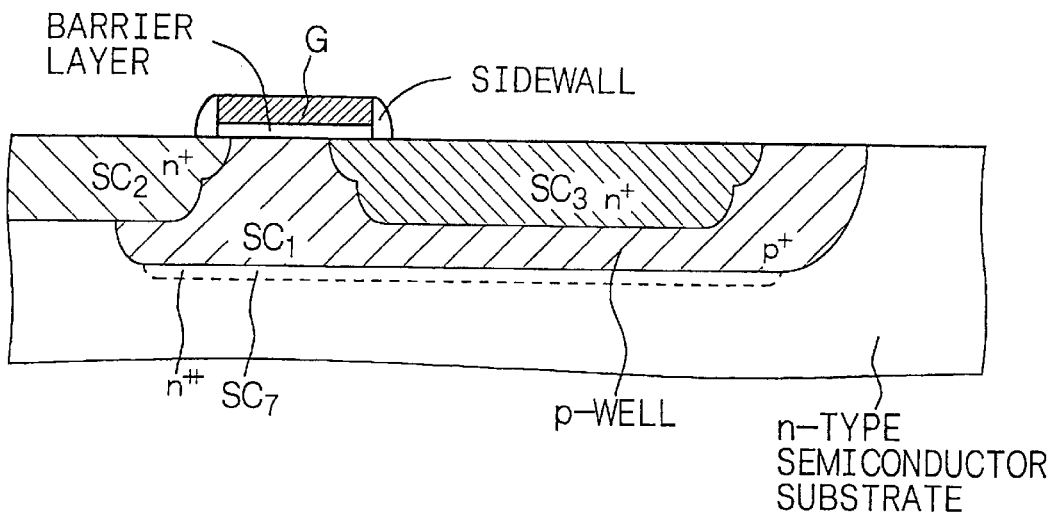

Then, a patterned resist is formed, and the dummy pattern, the sidewalls on the side walls of the dummy pattern and the barrier layer under the dummy pattern are removed with using the resist as a mask, whereby a structure shown in FIG. 36C is obtained.

[Step-330]

Then, a patterned resist is formed, and then ion-implantation with a p-type impurity is carried out with using the resist as a mask, and the resist is removed. In this manner, as shown in FIG. 37A, the fourth semi-conductive region $SC_4$ which has the second conductivity type (e.g., $p^{++}$-type) and forms a rectifier junction together with the third region $SC_3$ can be formed in a surface region of the third region $SC_3$. In the above-explained ion-implanting methods, each of the first region $SC_1$, the third region $SC_3$ and the fourth region $SC_4$ is formed such that the distance between the facing gate regions of the junction-field-effect transistor $TR_3$ is optimized and that the impurity concentrations of the facing gate regions and the channel region $CH_3$ of the junction-field-effect transistor $TR_3$ are optimized. The above ion-implanting procedures may be carried out in any order.

[Step-340]

Then, a fifth conductive region $SC_5$ is formed in a surface region of the third region $SC_3$ for forming a diode of Schottky junction type (hetero-junction type). For example, a titanium silicide layer is formed in the surface region of the third region $SC_3$ (see FIG. 37B). The above titanium silicide layer can be formed, for example, by the following method. That is, for example, an insulation interlayer is deposited on an entire surface, and a portion of the insulation interlayer where the titanium silicide layer is to be formed is removed. Then, a titanium layer is deposited, by a sputtering method, on the insulation interlayer including an exposed surface of the silicon semiconductor substrate. Then, a first annealing treatment is carried out, and the titanium layer and the silicon semiconductor substrate are allowed to react to form a titanium silicide layer on the surface of the silicon semiconductor. Then, unreacted titanium layer on the insulation interlayer is removed, e.g., with $NH_4OH:H_2O_2:H_2O$, and a second annealing treatment is carried out, whereby a stable titanium silicide layer can be obtained. The material for forming the diode is not limited to titanium silicide, and it may be selected from materials such as cobalt silicide and tungsten silicide.

[Step-350]

Then, opening portions are formed in the insulation interlayer, a wiring-material layer is formed on the insulation interlayer, and the wiring-material layer is patterned to form various lines. In the above manner, the semiconductor memory cell of Example 3 shown in FIG. 17 can be produced.

Figure 18A:
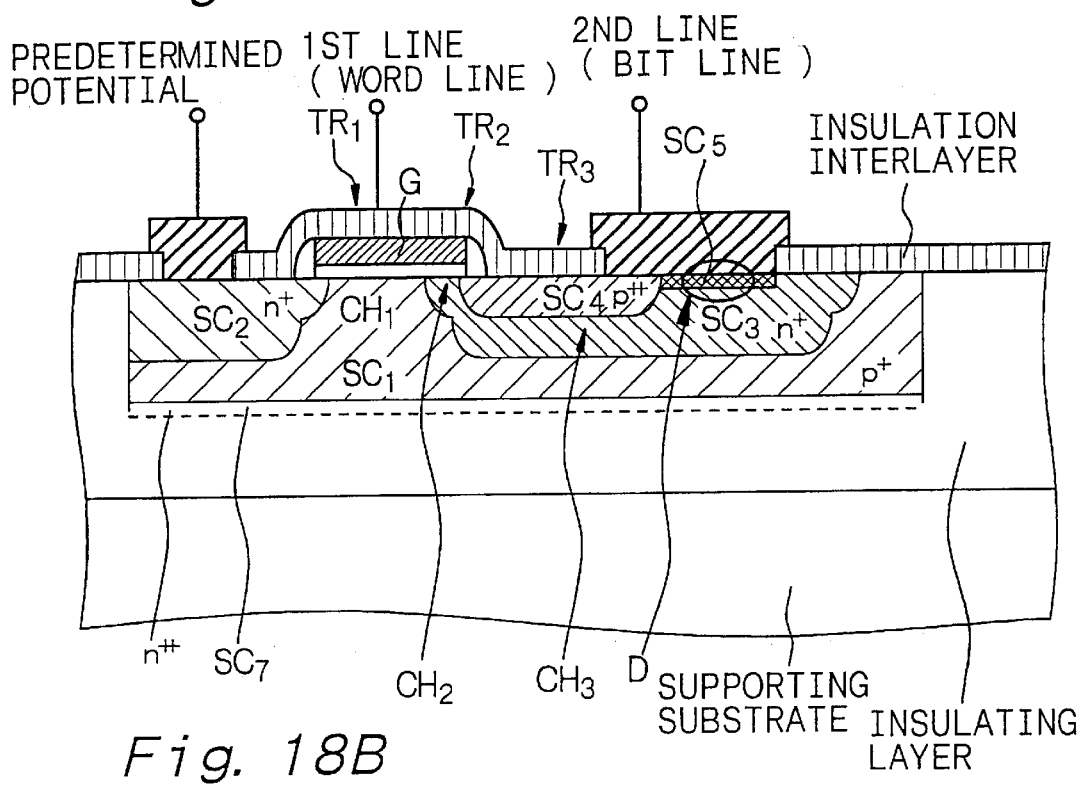
FIGS. 18A and 18B are schematic partial cross-sectional views of variants of the semiconductor memory cell in Example 3.
Figure 18B:
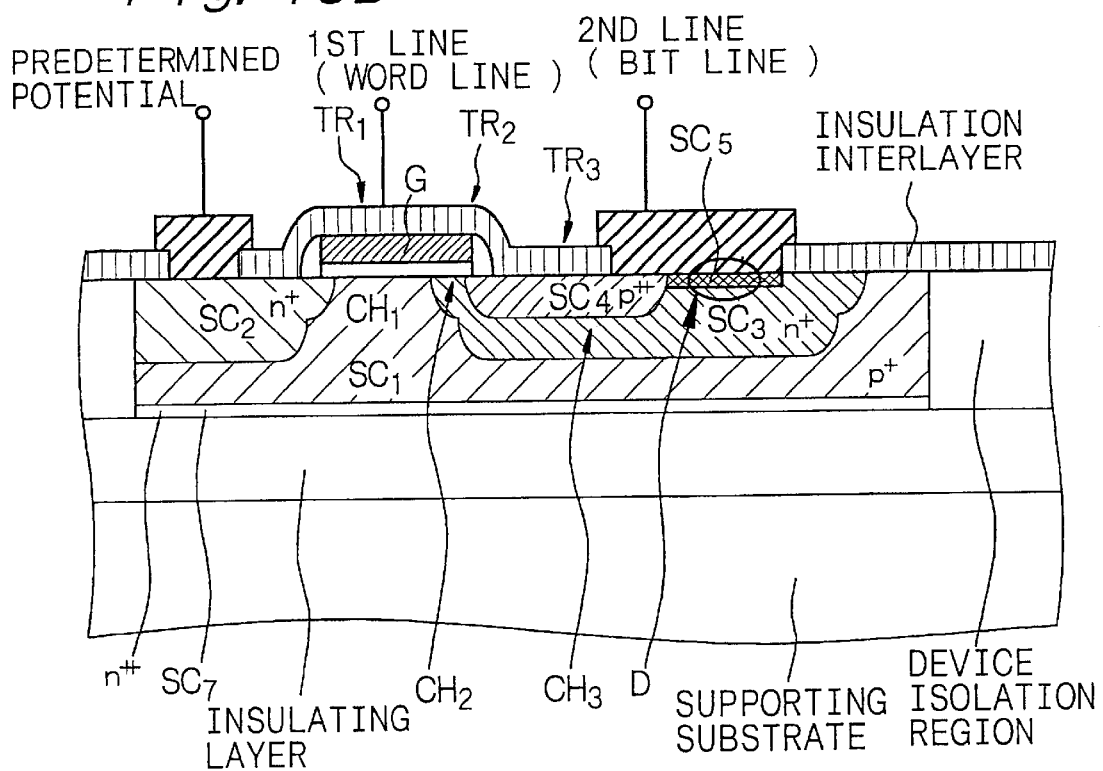

FIGS. 18A and 18B show a variant of the semiconductor memory cell of Example 3. The semiconductor memory cell shown in FIG. 18A has a so-called SOI structure in which it is formed on an insulator formed, e.g., of $SiO_2$. The above semiconductor memory cell can be formed in a so-called bonded substrate produced by forming a convex portion in a semiconductor substrate (starting substrate), forming an insulator (insulating layer) on an entire surface, attaching the insulator (insulating layer) and a supporting substrate to each other, and grinding and polishing the semiconductor substrate (starting substrate) from its back surface. In another method, for example, a silicon semiconductor substrate is ion-implanted with oxygen and then, heat-treated to obtain an insulator (insulating layer) according to an SIMOX method, and the semiconductor memory cell can be formed in a silicon layer remaining thereon. In further another method, for example, an amorphous silicon layer or a polysilicon layer is deposited on an insulator (insulating layer) by a CVD method, then, a silicon layer is formed by any one of known single-crystallization methods such as a zone melting crystallization method using laser beam or electron beam and a lateral solid phase epitaxy method in which a crystal is grown through an opening formed in an insulator (insulating layer), and the semiconductor memory cell can be formed in the above silicon layer.

Further, a semiconductor memory cell shown in FIG. 18B can be obtained by forming, for example, a polysilicon layer or an amorphous silicon layer on an insulator (insulating layer) deposited on a supporting substrate, and then manufacturing the same semiconductor memory cell as that of Example 3 in the above polysilicon layer or amorphous silicon layer. The above semiconductor memory cell has a so-called TFT structure.

Example 4

Example 4 is directed to the semiconductor memory cell according to the second and sixth aspects of the present invention, and further to the method of manufacturing the semiconductor memory cell according to the second aspect of the present invention. The semiconductor memory cell of Example 4 differs from the semiconductor memory cell of Example 2 in the following point. In the semiconductor memory cell of Example 2, one semiconductor memory cell is composed of 3 transistors, while the semiconductor memory cell of Example 4 is composed of 1 transistor formed by merging the first transistor and the second transistor into 1 transistor.

As FIG. 10 shows its principle and as FIGS. 19A and 19B schematically show its partial cross-sectional view and layout, the semiconductor memory cell of Example 4 comprises a first transistor $TR_1$ of a first conductivity type (for example, n-type) for read-out, a second transistor $TR_2$ of a second conductivity type (for example, p-type) for write-in, and a junction-field-effect transistor $TR_3$ of a first conductivity type (for example, n-type) for current control. And, the semiconductor memory cell has;

(a) a first semi-conductive region $SC_1$ having a second conductivity type, for example, p-type, (b) a second semi-conductive region $SC_2$ formed in a surface region of the first region $SC_1$, said second region $SC_2$ having a first conductivity type, for example, $n^+$-type opposite to the second conductivity type, (c) a third semi-conductive region $SC_3$ formed in a surface region of the first region $SC_1$ and spaced from the second region $SC_2$, said third region $SC_3$ having the first conductivity type, for example, $n^+$-type, (d) a fourth semi-conductive region $SC_4$ having the second conductivity type, for example, $p^{++}$-type, or a fourth conductive region $SC_4$ formed of a silicide, a metal or a metal compound, which is formed in a surface region of the third region $SC_3$ and forms a rectifier junction together with the third region $SC_3$, (e) a fifth semi-conductive region $SC_5$ having the second conductivity type, for example, $p^{++}$-type, or a fifth conductive region $SC_5$ formed of a silicide, a metal or a metal compound, which is formed in a surface region of the second regions $SC_2$ and forms a rectifier junction together with the second region $SC_2$, and (f) a gate region G shared by the first transistor $TR_1$ and the second transistor $TR_2$ and formed on a barrier layer so as to bridge the second region $SC_2$ and the third region $SC_3$ and so as to bridge the first region $SC_1$ and the fourth region $SC_4$.

Concerning the first transistor $TR_1$;

(A-1) source/drain regions are constituted of the second region $SC_2$ and a surface region of the third region $SC_3$ which surface region is sandwiched by the first region $SC_1$ and the fourth region $SC_4$, and (A-2) a channel forming region $CH_1$ is constituted of a surface region of the first region $SC_1$ sandwiched by the second region $SC_2$ and the third region $SC_3$.

Concerning the second transistor $TR_2$;

(B-1) source/drain regions are constituted of the first region $SC_1$ and the fourth region $SC_4$, and (B-2) a channel forming region $CH_2$ is constituted of a surface region of the third region $SC_3$ which surface region corresponds to (or functions as) one source/drain region of the first transistor $TR_1$ and is sandwiched by the first region $SC_1$ and the fourth region Further, concerning the junction-field-effect transistor $TR_3$;

(C-1) gate regions are constituted of the fifth region $SC_5$ and a portion of the first region $SC_1$ facing the fifth region $SC_5$, (C-2) a channel region $CH_3$ is constituted of part of the second region $SC_2$ sandwiched by the fifth region $SC_5$ and said portion of the first region $SC_1$, (C-3) one source/drain region is constituted of the second region $SC_2$ which extends from one end of the channel region $CH_3$ of the junction-field-effect transistor $TR_3$ and corresponds to (or functions as) one source/drain region of the first transistor $TR_1$, and (C-4) the other source/drain region is constituted of the second region $SC_2$ extending from the other end of the channel region $CH_3$ of the junction-field-effect transistor $TR_3$.

And, the gate region G is connected to a first memory-cell-selecting line, for example, a word line, the second region $SC_2$ is connected to a predetermined potential, the fourth region $SC_4$ is connected to a second memory-cell-selecting line, for example, a bit line, and the fifth region $SC_5$ is connected to a second predetermined potential.

Further, a junction portion of the third region $SC_3$ and the fourth region $SC_4$ forms a diode D, and the third region $SC_3$ corresponding to (or functioning as) one source/drain region of the first transistor $TR_1$ is connected to the second memory-cell-selecting line, for example, the bit line, through the diode D.

The semiconductor memory cell of Example 4, more specifically, the first region $SC_1$ is formed in a well of the second conductivity type, for example, p-type, formed in a semiconductor substrate.

The junction-field-effect transistor $TR_3$ is formed by (1) optimizing the distance between the facing gate regions of the junction-field-effect transistor $TR_3$, that is, the thickness of the channel region $CH_3$, and (2) optimizing impurity concentrations of the facing gate regions and the channel region $CH_3$ of the junction-field-effect transistor $TR_3$.

When a region $SC_7$ containing a high concentration of an impurity having the first conductivity type is preferably formed under the first region $SC_1$, a potential or an electric charge stored in the channel forming region $CH_1$ of the first transistor $TR_1$ can be increased.

Figure 20A:
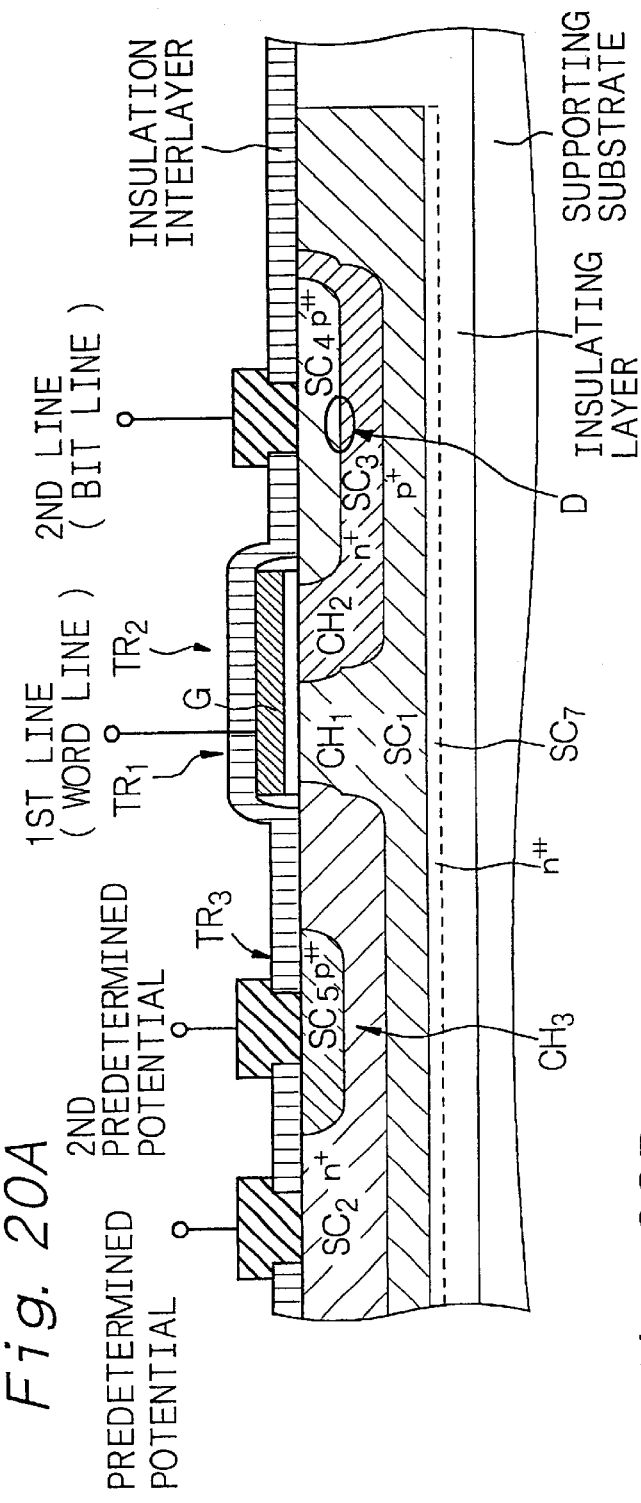
FIGS. 20A and 20B are a schematic partial cross-sectional view and a schematic layout of a variant of the semiconductor memory cell in Example 4.
Figure 20B:
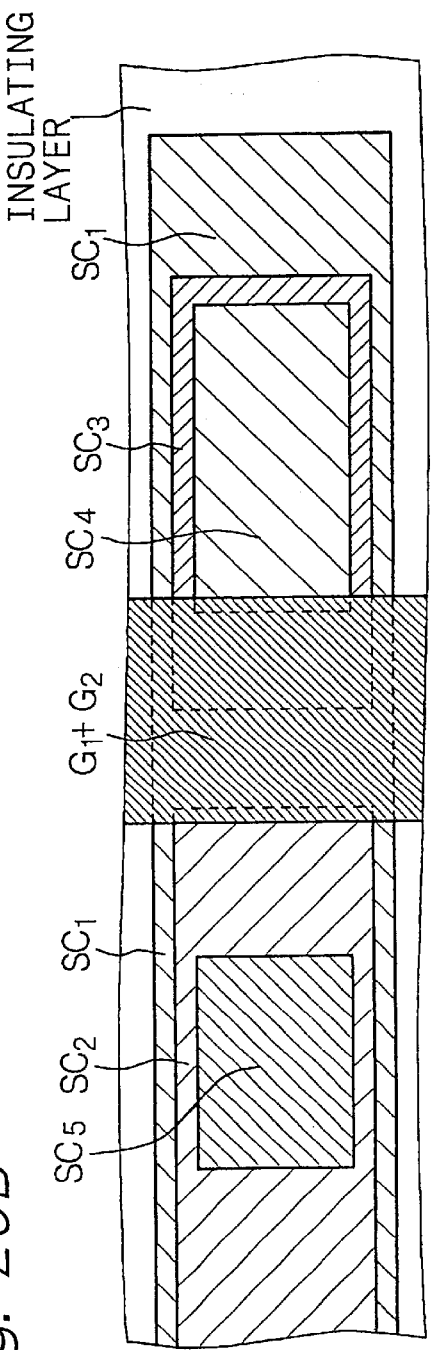

A semiconductor memory cell shown in FIGS. 20A and 20B (see FIG. 10 for its principle) is a variant of the semiconductor memory cell shown in FIGS. 19A and 19B, and it has a so-called SOI structure in which it is formed on an insulator composed, e.g., of $SiO_2$. In addition, a semiconductor memory cell having a so-called TFT structure can be also obtained by forming, e.g., a polysilicon layer or an amorphous silicon layer on an insulator (insulating layer) formed on a supporting substrate and then forming the semiconductor memory cell on the polysilicon layer or the amorphous silicon layer.

Figure 21:
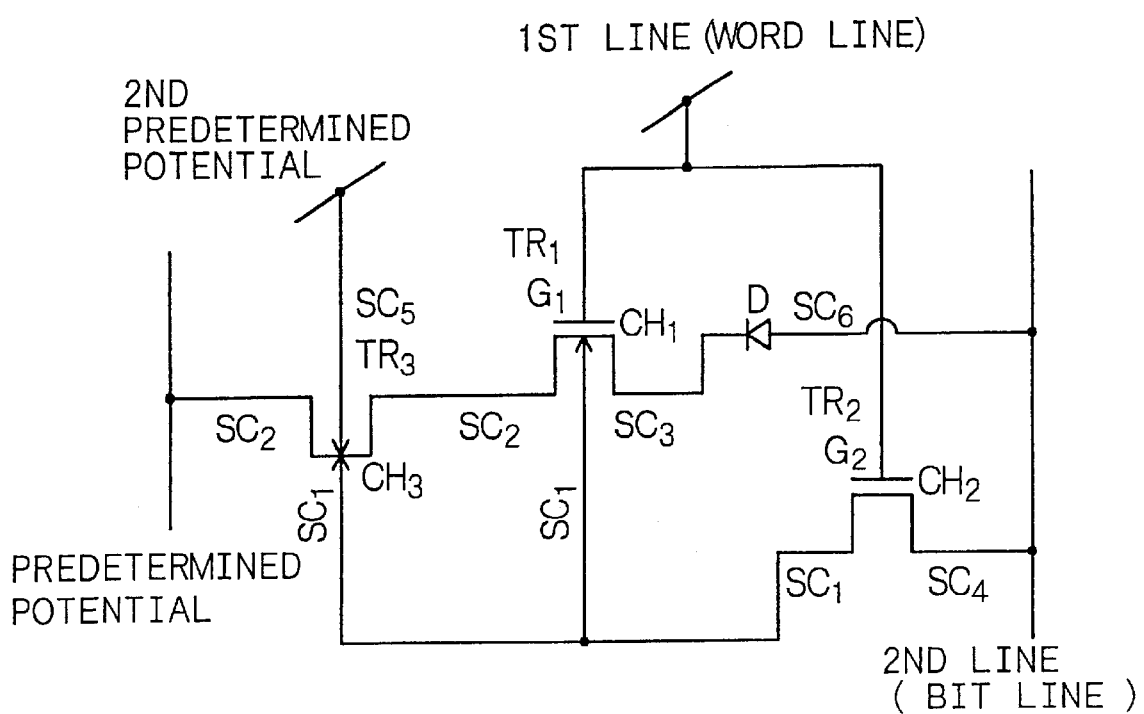
FIG. 21 shows the principle of the semiconductor memory cell according to the second and sixth aspects of the present invention.

In Example 4, as FIG. 21 shows a principle, as FIG. 22A shows a schematic partial cross-sectional view and as FIG. 22B shows a schematic layout, the semiconductor memory cell may have a sixth conductive region $SC_6$ which is formed in a surface region of the third region $SC_3$ and forms a rectifier junction together with the third region $SC_3$, and has a configuration in which a diode D of Schottky junction type is formed of the sixth region $SC_6$ and the third region $SC_3$ and in which the third region $SC_3$ corresponding to (or functioning as) the other source/drain region of the first transistor $TR_1$ is connected to the second memory-cell-selecting line, for example, the bit line, through the diode D. In the above structure, preferably, the fourth region $SC_4$ is a semi-conductive region.

Figures 23A, 23B:
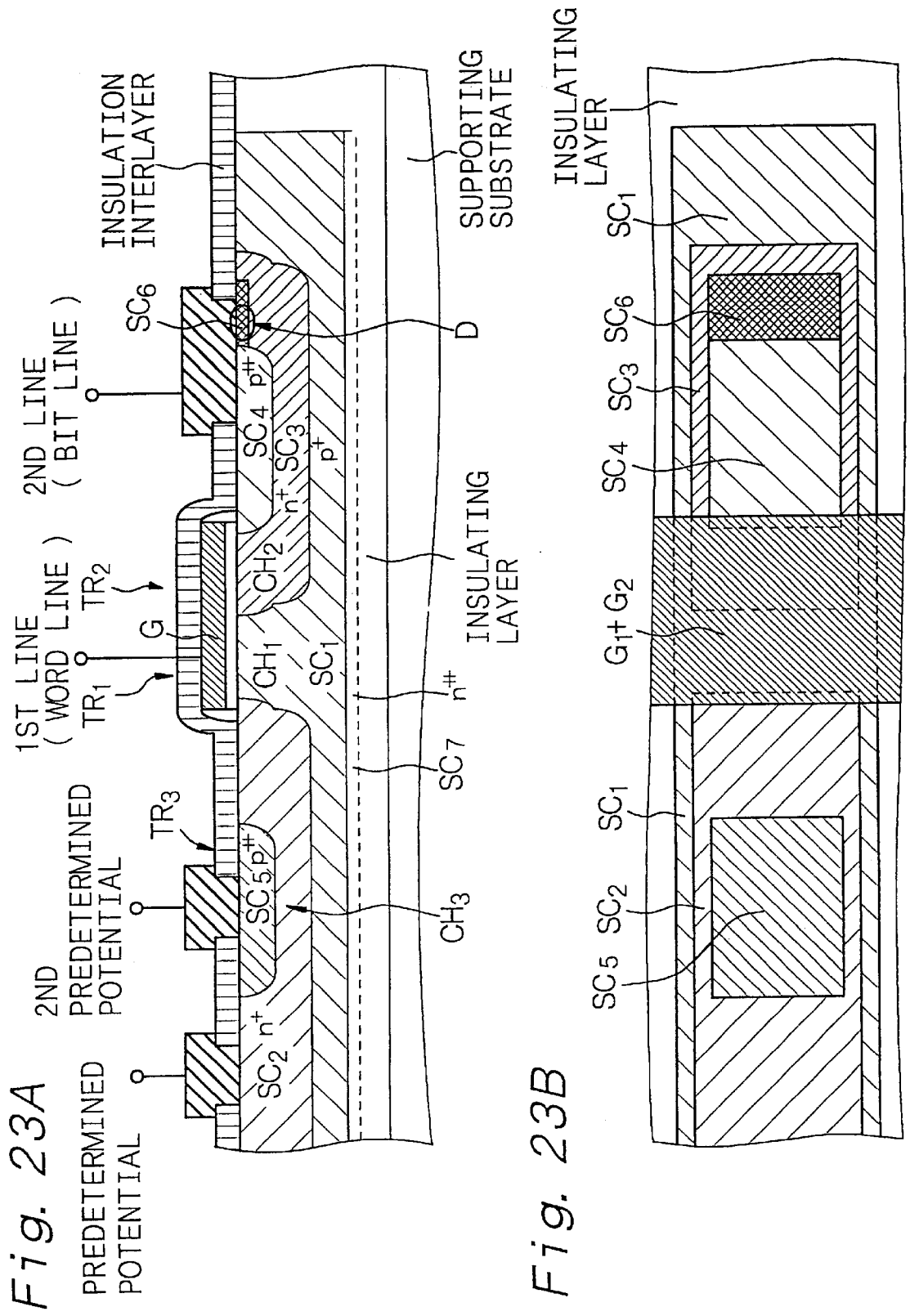
FIGS. 23A and 23B are a schematic partial cross-sectional view and a schematic layout of a variant of the semiconductor memory cell in Example 4.

A semiconductor memory cell shown in FIGS. 23A and 23B (see FIG. 21 for its principle) is a variant of the semiconductor memory cell shown in FIGS. 22A and 22B, and it has a so-called SOI structure in which it is formed on an insulator composed, e.g., of $SiO_2$. In addition, a semiconductor memory cell having a so-called TFT structure can be also obtained by forming, e.g., a polysilicon layer or an amorphous silicon layer on an insulator (insulating layer) formed on a supporting substrate and then forming the semiconductor memory cell on the polysilicon layer or the amorphous silicon layer.

Further, in a semiconductor memory cell shown in FIGS. 25 to 28 (see FIG. 24 for its principle), the fifth region $SC_5$ is connected to the first region $SC_1$, in place of being connected to the second predetermined potential. FIGS. 25A, 26A, 27A and 28A show schematic cross-sectional views. FIGS. 25B, 26B, 27B and 28B shows schematic layouts of each region and the gate region. The fifth region $SC_5$ and the first region $SC_1$ can be connected to each other, e.g., by providing a structure in which part of the first region $SC_1$ is extended up to the vicinity of the surface of the semiconductor substrate so that the fifth region $SC_5$ and the extending portion of the first region $SC_1$ come in contact with each other outside the second region $SC_2$. The wiring configuration of the semiconductor memory cell can be simplified by structuring the semiconductor memory cell as explained above.

Figure 27A:
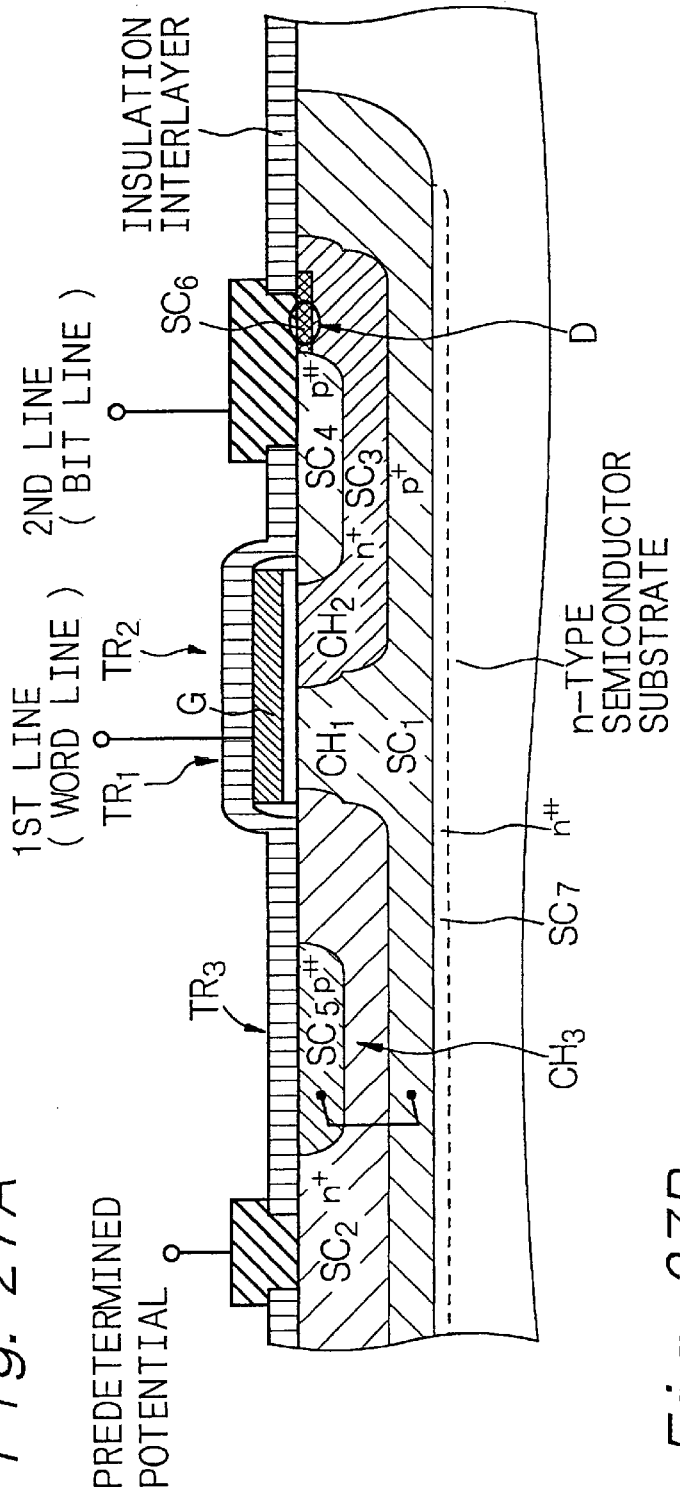
FIGS. 27A and 27B are a schematic partial cross-sectional view and a schematic layout of a variant of the semiconductor memory cell in Example 4.
Figure 27B:
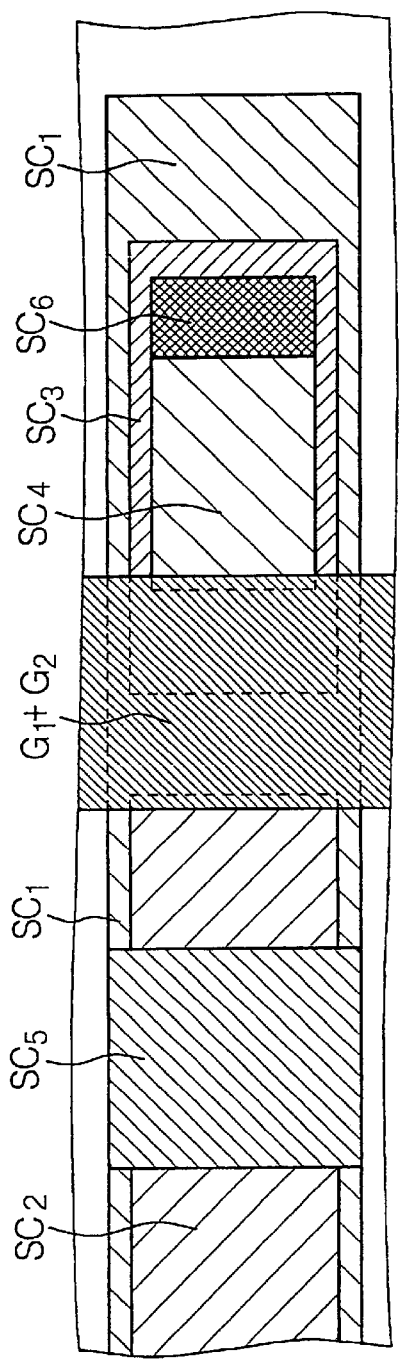

The semiconductor memory cell shown in FIGS. 25A and 25B is structurally the same as the semiconductor memory cell shown in FIGS. 19A and 19B except for the above points. Further, the semiconductor memory cell shown in FIGS. 26A and 26B is structurally the same as the semiconductor memory cell shown in FIGS. 20A and 20B except for the above points. The semiconductor memory cell shown in FIGS. 27A and 27B is structurally the same as the semiconductor memory cell shown in FIGS. 22A and 22B except for the above points. The semiconductor memory cell shown in FIGS. 28A and 28B is structurally the same as the semiconductor memory cell shown in FIGS. 23A and 23B except for the above points. Detailed explanations of structures of these semiconductors are therefore omitted.

The method of manufacturing the semiconductor memory cell of Example 4 can be substantially the same as the method of manufacturing the semiconductor memory cell of Example 3 except for the formation of the fifth region $SC_5$. Detailed explanations thereof are therefore omitted. In ion-implanting methods in a step similar to Step-330 in Example 3, each of the first region $SC_1$, the second region $SC_2$ and the fifth region $SC_5$ is formed such that the distance between the facing gate regions of the junction-field-effect transistor $TR_3$ is optimized and that the impurity concentrations of the facing gate regions and the channel region $CH_3$ of the junction-field-effect transistor $TR_3$ are optimized. Essentially, the above ion-implanting procedures may be carried out in any order.

Example 5

Example 5 is directed to the semiconductor memory cell according to the second and seventh aspects of the present invention and further to the method of the manufacture of a semiconductor memory cell according to the second aspect of the present invention. The semiconductor memory cell of Example 5 differs from the semiconductor memory cell of Example 4 in the following points. The semiconductor memory cell of Example 5 comprises a first transistor $TR_1$ of a first conductivity type for read-out, a second transistor $TR_2$ of a second conductivity type for write-in, a junction-field-effect transistor $TR_3$ of a first conductivity type for current control, and a third transistor $TR_4$ of a second conductivity type for write-in. Further, the semiconductor memory cell of Example 5 is structurally different from the semiconductor memory cell explained in Example 4 in the following points. A gate region G is shared by the first transistor $TR_1$, the second transistor $TR_2$ and the third transistor $TR_4$ and is formed on a barrier layer so as to bridge the first region $SC_1$ and the fourth region $SC_4$, so as to bridge the second region $SC_2$ and the third region $SC_3$ and so as to bridge the third region $SC_3$ and the fifth region $SC_5$. In addition, the first transistor $TR_1$, the second transistor $TR_2$ and the third transistor $TR_4$ are constituted of 1 transistor into which these transistors are merged.

Figure 29A:
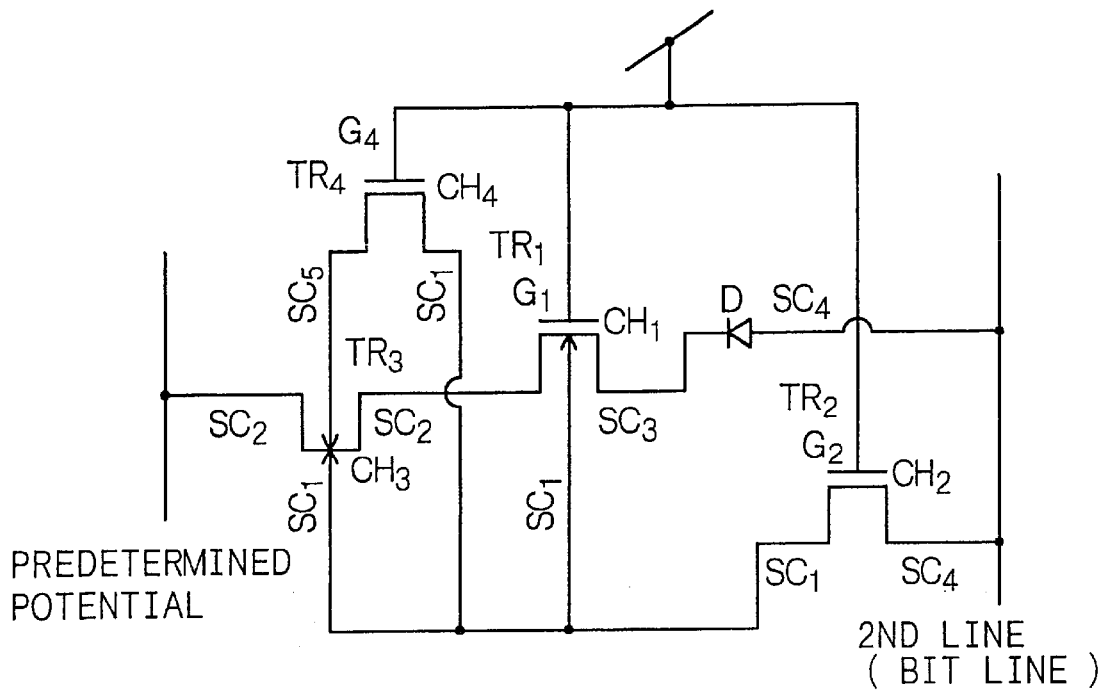
FIGS. 29A and 29B show the principles of the semiconductor memory cell according to the second and seventh aspects of the present invention.

As FIG. 29A shows a principle, as FIG. 30A shows a schematic partial cross-sectional view and as FIG. 30B shows a schematic layout, the semiconductor memory cell of Example 5 comprises a first transistor $TR_1$ of a first conductivity type (for example, n-type) for read-out, a second transistor $TR_2$ of a second conductivity type (for example, p-type) for write-in, a junction-field-effect transistor $TR_3$ of a first conductivity type (for example, n-type) for current control, and a third transistor $TR_4$ of a second conductivity type (for example, p-type) for write-in. And, the semiconductor memory cell has;

(a) a first semi-conductive region $SC_1$ having a second conductivity type, for example, p-type, (b) a second semi-conductive region $SC_2$ formed in a surface region of the first region $SC_1$, said second region $SC_2$ having a first conductivity type, for example, $n^+$-type, (c) a third semi-conductive region $SC_3$ formed in a surface region of the first region $SC_1$ and spaced from the second region $SC_2$, said third region $SC_3$ having the first conductivity type, for example, n-type, (d) a fourth semi-conductive region $SC_4$ having the second conductivity type, for example, $p^{++}$-type, or a fourth conductive region $SC_4$ formed of a silicide, a metal or a metal compound, which is formed in a surface region of the third region $SC_3$ and forms a rectifier junction together with the third region $SC_3$, (e) a fifth semi-conductive region $SC_5$ having the second conductivity type, for example, $p^{++}$-type, or a fifth conductive region $SC_5$ formed of a silicide, a metal or a metal compound, which is formed in a surface region of the second region $SC_2$ and forms a rectifier junction together with the second region $SC_2$, and (f) a gate region G shared by the first transistor $TR_1$, the second transistor $TR_2$ and the third transistor $TR_4$ and formed on a barrier layer so as to bridge the first region $SC_1$ and the fourth region $SC_4$, so as to bridge the second region $SC_2$ and the third region $SC_3$ and so as to bridge the third region $SC_3$ and the fifth region $SC_5$.

Concerning the first transistor $TR_1$;

(A-1) source/drain regions are constituted of the second region $SC_2$ (more specifically, a surface region of the second region $SC_2$ sandwiched by the first region $SC_1$ and the fifth region $SC_5$) and a surface region of the third region $SC_3$ which surface region is sandwiched by the first region $SC_1$ and the fourth region $SC_4$, and (A-2) a channel forming region $CH_1$ is constituted of a surface region of the first region $SC_1$ sandwiched by the second region $SC_2$ and the third region $SC_3$.

Concerning the second transistor $TR_2$;

(B-1) source/drain regions are constituted of the first region $SC_1$ (more specifically, a surface region of the first region $SC_1$ sandwiched by the second region $SC_2$ and the third region $SC_3$) and the fourth region $SC_4$, and (B-2) a channel forming region $CH_2$ is constituted of a surface region of the third region $SC_3$ which surface region corresponds to (or functions as) one source/drain region of the first transistor $TR_1$ and is sandwiched by the first region $SC_1$ and the fourth region $SC_4$.

Further, concerning the junction-field-effect transistor $TR_3$;

(C-1) gate regions are constituted of the fifth region $SC_5$ and a portion of the first region $SC_1$ facing the fifth region $SC_5$, (C-2) a channel region $CH_3$ is constituted of part of the second region $SC_2$ sandwiched by the fifth region $SC_5$ and said portion of the first region $SC_1$, (C-3) one source/drain region is constituted of the second region $SC_2$ which extends from one end of the channel region $CH_3$ of the junction-field-effect transistor $TR_3$ and corresponds to (or functions as) one source/drain region of the first transistor $TR_1$, and (C-4) the other source/drain region is constituted of the second region $SC_2$ extending from the other end of the channel region $CH_3$ of the junction-field-effect transistor $TR_3$.

Concerning the third transistor $TR_4$;

(D-1) one source/drain region is constituted of the surface region of the first region $SC_1$ corresponding to (or functioning as) the channel forming region $CH_1$ of the first transistor $TR_1$, (D-2) the other source/drain region is constituted of the fifth region $SC_5$, and (D-3) a channel forming region $CH_4$ is constituted of the second region $SC_2$ corresponding to (or functioning as) one source/drain region of the first transistor $TR_1$.

And, the gate region G is connected to a first memory-cell-selecting line, for example, a word line, the second region $SC_2$ is connected to a predetermined potential, and the fourth region $SC_4$ is connected to a second memory-cell-selecting line, for example, a bit line.

The semiconductor memory cell of Example 5, more specifically, the first region $SC_1$ is formed in a well of the second conductivity type, for example, p-type, formed in a semiconductor substrate.

The junction-field-effect transistor $TR_3$ is formed by (1) optimizing the distance between the facing gate regions of the junction-field-effect transistor $TR_3$, that is, the thickness of the channel region $CH_3$, and (2) optimizing impurity concentrations of the facing gate regions and the channel region $CH_3$ of the junction-field-effect transistor $TR_3$.

When a region $SC_7$ containing a high concentration of an impurity having the first conductivity type is preferably formed under the first region $SC_1$, a potential or an electric charge stored in the channel forming region $CH_1$ of the first transistor $TR_1$ can be increased.

Figure 31A:
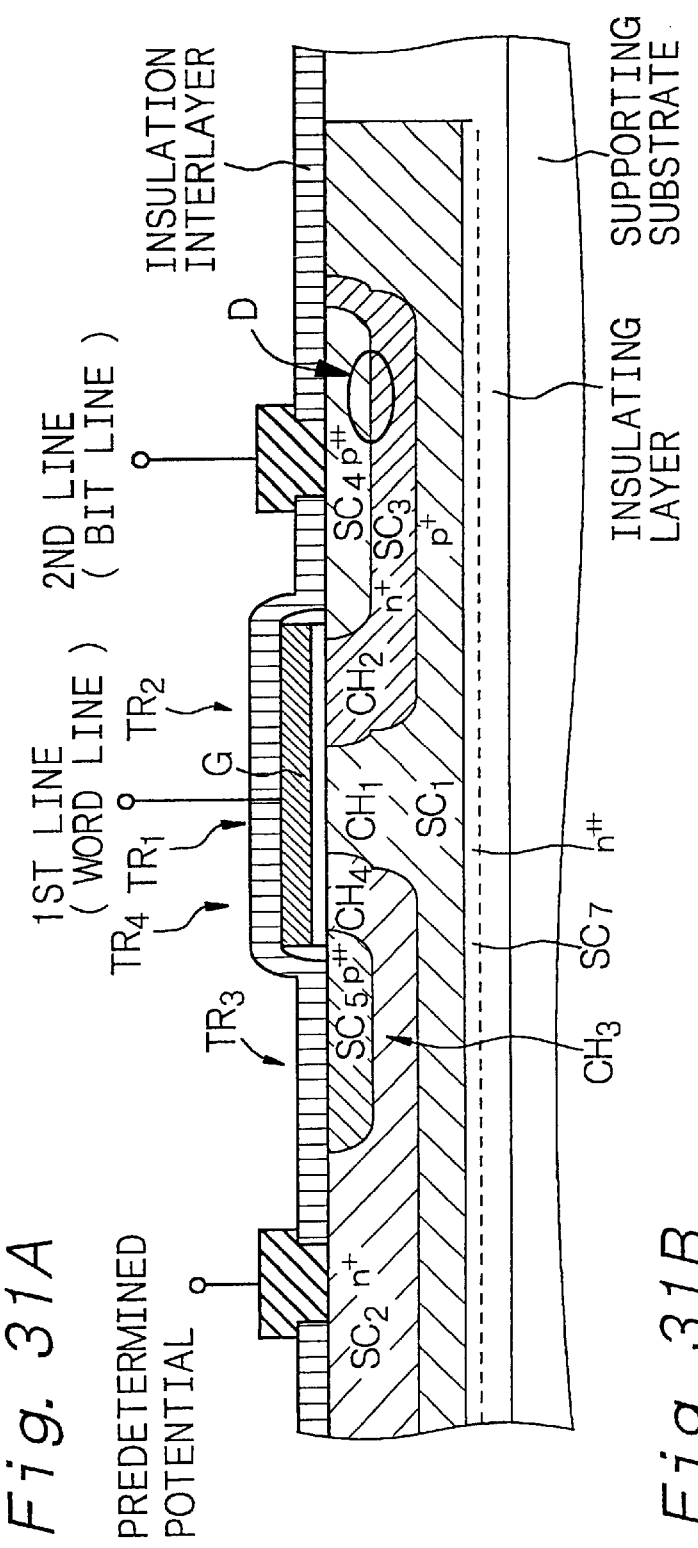
FIGS. 31A and 31B are a schematic partial cross-sectional view and a schematic layout of a variant of the semiconductor memory cell in Example 5.
Figure 31B:
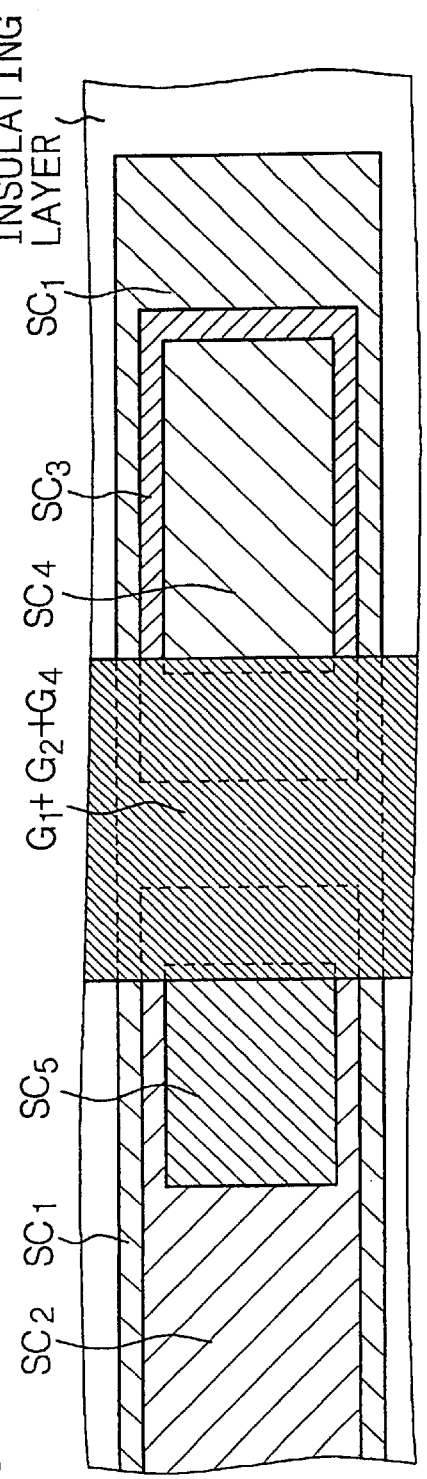

A semiconductor memory cell shown in FIGS. 31A and 31B (see FIG. 29A for its principle) is a variant of the semiconductor memory cell shown in FIGS. 30A and 30B, and it has a so-called SOI structure in which it is formed on an insulator composed, e.g., of $SiO_2$. In addition, a semiconductor memory cell having a so-called TFT structure can be also obtained by depositing, e.g., a polysilicon layer or an amorphous silicon layer on an insulator (insulating layer) formed on a supporting substrate and then forming the semiconductor memory cell on the polysilicon layer or the amorphous silicon layer.

Figure 29B:
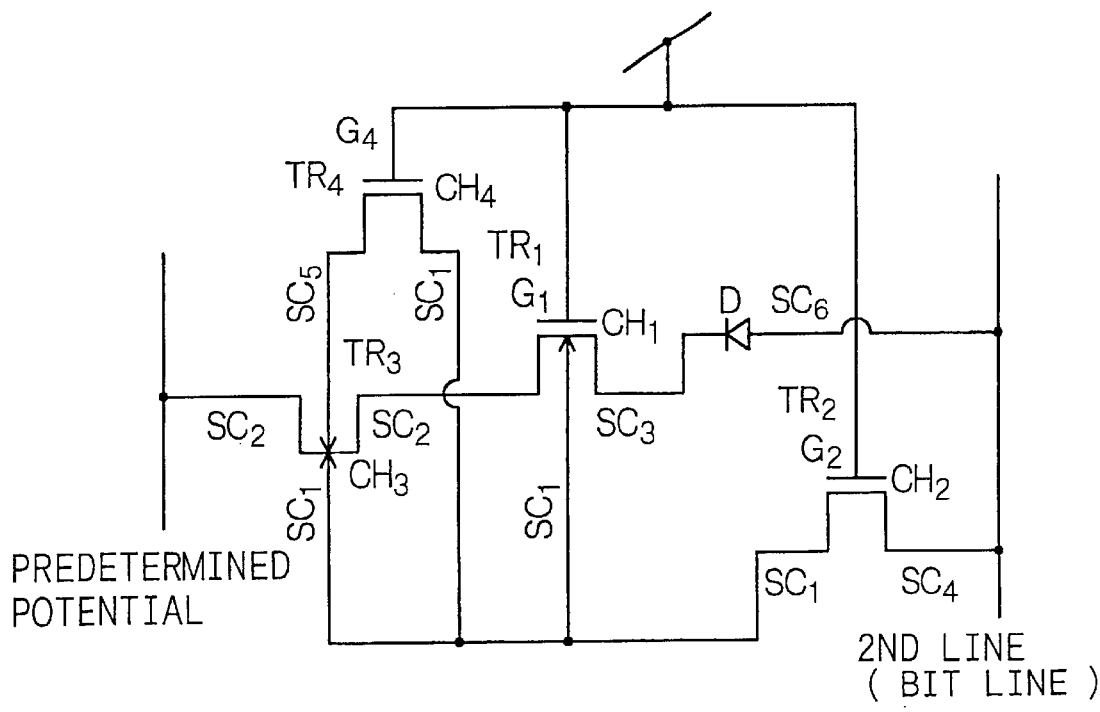

A semiconductor memory cell of Example 5 shown in FIGS. 32A and 32B and FIGS. 33A and 33B (see FIG. 29B for their principle) has a sixth conductive region $SC_6$ which is formed in a surface region of the third region $SC_3$ and forms a rectifier junction together with the third region $SC_3$. A diode D of Schottky junction type is formed of the sixth region $SC_6$ and the third region $SC_3$, and the third region $SC_3$ corresponding to (or functioning as) the other source/ drain region of the first transistor $TR_1$ is connected to the second memory-cell-selecting line, for example, the bit line, through the diode D. In the above structure, preferably, the fourth region $SC_4$ is a semi-conductive region.

The semiconductor memory cell shown in FIGS. 32A and 32B is structurally the same as the semiconductor shown in FIGS. 30A and 30B except for the above points. The semiconductor memory cell shown in FIGS. 33A and 33B is structurally the same as the semiconductor shown in FIGS. 31A and 31B except for the above points. Detailed explanations of structures of these semiconductor memory cells are therefore omitted.

In the semiconductor memory cell of Example 5, the potential in the third region $SC_3$ and the potential in the fifth region $SC_5$ are approximately equal to each other when the third transistor $TR_4$ is brought into an on-state, and the operation of the junction-field-effect transistor $TR_3$ is reliably controlled by the operation of the third transistor $TR_4$.

The semiconductor memory cell of Example 5 can be produced by carrying out steps similar to Step-300 to Step-330 for the production of the semiconductor memory cell of Example 3 (oblique ion-implanting is carried out for forming a channel forming region $CH_1$ and a channel forming region $CH_2$) and then forming a fifth region $SC_5$ in a surface region of the second region $SC_2$ by an ion-implanting method. Otherwise, the semiconductor memory cell can be also produced by the steps of forming a gate region G similar to that shown in FIGS. 37A and 37B, forming a fourth region $SC_4$, then further forming a gate region so as to cover a portion of the second region $SC_2$ adjacent to the surface region of the first region $SC_1$, and forming a fifth region $SC_5$. In ion-implanting methods in a step similar to Step-330 in Example 3, each of the first region $SC_1$, the second region $SC_2$ and the fifth region $SC_5$ is formed such that the distance between the facing gate regions of the junction-field-effect transistor $TR_3$ is optimized and that the impurity concentrations of the facing gate regions and the channel region $CH_3$ of the junction-field-effect transistor $TR_3$ are optimized. Essentially, the above ion-implanting procedures may be carried out in any order.

Example 6

Example 6 is directed to the semiconductor memory cell according to the second and eighth aspects of the present invention. The principle of the semiconductor memory cell in Example 6 is the same as that of the semiconductor memory cell in Example 4 of which the principle is shown in FIG. 10, while the constitution of each region in the semiconductor memory cell of Example 6 differs as shown in its schematic partial cross-sectional view of FIG. 38. However, the semiconductor memory cell of Example 6 is the same in that it is constituted of the first transistor and the second transistor merged into one unit.

The semiconductor memory cell of Example 6 comprises a first transistor $TR_1$ of a first conductivity type (for example, n-type) for read-out, a second transistor $TR_2$ of a second conductivity type (for example, p-type) for write-in, and a junction-field-effect transistor $TR_3$ of a first conductivity type (for example, n-type) for current control. And the semiconductor memory cell has;

(a) a third semi-conductive region $SC_3$ having a first conductivity type, for example, n-type, (b) a fourth semi-conductive region $SC_4$ having a second conductivity type, for example, $p^+$-type, or a fourth conductive region $SC_4$ formed of a silicide, a metal or a metal compound, which is formed in a surface region of the third region $SC_3$ and forms a rectifier junction together with the third region $SC_3$, (c) a first semi-conductive region $SC_1$ formed in a surface region of the third region $SC_3$ and spaced from the fourth region $SC_4$, said first region $SC_1$ having the second conductivity type, for example, $p^+$-type, (d) a second semi-conductive region $SC_2$ formed in a surface region of the first region $SC_1$, said second region $SC_2$ having the first conductivity type, for example, $n^+$-type, (e) a fifth semi-conductive region $SC_5$ having the second conductivity type, for example, $p^+$-type, or a fifth conductive region $SC_5$ formed of a silicide, a metal or a metal compound, which is formed in a surface region of the second region $SC_2$ and forms a rectifier junction together with the second region $SC_2$, and (f) a gate region G shared by the first transistor $TR_1$ and the second transistor $TR_2$ and formed on a barrier layer so as to bridge the second region $SC_2$ and the third region $SC_3$ and so as to bridge the first region $SC_1$ and the fourth region $SC_4$.

Concerning the first transistor $TR_1$;

(A-1) source/drain regions are constituted of the second region $SC_2$ and the third region $SC_3$, and (A-2) a channel forming region $CH_1$ is constituted of a surface region of the first region $SC_1$ sandwiched by the second region $SC_2$ and the third region $SC_3$.

Concerning the second transistor $TR_2$;

(B-1) source/drain regions are constituted of the first region $SC_1$ and the fourth region $SC_4$, and (B-2) a channel forming region $CH_2$ is constituted of a surface region of the third region $SC_3$ sandwiched by the first region $SC_1$ and the fourth region $SC_4$.

Further, concerning the junction-field-effect transistor $TR_3$;

(C-1) gate regions are constituted of the fifth region $SC_5$ and a portion of the first region $SC_1$ facing the fifth region $SC_5$, (C-2) a channel region $CH_3$ is constituted of part of the second region $SC_2$ sandwiched by the fifth region $SC_5$ and said portion of the first region $SC_1$, and (C-3) source/drain regions are constituted of the second region $SC_2$ extending from both ends of the channel region $CH_3$ of the junction-field-effect transistor $TR_3$.

And, the gate region G is connected to a first memory-cell-selecting line, for example, a word line, the second region $SC_2$ is connected to a predetermined potential, the fourth region $SC_4$ is connected to a second memory-cell-selecting line, for example, a bit line, and the fifth region $SC_5$ is connected to a second predetermined potential.

Figure 38:
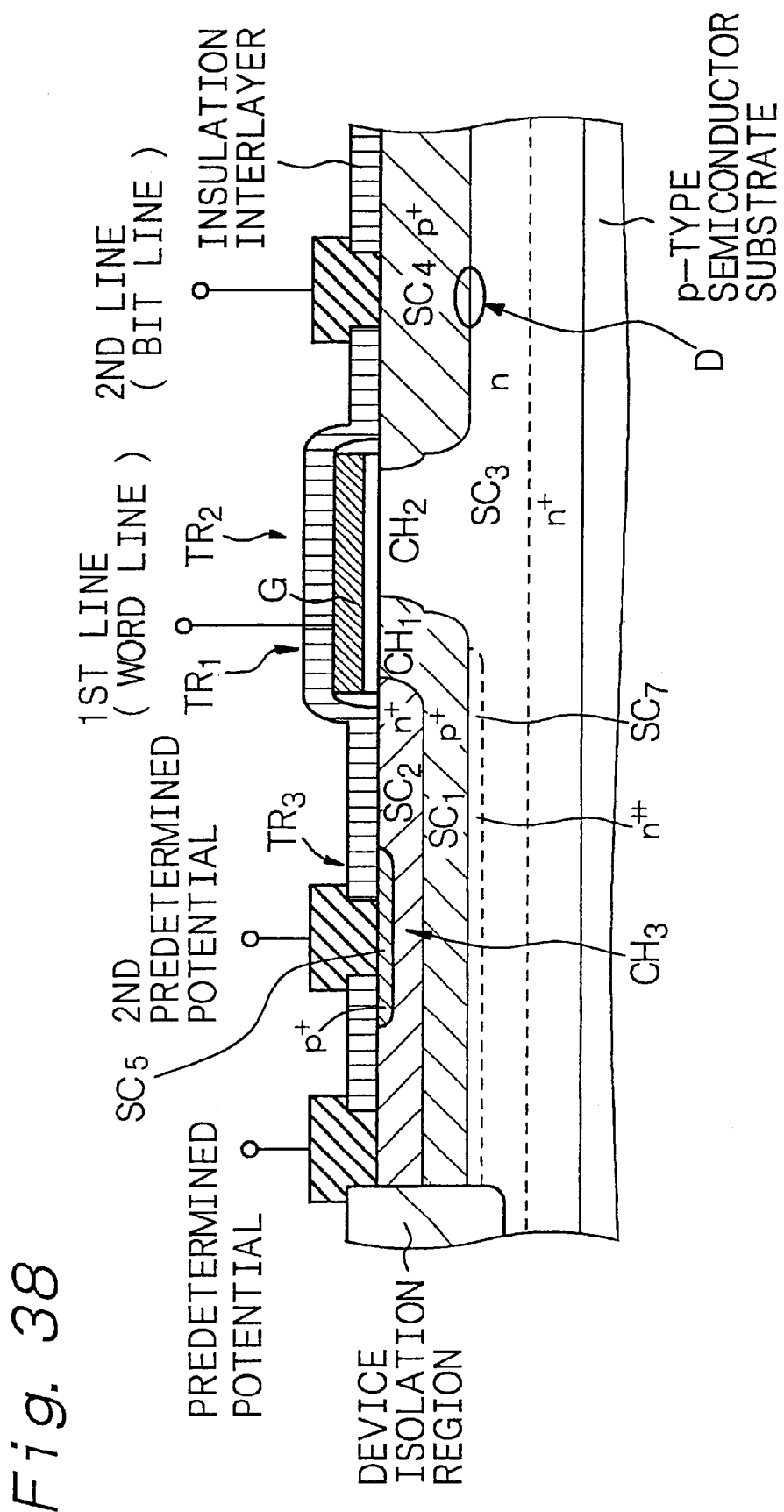
FIG. 38 is a schematic partial cross-sectional view of a semiconductor memory cell in Example 6.

The semiconductor memory cell of Example 6 shown in FIG. 38, more specifically, the third region $SC_3$ is formed in a well of the first conductivity type, for example, n-type, formed in a semiconductor substrate.

The junction-field-effect transistor $TR_3$ is formed by (1) optimizing the distance between the facing gate regions of the junction-field-effect transistor $TR_3$, that is, the thickness of the channel region $CH_3$, and (2) optimizing impurity concentrations of the facing gate regions and the channel region $CH_3$ of the junction-field-effect transistor $TR_3$. Further, when a region $SC_7$ containing a high concentration of an impurity having the first conductivity type is preferably formed under the first region $SC_1$, a potential or an electric charge stored in the channel forming region $CH_1$ of the first transistor $TR_1$ can be increased.

Figure 39:
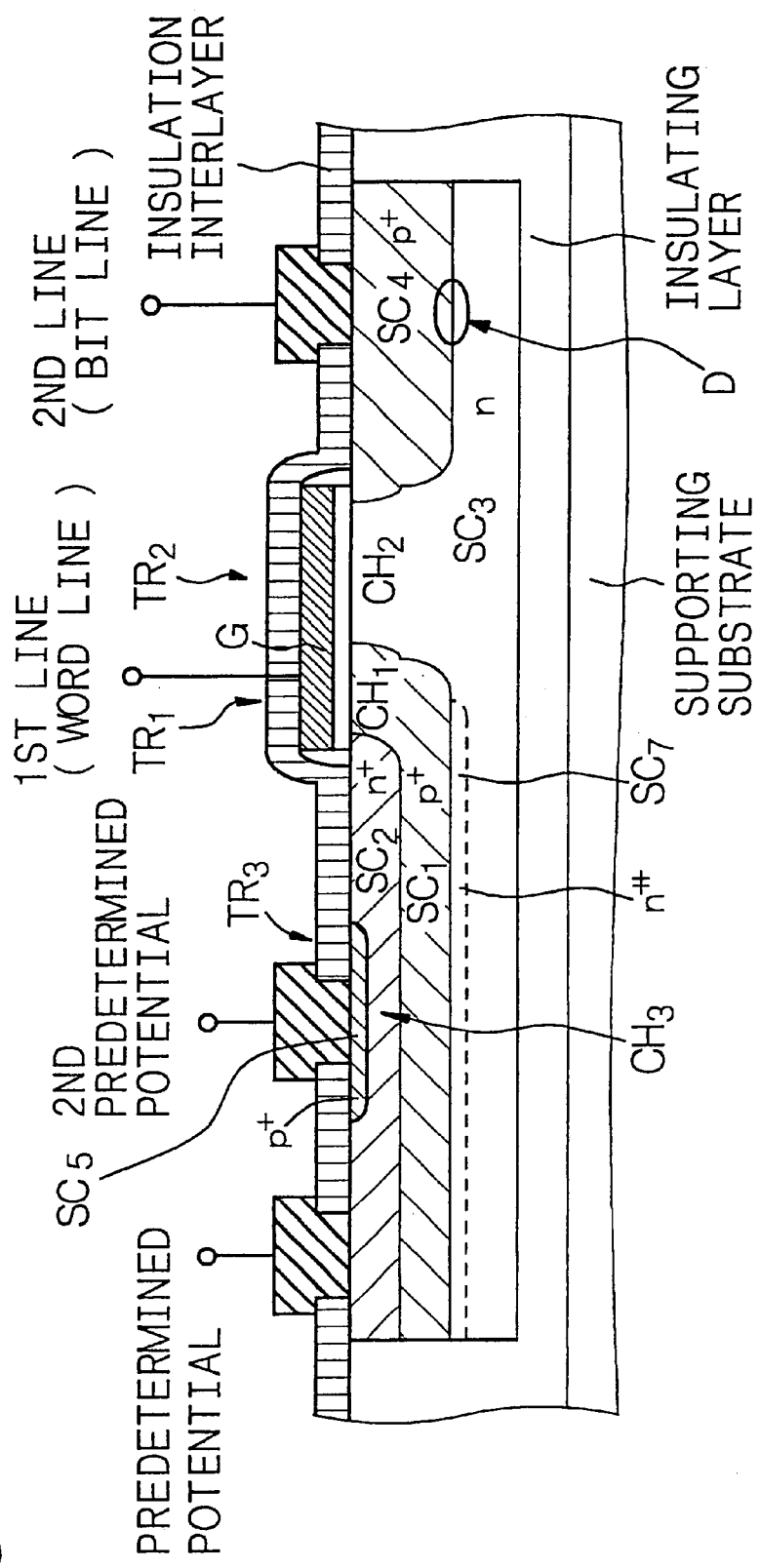
FIG. 39 is a schematic partial cross-sectional view of a variant of the semiconductor memory cell in Example 6.
Figure 40:
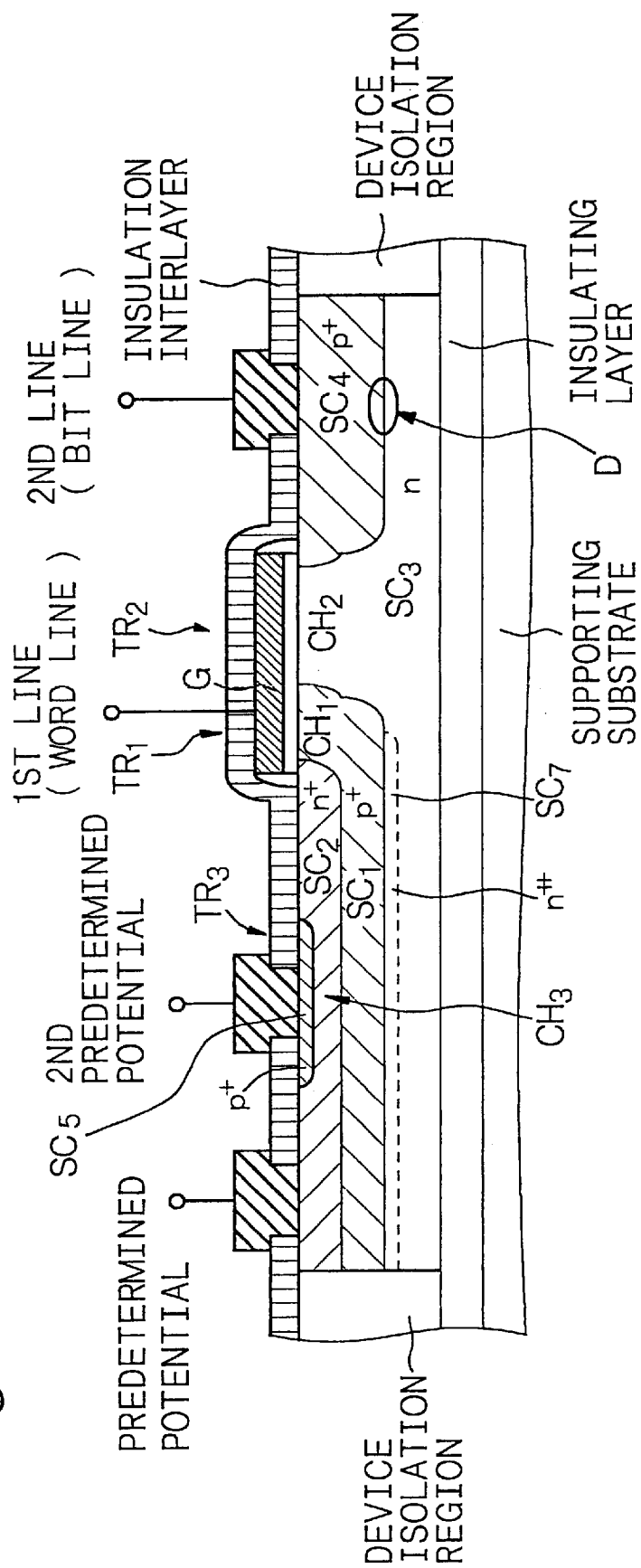
FIG. 40 is a schematic partial cross-sectional view of a variant of the semiconductor memory cell in Example 6.

A semiconductor memory cell shown in FIG. 39 (see FIG. 10 for its principle) is a variant of the semiconductor memory cell shown in FIG. 38, and it has a so-called SOI structure in which it is formed on an insulator composed, e.g., of $SiO_2$. In addition, a semiconductor memory cell shown in FIG. 40 (see FIG. 10 for its principle) is a semiconductor memory cell having a so-called TFT structure, which is obtained by depositing, e.g., a polysilicon layer or an amorphous silicon layer on an insulator (insulating layer) formed on a supporting substrate and then forming the semiconductor memory cell on the polysilicon layer or the amorphous silicon layer.

Figure 13:
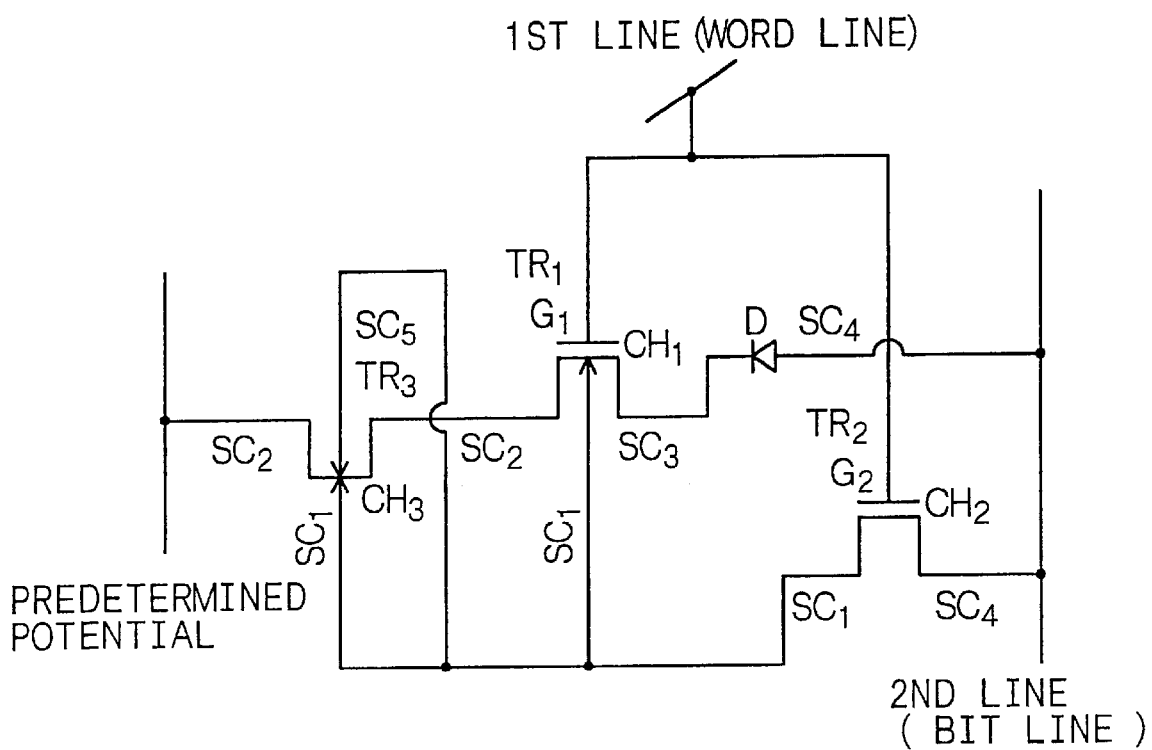
FIG. 13 shows another principle different from that in FIG. 10 with regard to the semiconductor memory cell according to the second and fourth aspects of the present invention.
Figure 41:
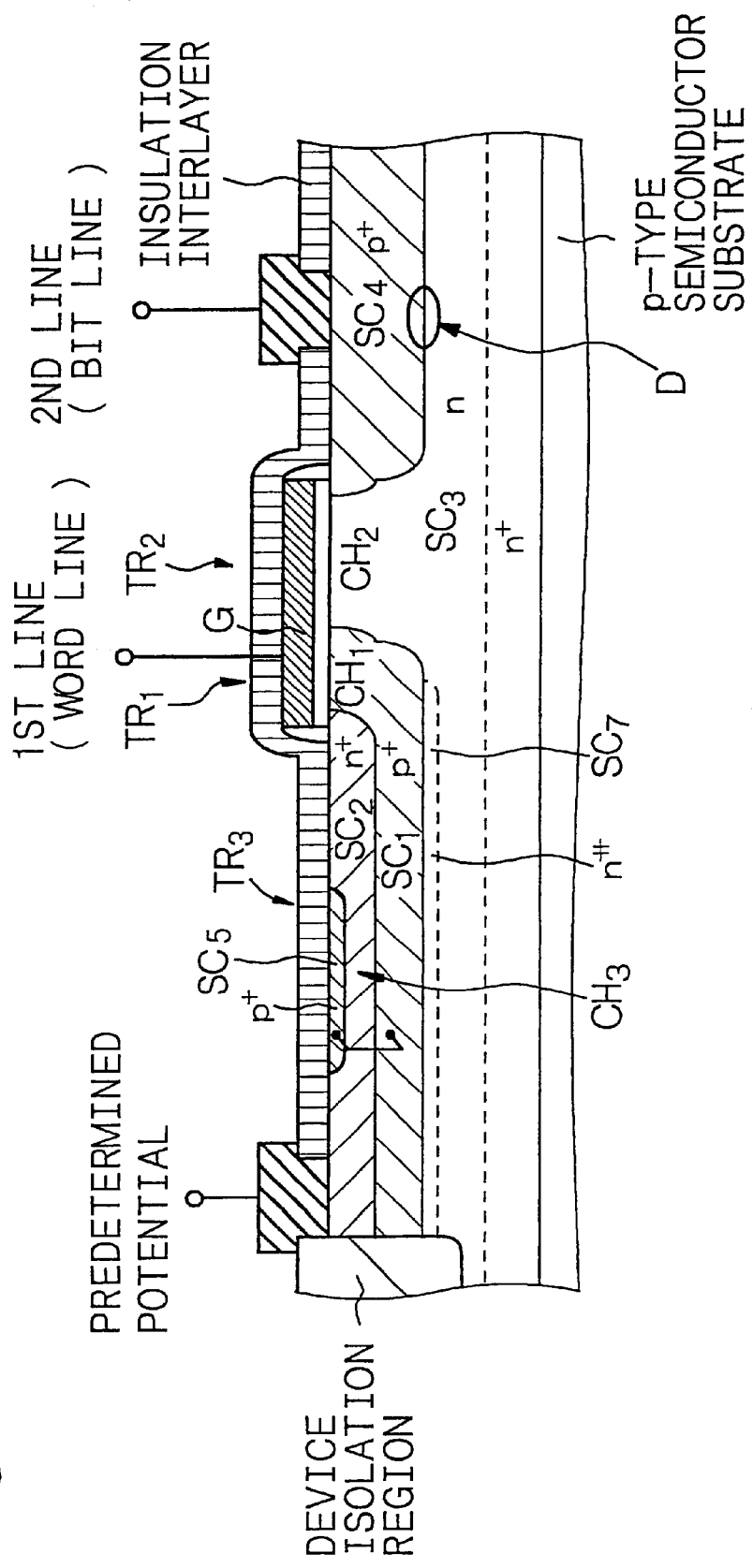
FIG. 41 is a schematic partial cross-sectional view of a variant of the semiconductor memory cell in Example 6.
Figure 42:
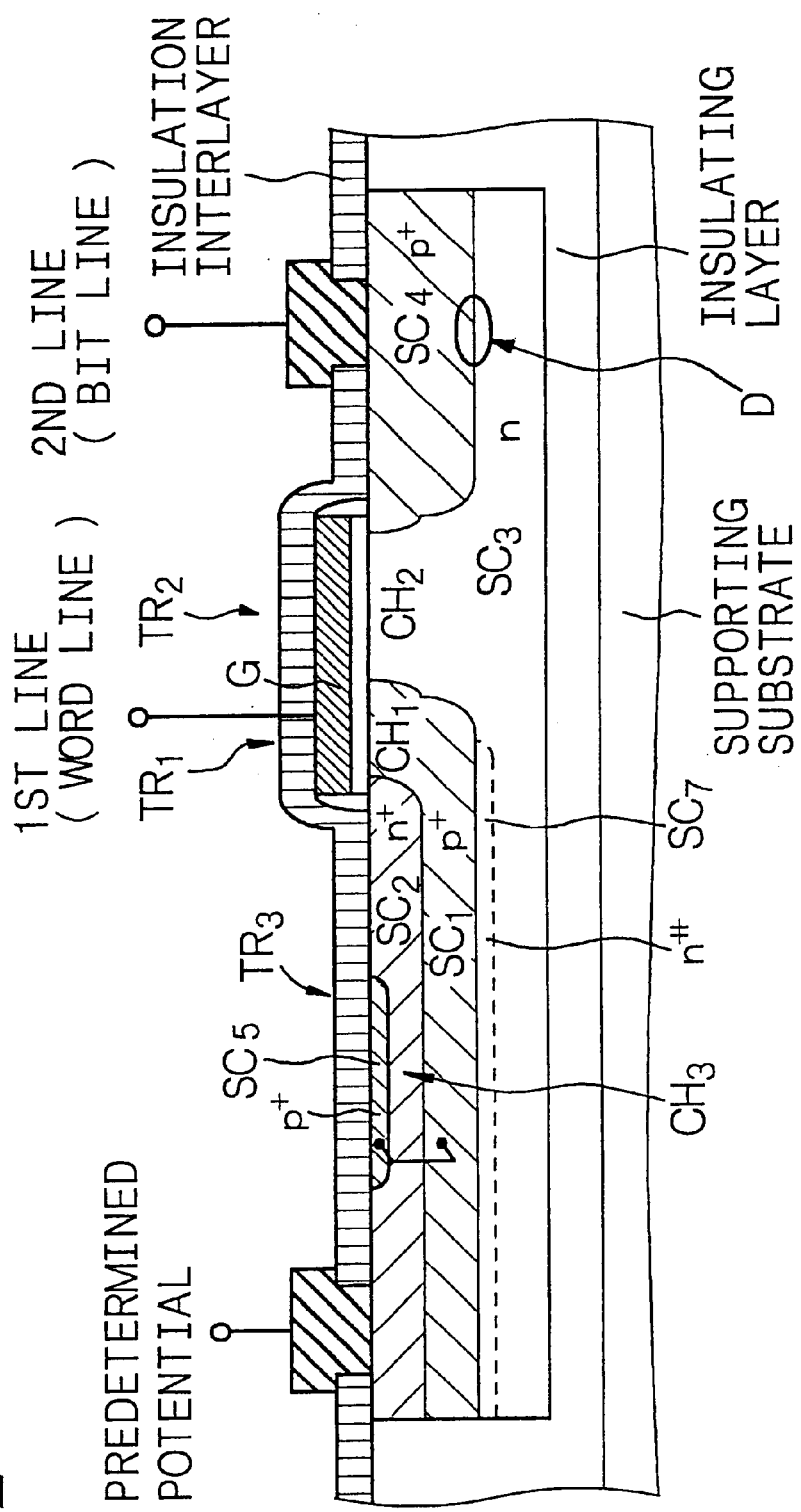
FIG. 42 is a schematic partial cross-sectional view of a variant of the semiconductor memory cell in Example 6.
Figure 43:
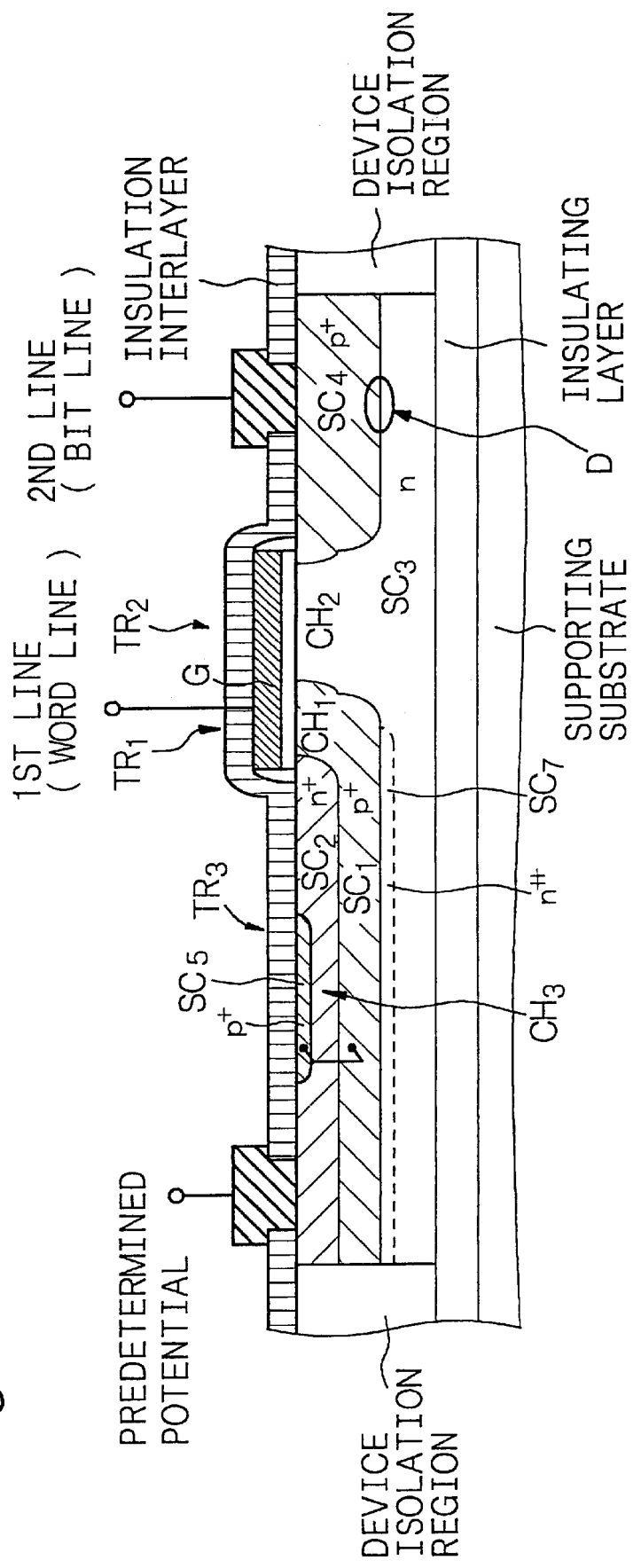
FIG. 43 is a schematic partial cross-sectional view of a variant of the semiconductor memory cell in Example 6.

In the semiconductor memory cell of Example 6, as FIG. 13 shows its principle and as FIGS. 41, 42 and 43 show schematic partial cross-sectional views, the fifth region $SC_5$ may be connected to the first region $SC_1$, in place of being connected to the second predetermined potential, a junction portion of the third region $SC_3$ and the fourth region $SC_4$ forms a diode D, and one source/drain region of the first transistor $TR_1$ is connected to the second memory-cell-selecting line through the diode D. The method explained in Example 2 can be employed for the above connections.

Figure 24:
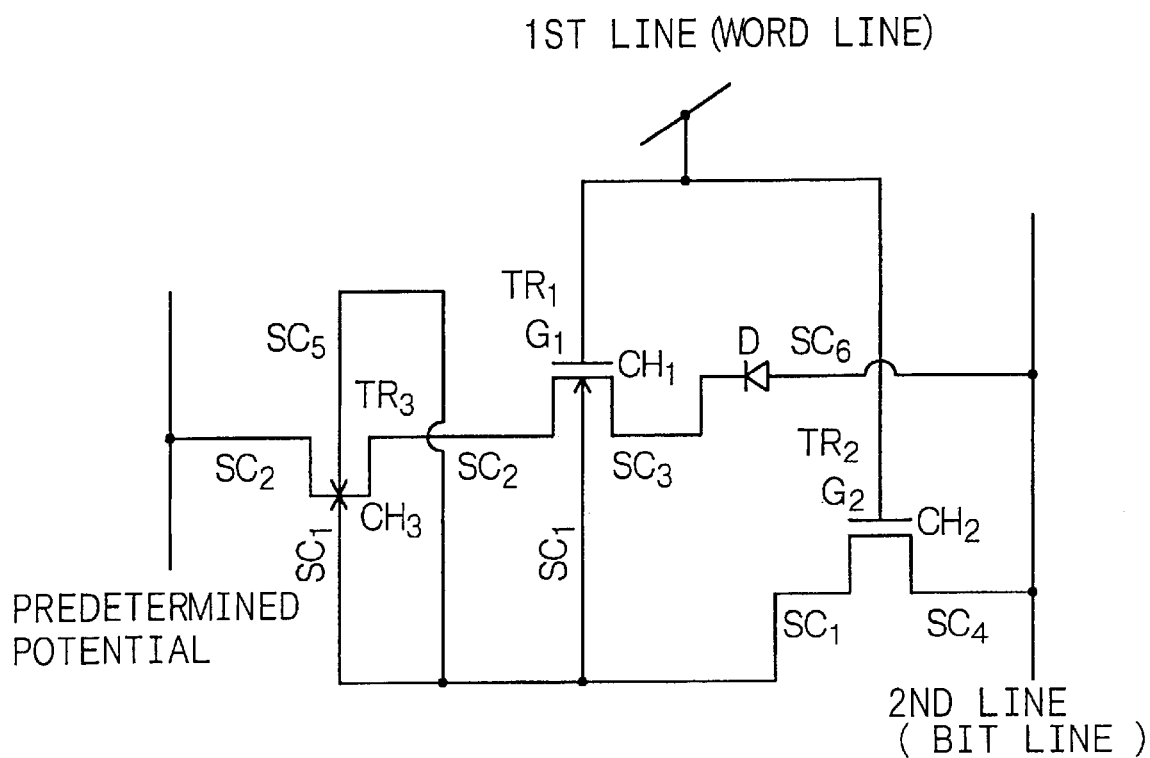
FIG. 24 shows another principle of the semiconductor memory cell according to the second and sixth aspects of the present invention.
Figure 44:
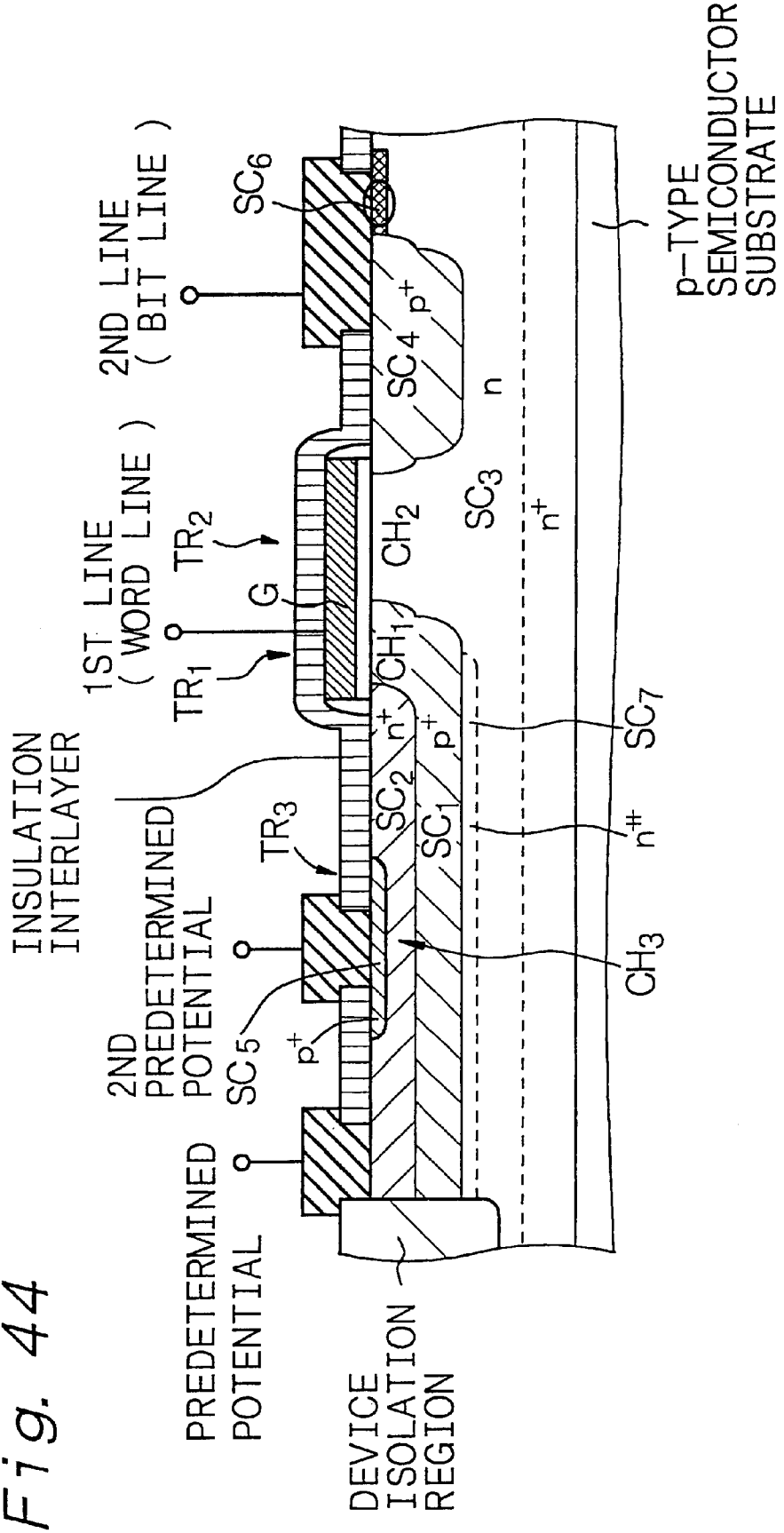
FIG. 44 is a schematic partial cross-sectional view of a variant of the semiconductor memory cell in Example 6.
Figure 45:
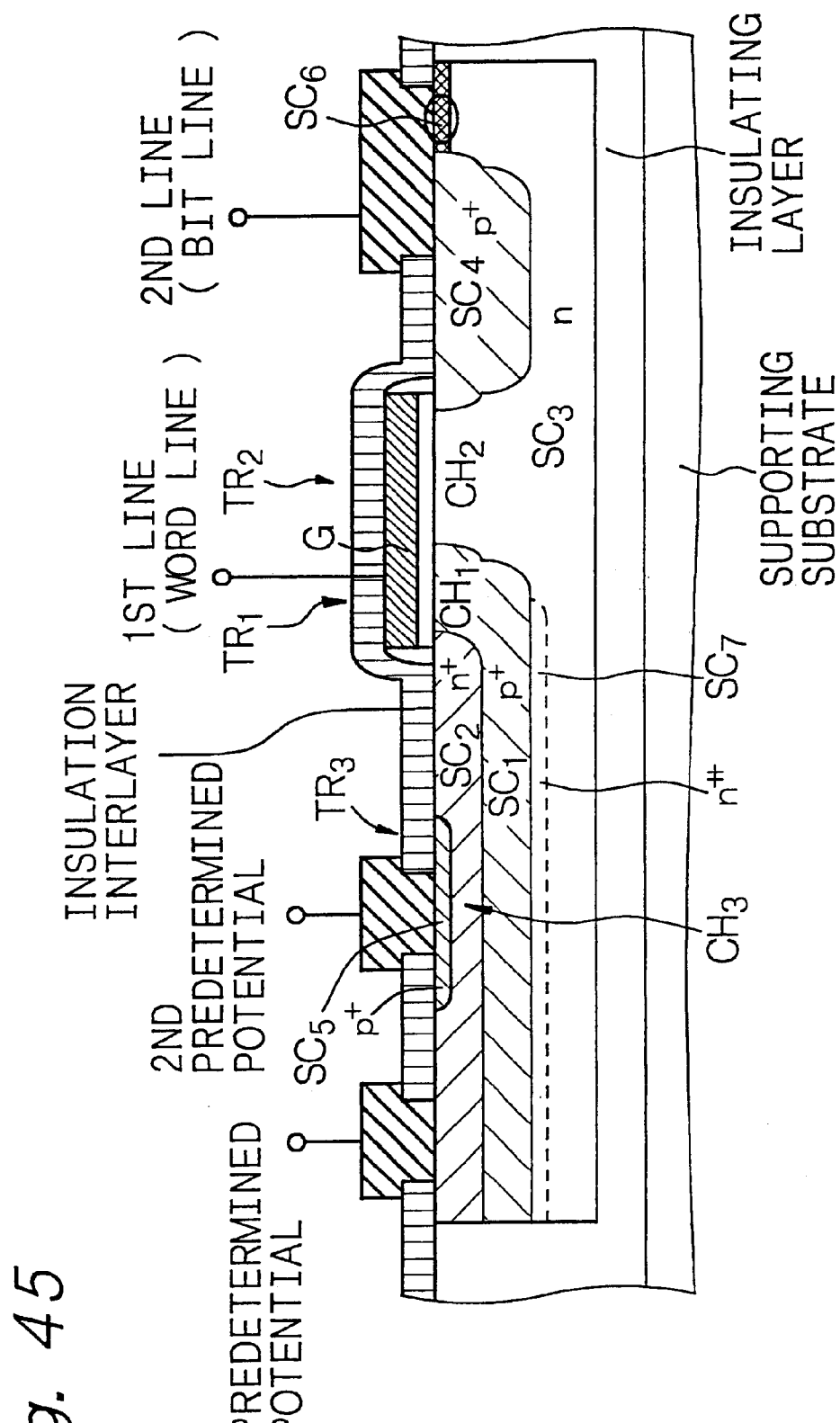
FIG. 45 is a schematic partial cross-sectional view of a variant of the semiconductor memory cell in Example 6.
Figure 46:
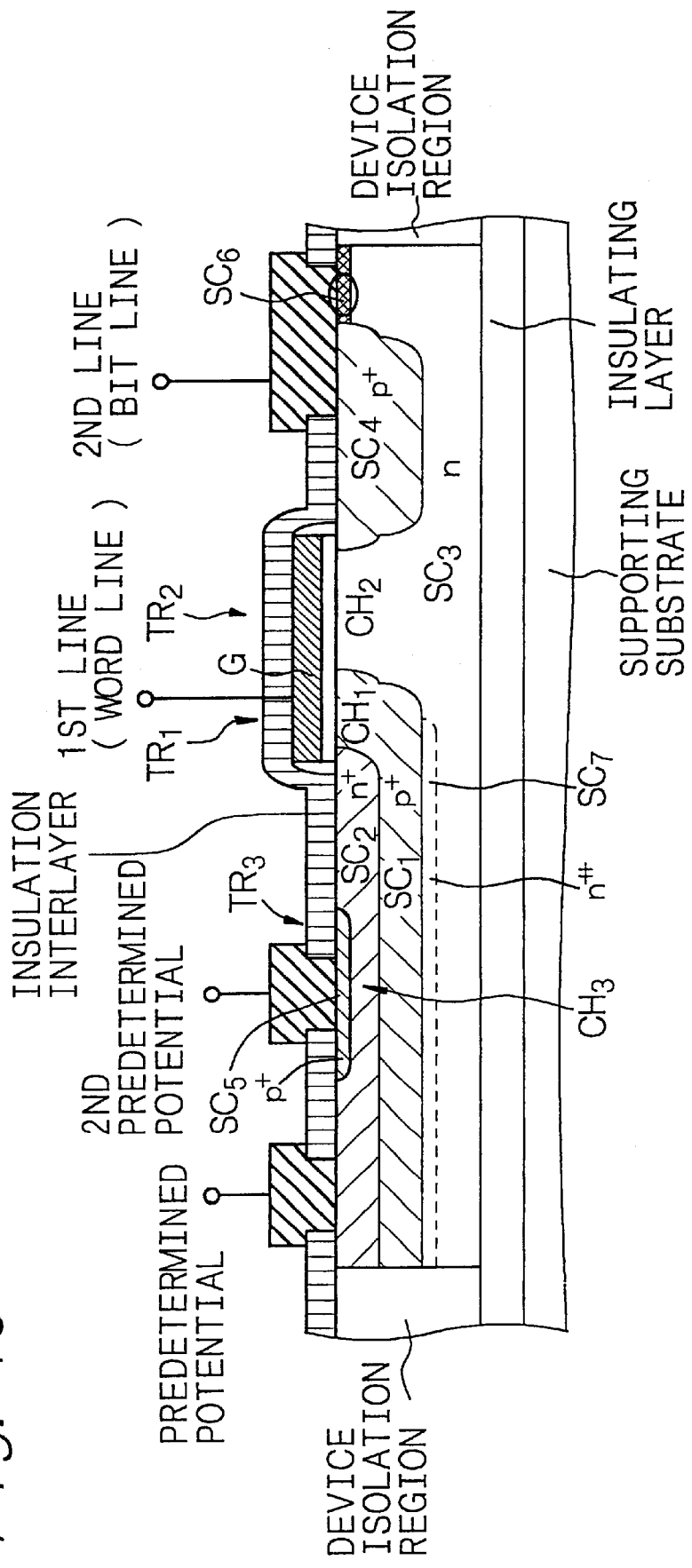
FIG. 46 is a schematic partial cross-sectional view of a variant of the semiconductor memory cell in Example 6.
Figure 48:
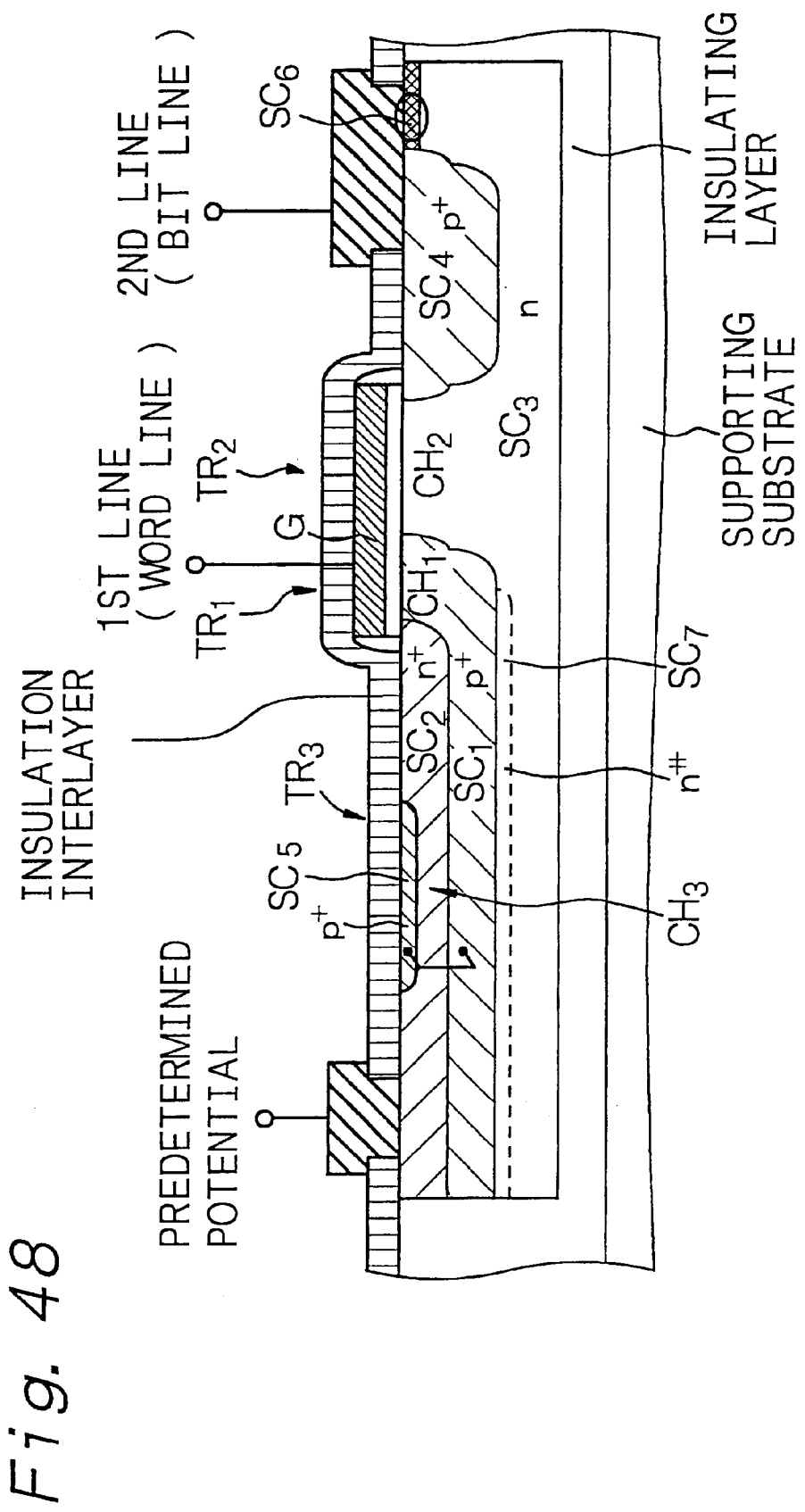
FIG. 48 is a schematic partial cross-sectional view of a variant of the semiconductor memory cell in Example 6.
Figure 49:
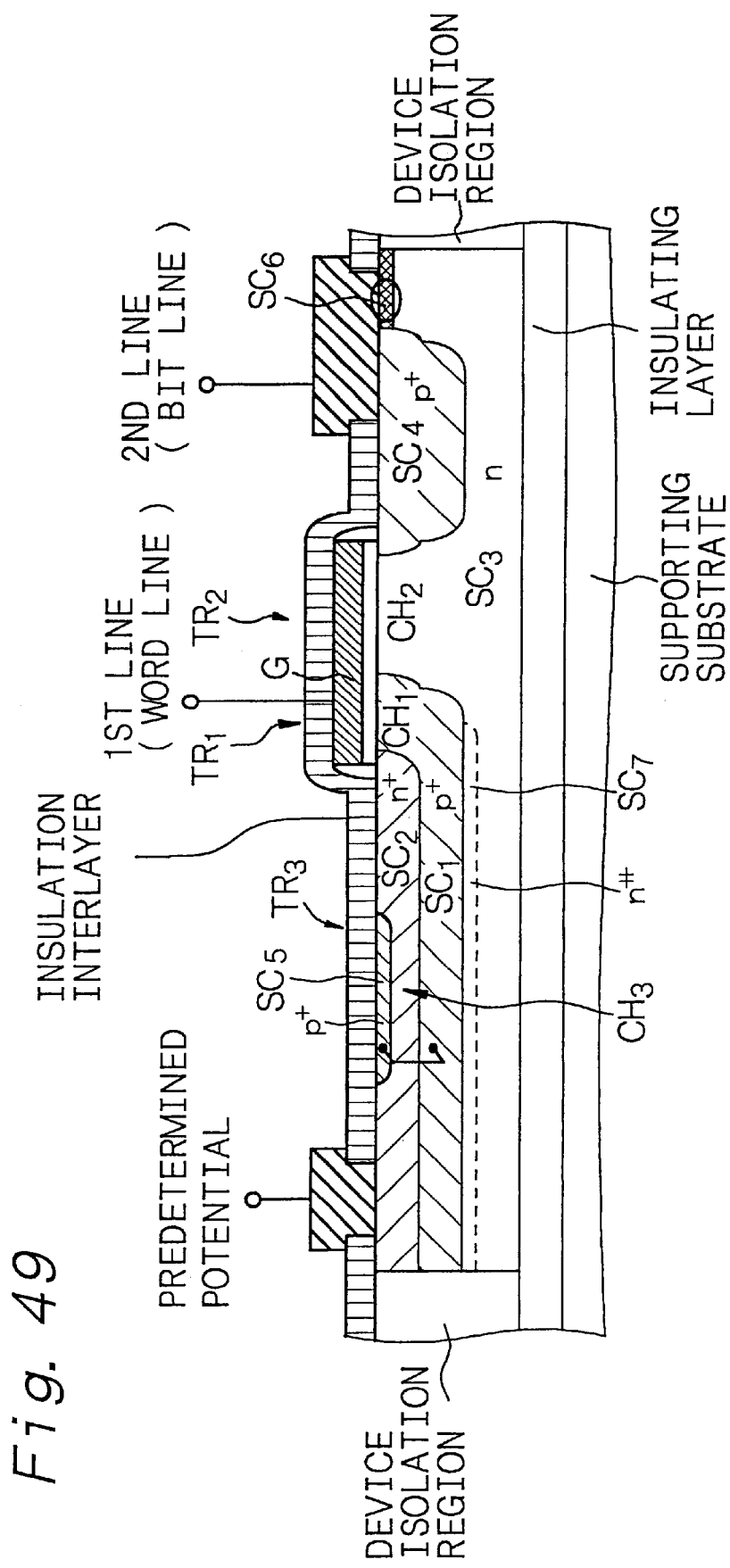
FIG. 49 is a schematic partial cross-sectional view of a variant of the semiconductor memory cell in Example 6.

Otherwise, as FIG. 21 shows a principle and FIGS. 44, 45 and 46 show schematic partial cross-sectional views, the semiconductor memory cell may be a semiconductor memory cell in which it have a sixth conductive region $SC_6$ which is formed in a surface region of the third region $SC_3$ and forms a rectifier junction together with the third region $SC_3$. A diode D is formed of the sixth region $SC_6$ and the third region $SC_3$, and the third region $SC_3$ corresponding to (or functioning as) the other source/drain region of the first transistor $TR_1$ is connected to the second memory-cell-selecting line through the diode D. Preferably, a silicide, a metal or a metal compound is used to constitute the sixth region $SC_6$, and the junction between the sixth region $SC_6$ and third region $SC_3$ is formed as a junction in which a larger number of carriers mainly constitute a forward current like a Schottky junction. Further, as FIG. 24 shows a principle and as FIGS. 47, 48 and 49 show schematic partial cross-sectional views, the fifth region $SC_5$ may be connected to the first region $SC_1$, in pace of being connected to the second predetermined potential.

Figure 47:
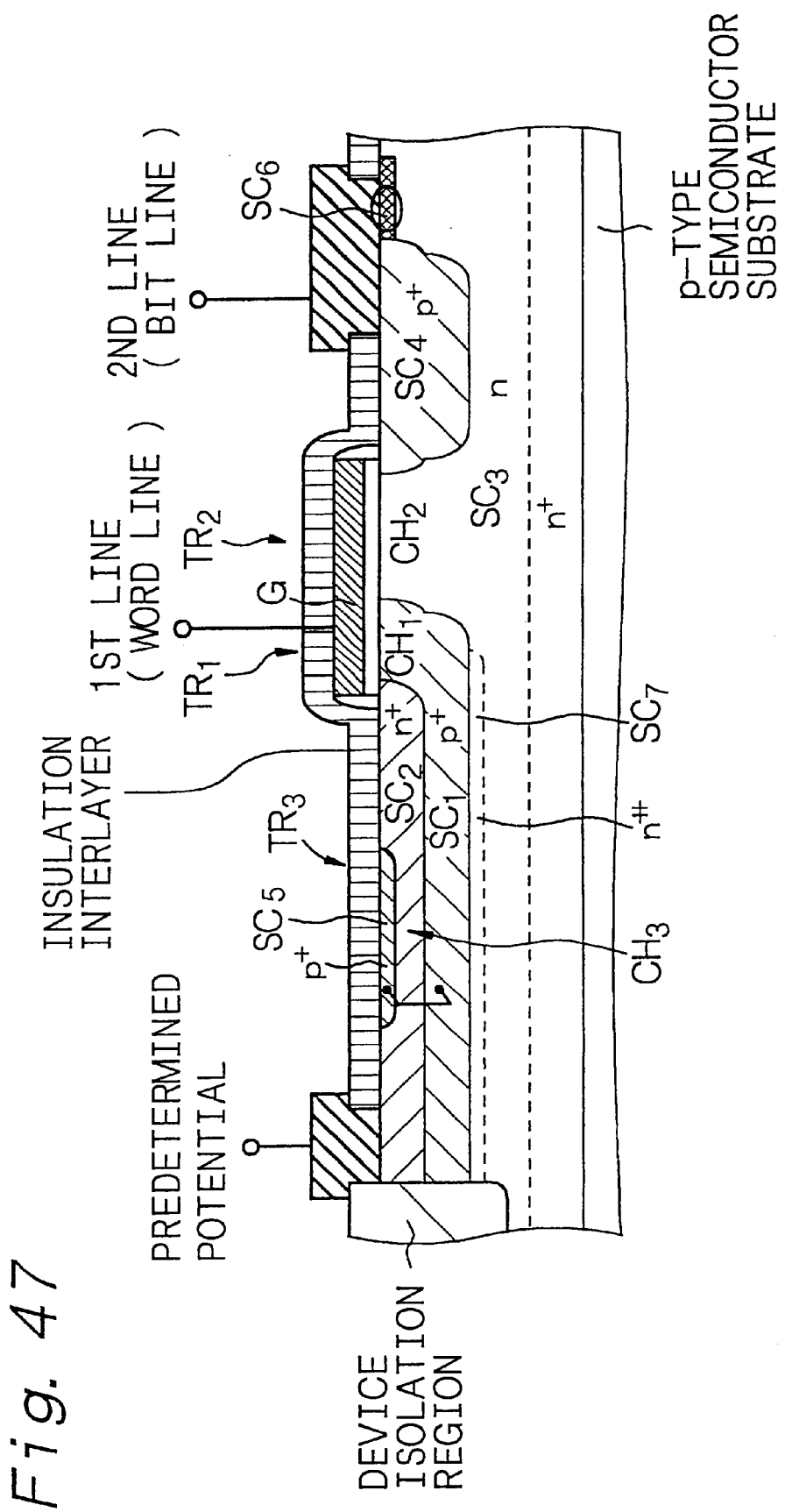
FIG. 47 is a schematic partial cross-sectional view of a variant of the semiconductor memory cell in Example 6.

In the semiconductor memory cell shown in FIGS. 41, 44 or 47, the third region $SC_3$ is formed in a well of the first conductivity type, for example, n-type, formed in a semiconductor substrate. Each semiconductor memory cell shown in FIGS. 42, 45 or 48 has a SOI structure, and each semiconductor memory cell shown in FIGS. 43, 46 or 49 has a TFT structure.

Example 7

Example 7 is directed to the semiconductor memory cell according to the second and ninth aspects of the present invention. The principle of the semiconductor memory cell of Example 7 is the same as that of the semiconductor memory cell in Example 5 of which the principle is shown in FIG. 29A, while the constitution of the regions thereof differs from that of the semiconductor memory cell of Example 5 as shown in the schematic partial cross-sectional view of FIG. 50. However, the semiconductor memory cell of Example 7 is the same in that it is constituted of a first transistor $TR_1$, a second transistor $TR_2$ and a third transistor $TR_4$ which are merged to one transistor.

The semiconductor memory cell of Example 7 comprises a first transistor $TR_1$ of a first conductivity type (for example, n-type) for read-out, a second transistor $TR_2$ of a second conductivity type (for example, p-type) for write-in, a junction-field-effect transistor $TR_3$ of a first conductivity type (for example, n-type) for current control, and a third transistor $TR_4$ of a second conductivity type (for example, p-type) for write-in. And the semiconductor memory cell has;

(a) a third semi-conductive region $SC_3$ having a first conductivity type, for example, n-type, (b) a fourth semi-conductive region $SC_4$ having a second conductivity type, for example, $p^+$-type, or a fourth conductive region $SC_4$ formed of a silicide, a metal or a metal compound, which is formed in a surface region of the third region $SC_3$ and forms a rectifier junction together with the third region $SC_3$, (c) a first semi-conductive region $SC_1$ formed in a surface region of the third region $SC_3$ and spaced from the fourth region $SC_4$, said first region $SC_1$ having the second conductivity type, for example, $p^+$-type, (d) a second semi-conductive region $SC_2$ formed in a surface region of the first region $SC_1$, said second region $SC_2$ having the first conductivity type, for example, $n^+$-type, (e) a fifth semi-conductive region $SC_5$ having the second conductivity type, for example, $p^+$-type, or a fifth conductive region $SC_5$ formed of a silicide, a metal or a metal compound, which is formed in a surface region of the second region $SC_2$ and forms a rectifier junction together with the second region $SC_2$, and (f) a gate region G shared by the first transistor $TR_1$, the second transistor $TR_2$ and the third transistor $TR_4$ and formed on a barrier layer so as to bridge the first region $SC_1$ and the fourth region $SC_4$, so as to bridge the second region $SC_2$ and the third region $SC_3$ and so as to bridge the third region $SC_3$ and the fifth region $SC_5$.

Concerning the first transistor $TR_1$;

(A-1) source/drain regions are constituted of the second region $SC_2$ and a surface region of the third region $SC_3$ which surface region is sandwiched by the first region $SC_3$ and the fourth region $SC_4$, and (A-2) a channel forming region $CH_1$ is constituted of a surface region of the first region $SC_1$ sandwiched by the second region $SC_2$ and the third region $SC_3$.

Concerning the second transistor $TR_2$;

(B-1) source/drain regions are constituted of the first region $SC_1$ and the fourth region $SC_4$, and (B-2) a channel forming region $CH_2$ is constituted of a surface region of the third region $SC_3$ which surface region corresponds to (or functions as) one source/drain region of the first transistor $TR_1$ and is sandwiched by the first region $SC_1$ and the fourth region $SC_4$.

Further, concerning the junction-field-effect transistor $TR_3$;

(C-1) gate regions are constituted of the fifth region $SC_5$ and a portion of the first region $SC_1$ facing the fifth region $SC_5$, (C-2) a channel region $CH_3$ is constituted of part of the second region $SC_2$ sandwiched by the fifth region $SC_5$ and said portion of the first region $SC_1$, (C-3) one source/drain region is constituted of the second region $SC_2$ which extends from one end of the channel region $CH_3$ of the junction-field-effect transistor $TR_3$ and corresponds to (or functions as) one source/drain region of the first transistor $TR_1$, and (C-4) the other source/drain region is constituted of the second region $SC_2$ extending from the other end of the channel region $CH_3$ of the junction-field-effect transistor $TR_3$.

Concerning the third transistor $TR_4$;

(D-1) one source/drain region is constituted of the surface region of the first region $SC_1$ corresponding to (or functioning as) the channel forming region $CH_1$ of the first transistor $TR_1$, (D-2) the other source/drain region is constituted of the fifth region $SC_5$, and (D-3) a channel forming region $CH_4$ is constituted of the second region $SC_2$ corresponding to (or functioning as) one source/drain region of the first transistor $TR_1$.

And, the gate region G is connected to a first memory-cell-selecting line, for example, a word line, the second region $SC_2$ is connected to a predetermined potential, and the fourth region $SC_4$ is connected to a second memory-cell-selecting line, for example, a bit line. Further, a junction portion of the third region $SC_3$ and the fourth region $SC_4$ forms a diode D, and one source/drain region of the first transistor $TR_1$ is connected to the second memory-cell-selecting line through the diode D.

Figure 50:
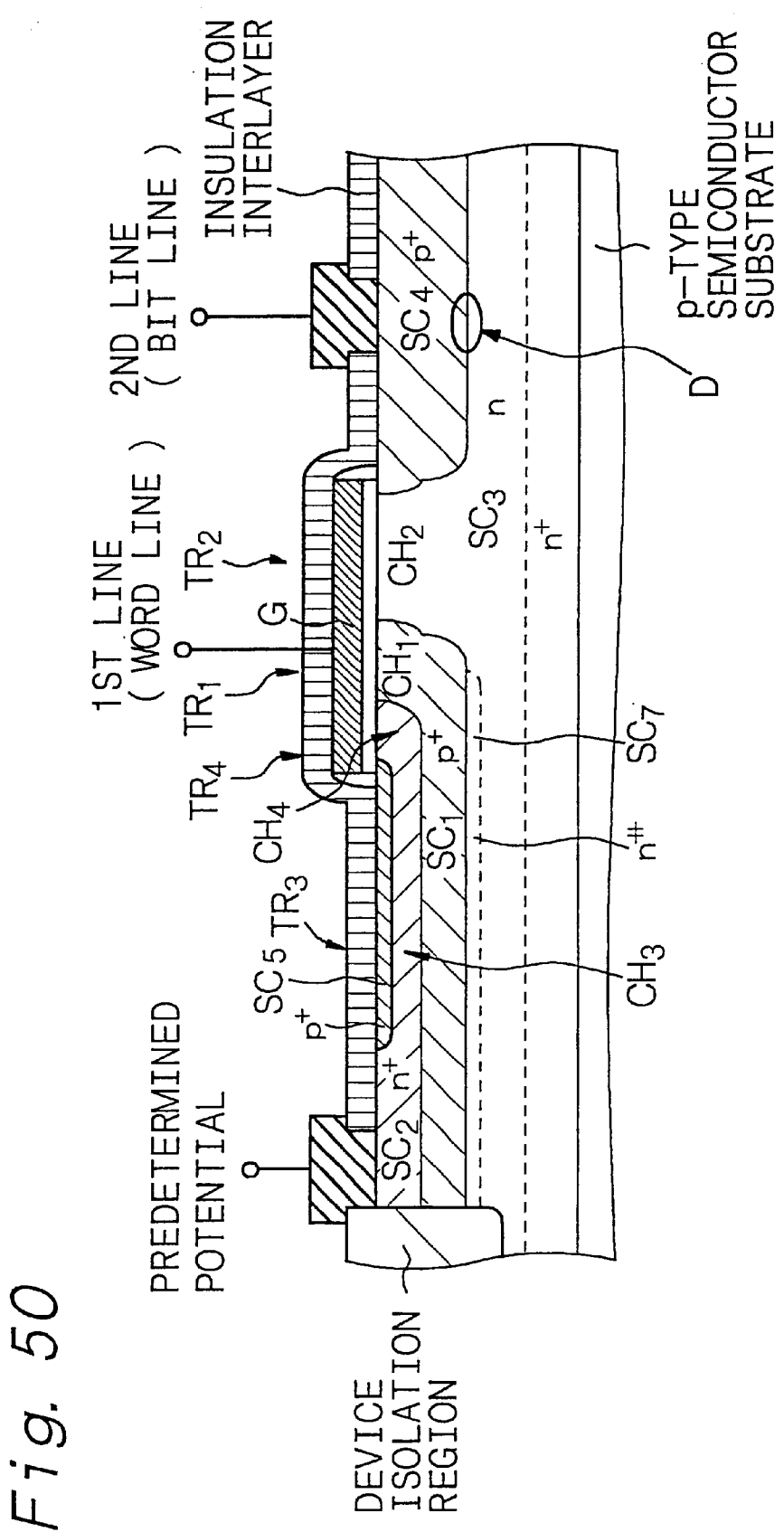
FIG. 50 is a schematic partial cross-sectional view of a semiconductor memory cell in Example 7.

The semiconductor memory cell of Example 7 shown in FIG. 50, more specifically, the third region $SC_3$ is formed in a well of the first conductivity type, for example, n-type, formed in a semiconductor substrate.

The junction-field-effect transistor $TR_3$ is formed by (1) optimizing the distance between the facing gate regions of the junction-field-effect transistor $TR_3$, that is, the thickness of the channel region $CH_3$, and (2) optimizing impurity concentrations of the facing gate regions and the channel region $CH_3$ of the junction-field-effect transistor $TR_3$. Further, when a region $SC_7$ containing a high concentration of an impurity having the first conductivity type is preferably formed under the first region $SC_1$, a potential or an electric charge stored in the channel forming region $CH_1$ of the first transistor $TR_1$ can be increased.

Figure 51:
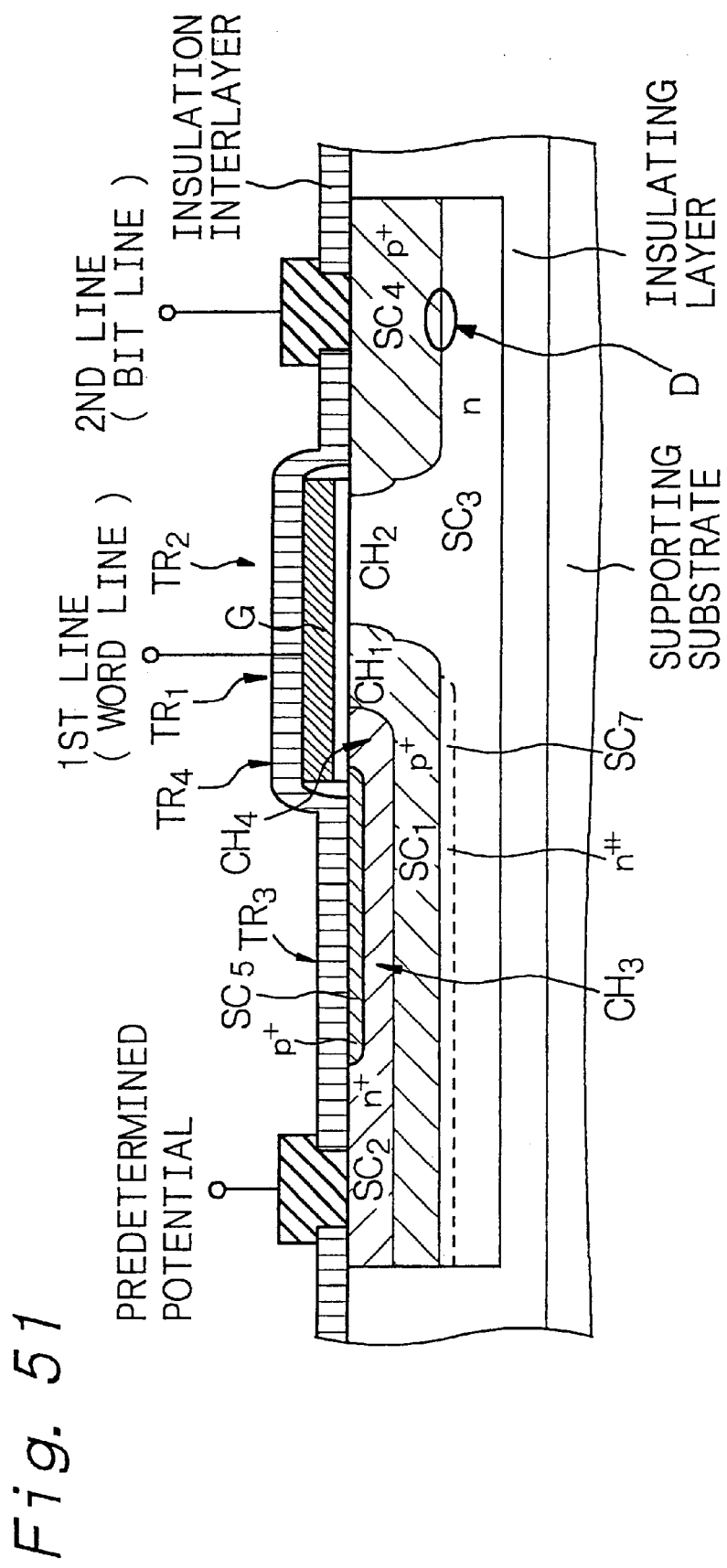
FIG. 51 is a schematic partial cross-sectional view of a variant of the semiconductor memory cell in Example 7.
Figure 52:
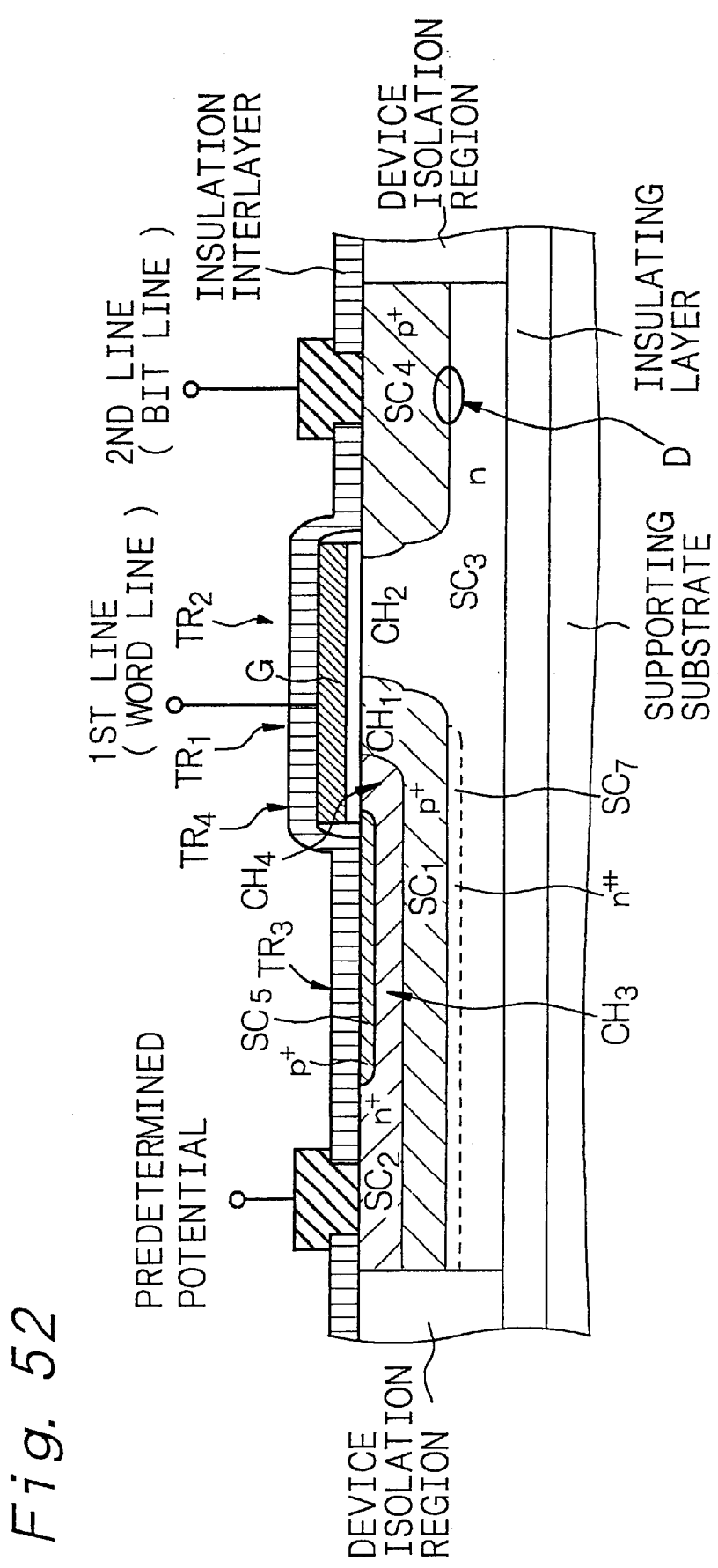
FIG. 52 is a schematic partial cross-sectional view of a variant of the semiconductor memory cell in Example 7.

Semiconductor memory cells shown in FIGS. 51 and 52 (see FIG. 29A for their principles) are variants of the semiconductor memory cell shown in FIG. 50, and have an SOI structure and a TFT structure, respectively.

Figure 53:
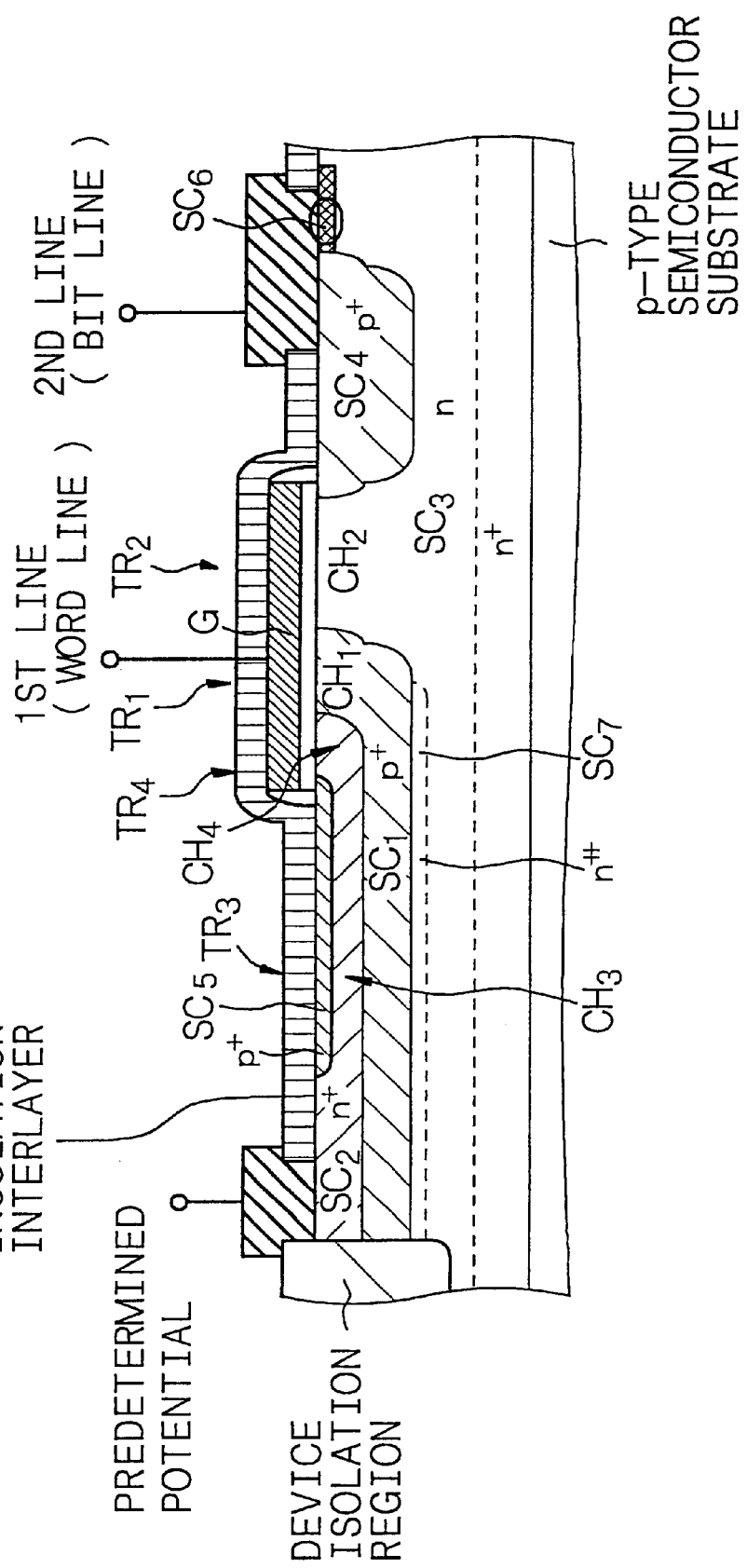
FIG. 53 is a schematic partial cross-sectional view of a variant of the semiconductor memory cell in Example 7.
Figure 54:
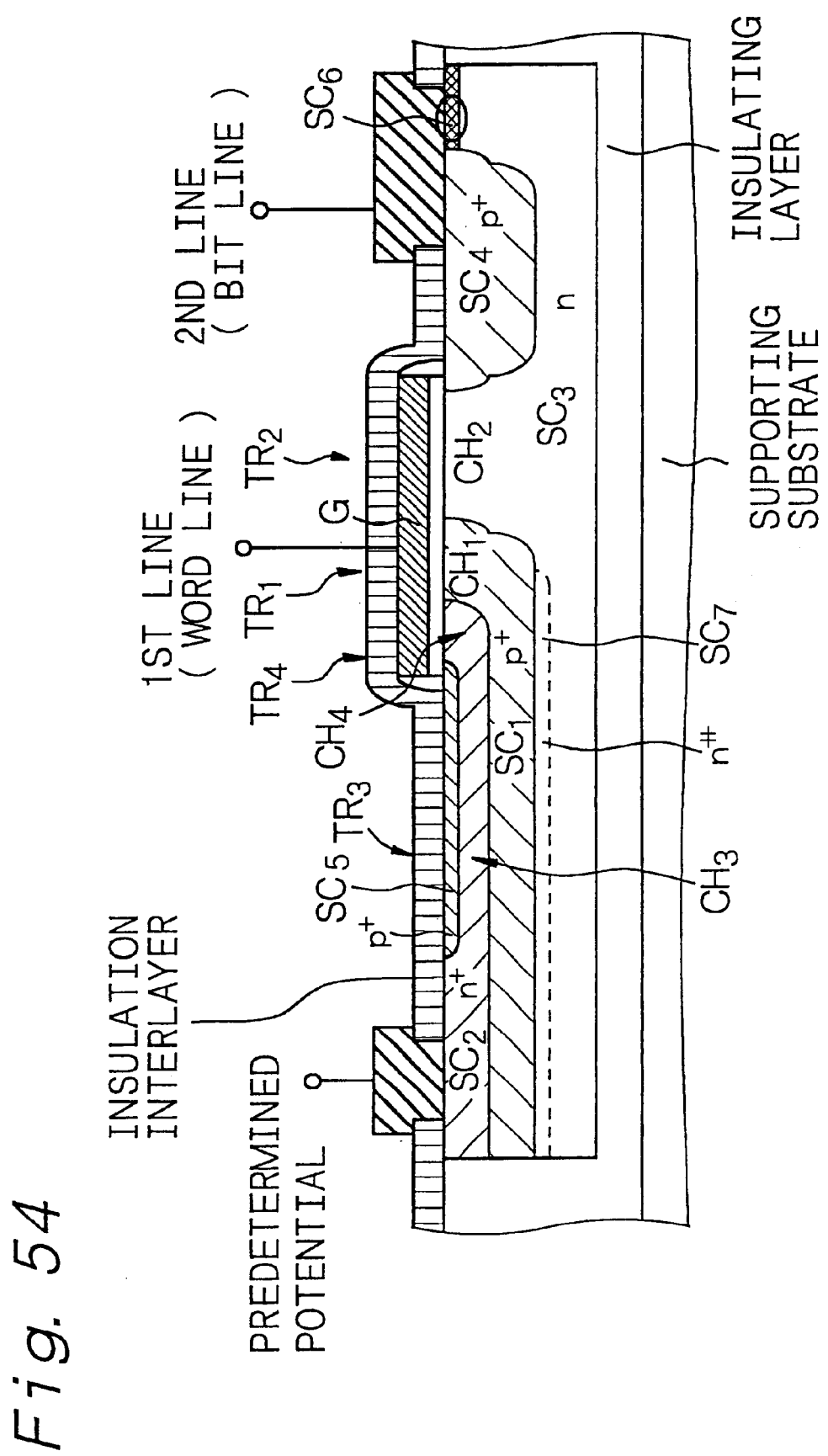
FIG. 54 is a schematic partial cross-sectional view of a variant of the semiconductor memory cell in Example 7.
Figure 55:
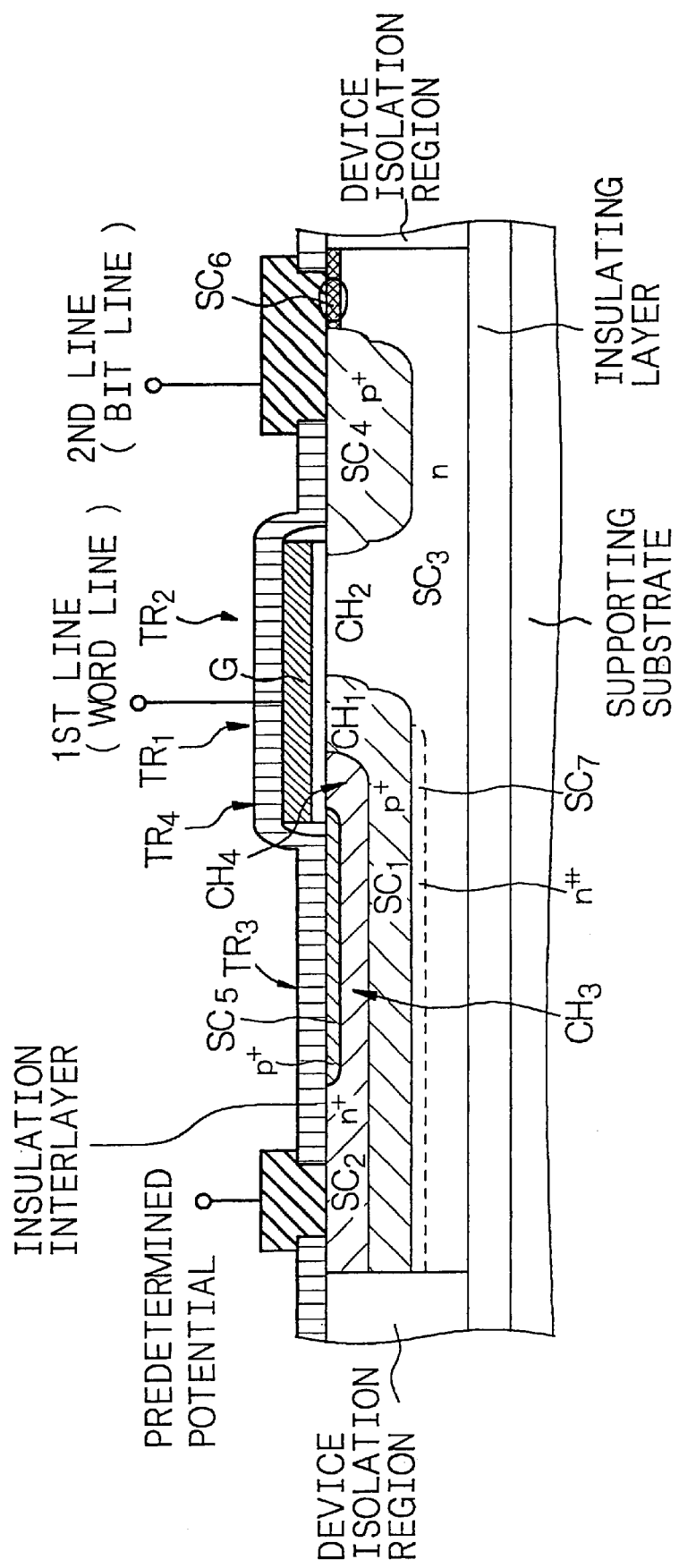
FIG. 55 is a schematic partial cross-sectional view of a variant of the semiconductor memory cell in Example 7.
Figure 56:
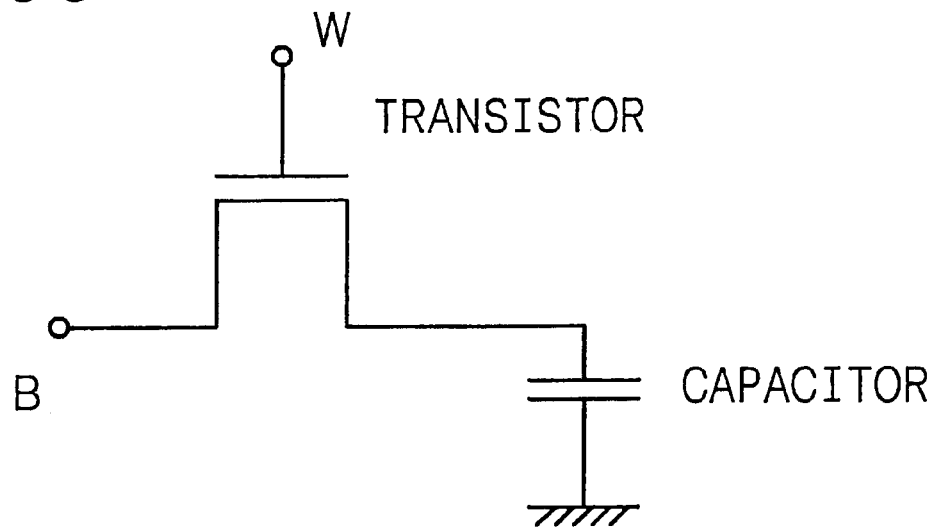
FIG. 56 schematically shows a conventional one-transistor memory cell.
Figure 57:
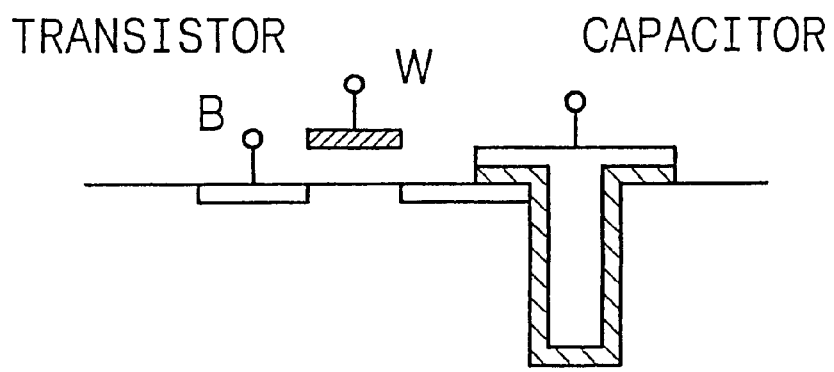
FIG. 57 schematically shows a conventional memory cell having a trench capacitor structure.

Semiconductor memory cells shown in FIGS. 53, 54 and 55 (see FIG. 29B for their principle) are variants of the semiconductor memory cells shown in FIGS. 50, 51 and 52, respectively. Each semiconductor memory cell has a sixth conductive region $SC_6$ which is formed in a surface region of the third region $SC_3$ and forms a rectifier junction together with the third region $SC_3$.

A diode is formed of the sixth region $SC_6$ and the third region $SC_3$, and third region $SC_3$ corresponding to (or functioning as) the other source/drain region of the first transistor $TR_1$ is connected to the second memory-cell-selecting line through the diode D. Preferably, a silicide, a metal or a metal compound is used to constitute the sixth region $SC_6$, and the junction between the sixth region $SC_6$ and third region $SC_3$ is formed as a junction in which a larger number of carriers mainly constitute a forward current like a Schottky junction.

The semiconductor memory cells explained in Examples 6 and 7 can be produced substantially in the same manner as in Example 3 except that the procedures for forming each region differ, and detailed explanations of their production are therefore omitted.

The operation of the semiconductor memory cells of Examples 1 to 7 will be explained below. It should be noted that the principles of operation of the semiconductor memory cells of Examples 1 to 7 are substantially same.

In write-in operation, potentials at portions of the semiconductor memory cell are set as shown in the following Table 1.

TABLE 1

| First memory-cell-selecting line: Second memory-cell-selecting line | $V_W$ |
|---|---|
| when writing "0": | $V_0$ |
| when writing "1": | $V_1$ |

In read-out operation, potentials at portions of the semiconductor memory cell are set as shown in the following Table 2. Further, in read-out operation, a potential of the information read-out line or the second memory-cell-selecting line to which the third region $SC_3$ is connected is set as shown in the following Table 2. The predetermined potential including 0 Volt is applied to the second region $SC_2$.

TABLE 2

| First memory-cell-selecting line: | $V_R$ |
|---|---|
| Information read-out line or second memory-cell-selecting line: | $V_2$ |

A threshold voltage of the first transistor $TR_1$ seen from the gate region is given as shown in the following Table 3. Further, the relationship among potentials in the first transistor $TR_1$ is set as shown in Table 3. A potential of the channel forming region $CH_1$ of the first transistor $TR_1$ when information "0" is read out is different from that when information "1" is read out. As a result, the threshold voltage of the first transistor $TR_1$ seen from the gate region changes, depending upon whether the stored information is "0" or "1". However, unlike a conventional DRAM, the semiconductor memory cell of the present invention does not require a capacitor with a large capacitance required by a conventional DRAM. When the ratio of an on-state current to an off-state current of the junction-field-effect transistor $TR_3$ is large, information can be read out without any error even if $|V_R| \geq |V_{TH\_11}|$.

TABLE 3

| When "0" is read out: | $V_{TH\_10}$ |
|---|---|
| When "1" is read out: | $V_{TH\_11}$ |
| $|V_{TH\_11}| > |V_R| > V_{TH\_10}|$ | |

[Operation to Write Information]

In operation to write "0" by setting the potential of the second memory-cell-selecting line at $V_0$ or write "1" by setting the potential of the second memory-cell-selecting line at $V_1$, the potential of the first memory-cell-selecting line is set at $V_W$ (<0). As a result, the potential of the gate region $G_2$ of the second transistor $TR_2$ is set at $V_W$ (<0) as well, and the second transistor $TR_2$ is brought into an on-state. Therefore, the potential of the channel forming region $CH_1$ of the first transistor $TR_1$ is $V_0$ when information "0" is written in, or $V_1$ when information "1" is written in.

After the information has been written in, potentials of portions in the first transistor $TR_1$ and the second transistor $TR_2$ should be set at such values that these transistors do not conduct. For this purpose, typically, the potential of the first memory-cell-selecting line is set at 0 Volt and the potential of the second memory-cell-selecting line is set at $V_1$.

In operation to write information, the potential of the gate region $G_1$ of the first transistor $TR_1$ is also set at $V_W$ (<0). As a result, the first transistor $TR_1$ is in an off-state. In this state, the potential of the channel forming region $CH_1$ of the first transistor $TR_1$ is $V_0$ when information "0" is written in, or $V_1$ when information "1" is written in. In spite of the fact that this state changes with the lapse of time due to leakage currents, this state is none the less maintained within an allowable range till operation to read out the information is carried out. Examples of the leakage currents are a current flowing between the channel forming region $CH_1$ of the first transistor $TR_1$ and, for example, a semiconductor substrate, or an off-state current of the second transistor $TR_2$. It should be noted that so-called refresh operation is carried out before the potential of the channel forming region $CH_1$ of the first transistor $TR_1$ changes with the lapse of time to cause an error in operation to read out the information.

[Operation to Read Out Information]

In operation to read out the information "0" or "1", the potential of the first memory-cell-selecting line is set at $V_R$ (>0). Therefore, the potential of the gate region $G_2$ of the second transistor $TR_2$ is also set at $V_R$ (>0). As a result, the second transistor $TR_2$ is brought into an off-state.

The potential of the gate region $G_1$ of the first transistor $TR_1$ is set at $V_R$ (>0) as well. The threshold voltage of the first transistor $TR_1$ seen from the gate region is $V_{TH\_10}$ or $V_{TH\_11}$ for stored information of "0" or "1" respectively. The threshold voltage of the first transistor $TR_1$ depends upon the state of the potential of the channel forming region $CH_1$. The relationship among the potentials and the threshold voltages is as follows.

$$|V_{TH\_11}|>|V_R|>|V_{TH_{1}310}|$$

Therefore, when the stored information is "0", the first transistor $TR_1$ is brought into an on-state. When the stored information is "1", on the other hand, the first transistor $TR_1$ is brought into an off-state. However, when the ratio of an on-state current to an off-state current of the junction-field-effect transistor $TR_3$ is large, the information can be read out without any error even if $|V_R| \geq |V_{TH\_11}|$.

Further, the first transistor $TR_1$ is controlled by the junction-field-effect transistor $TR_3$ on the basis of the bias conditions of the gate regions of the junction-field-effect transistor $TR_3$ which are constituted of the first region $SC_1$ and the fifth region $SC_5$ (or fourth region $SC_4$). That is, when the stored information is "0", the junction-field-effect transistor $TR_3$ is brought into an on-state. When the stored information is "1", on the other hand, the junction-field-effect transistor $TR_3$ is brought into an off-state.

In the above manner, the first transistor $TR_1$ can be brought into an on-state or an off-state with a high degree of reliability depending upon the stored information. Since the third region $SC_3$ is connected to the information read-out line or the second memory-cell-selecting line, a current flows or does not flow depending upon whether the stored information is "0" or "1". As a result, the stored information can be read out by the first transistor $TR_1$.

The operating states of the first transistor $TR_1$, the second transistor $TR_2$ and the junction-field-effect transistor $TR_3$ described above are summarized in Table 4. It should be noted that the values of potentials shown in Table 4 are no more than typical values, which can be any values as long as the conditions described above are satisfied.

TABLE 4

| Write-in operation | Write-in of "0" | | Write-in of "1" | unit:volt |
|---|---|---|---|---|
| Potential of first memory-cell-selecting line | $V_W$ | -3.0 | $V_W$ | -3.0 |

TABLE 4-continued

| Potential of second memory-cell-selecting line | $V_0$ | 0 | $V_1$ | -2.0 |
|---|---|---|---|---|
| Potential of gate region G | $V_W$ | -3.0 | $V_W$ | -3.0 |
| State of $TR_2$ | ON | | ON | |
| Potential of channel forming region $CH_1$ | $V_0$ | 0 | $V_1$ | -2.0 |
| State of $TR_1$ | OFF | | OFF | |
| State of $TR_3$ | ON | | OFF | |

| Read-out operation | Read-out of "0" | | Read-out of "1" | |
|---|---|---|---|---|
| Potential of first memory-cell-selecting line | $V_R$ | 1.0 | $V_R$ | 1.0 |
| Potential of gate region G | $V_R$ | 1.0 | $V_R$ | 1.0 |
| State of $TR_2$ | OFF | | OFF | |
| Potential of channel forming region $CH_1$ | $V_0$ | 0 | $V_1$ | -2.0 |
| Threshold voltage of $TR_1$ seen from gate region | $V_{TH1\_0}$ | 0.5 | $V_{TH1\_1}$ | 1.1 |
| State of $TR_1$ | ON | | OFF | |
| Potential of second memory-cell-selecting line or information read-out line | 1.0 | | 1.0 | |
| State of $TR_3$ | ON | | OFF | |

The semiconductor memory cell of the present invention has been explained with reference to preferred embodiments hereinabove, while the present invention shall not be limited to those embodiments. The structures of the semiconductor memory cells, and voltages, potentials, etc., in the semiconductor memory cells explained as embodiments are examples, and may be changed as required. For example, in the semiconductor memory cells explained as embodiments, the first transistor $TR_1$ and the junction-field-effect transistor $TR_3$ may be p-type transistors, and the second transistor $TR_2$ and the third transistor $TR_4$ may be n-type transistors. The layout of elements in each transistor is an example, and may be changed as required. An impurity may be introduced into each region not only by an ion-implanting method but also by a diffusion method. Further, the present invention can be applied not only to a silicon semiconductor but also to a compound semiconductor, e.g., of a GaAs system. Moreover, the semiconductor memory cell of the present invention can be applied to a semiconductor memory cell having an MES FET structure.

Figure 1A:
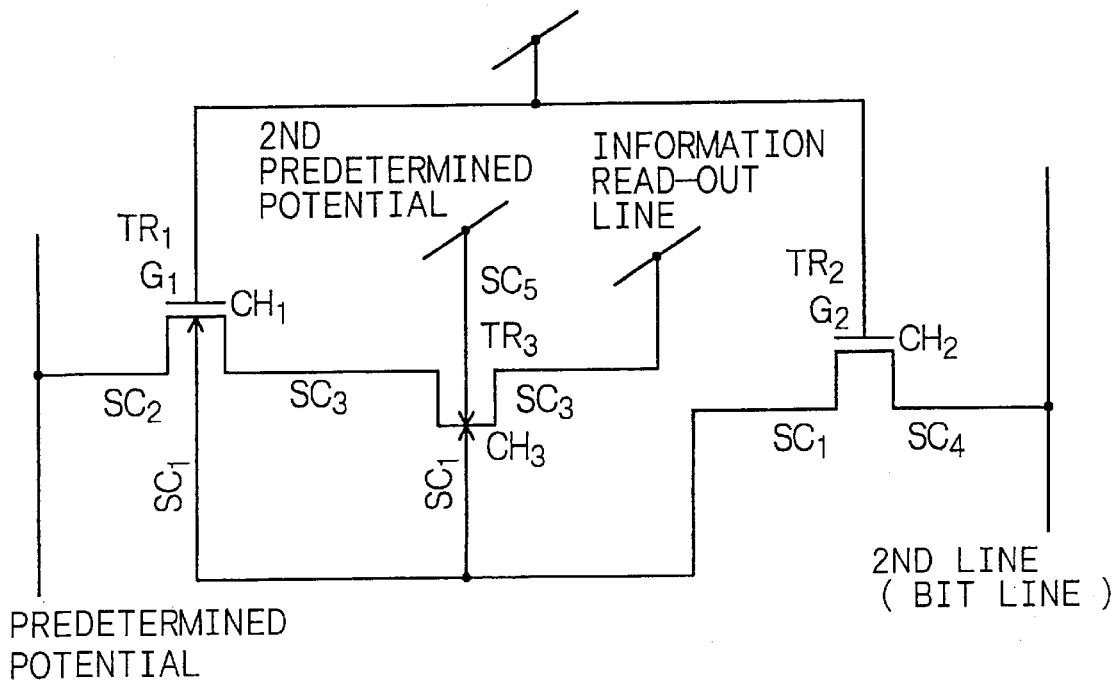
FIGS. 1A and 1B show the principles of the semiconductor memory cell according to the first and third aspect of the present invention.

For manufacturing the semiconductor memory cell of the present invention whose principle is shown in FIG. 1A, as one having the structure shown in FIG. 2, for example, an information read-out line can be provided so as to be laterally connected to the third region $SC_3$ positioned between the fourth region $SC_4$ and the fifth region $SC_5$. For manufacturing the semiconductor memory cell of the present invention whose principle is shown in FIG. 16A, as one having the structure shown in FIG. 17, for example, an information read-out line can be provided so as to be connected to the surface region of the third region $SC_3$ spaced from the fourth region $SC_4$ without providing the fifth region $SC_5$. For manufacturing the semiconductor memory cell of the present invention whose principle is shown in FIG. 16B, as one having the structure shown in FIG. 2, the fifth region $SC_5$ can connected to the second memory-cell-selecting line in place of connecting it to a second predetermined potential.

The method of forming a Schottky junction or the method of forming conductive regions in surface regions of various regions shall not be limited to those explained in Examples. When the second memory-cell-selecting line is formed, for example, titanium silicide or TiN is used to form a barrier layer or a glue layer, while such a barrier or glue layer is also formed on the surface of the third region SC$_3$, whereby the fifth conductive region SC$_5$ or the sixth conductive region SC$_6$ having a common region with the second memory-cell-selecting line (more specifically, with part of the barrier layer or the glue layer) can be formed in the surface of the third region SC$_3$. Similarly, a conductive region can be formed in the surface region of each region.

In the semiconductor memory cell of the present invention, the operation of the first transistor for read-out is defined by a potential or an electric charge (information) stored in the channel forming region of the first transistor for read-out. Information as a current of a transistor, which is read out within a refresh time, is in no case dependent upon the capacitance (e.g., a capacitance of the gate region+an added capacitance, etc.) even if it is additionally added. Therefore, the capacitance problem of a conventional semiconductor memory cell can be overcome, and even if an additional capacitor is added, a greatly large-capacitance capacitor like DRAM is no longer necessary. And, the maximum area of the semiconductor memory cell is equal to, or smaller, than the area of two transistors.

Furthermore, since the junction-field-effect transistor is provided and is turned on and off in information read-out operation, a large margin is left for a current which flows between the second region and the third region. As a result, the number of semiconductor memory cells to be connected to the bit line is scarcely limited, and the information holding time (retention time) of the semiconductor memory cell can be increased.

The process of each of the semiconductor memory cells according to the fifth to ninth aspects of the present invention is compatible with the MOS logic circuit formation process as shown in FIGS. 34 to 35 and FIGS. 36 to 37. Therefore, the area of one transistor is nearly sufficient for forming one semiconductor memory cell, and a DRAM function can be integrated into an MOS logic circuit with a slight increase in the number of steps. Further, SOI technology is not necessarily required, and one semiconductor memory cell can be formed nearly in the area of one transistor by a technology for forming a conventional semiconductor memory cell.

What is claimed is:

1. A semiconductor memory cell comprising a first transistor of a first conductivity type for read-out, a second transistor of a second conductivity type for write-in, and a junction-field-effect transistor of a first conductivity type for current control, said semiconductor memory cell having;
   (a) a first semi-conductive region having a second conductivity type,
   (b) a second semi-conductive or conductive region formed in a surface region of the first region, said second region forming a rectifier junction together with the first region,
   (c) a third semi-conductive region formed in a surface region of the first region and spaced from the second region, said third region having a first conductivity type,
   (d) a fourth semi-conductive or conductive region formed in a surface region of the third region, said fourth region forming a rectifier junction together with the third region, and
   (e) a fifth semi-conductive or conductive region formed in a surface region of the third region and spaced from the fourth region, said fifth region forming a rectifier junction together with the third region, wherein;
   (A-1) source/drain regions of the first transistor are constituted of the second region and the third region,
   (A-2) a channel forming region of the first transistor is constituted of a surface region of the first region sandwiched by the second region and the third region,
   (A-3) a gate region of the first transistor is formed on a barrier layer formed on the surface region of the first region sandwiched by the second region and the third region,
   (B-1) source/drain regions of the second transistor are constituted of the first region and the fourth region,
   (B-2) a channel forming region of the second transistor is constituted of a surface region of the third region sandwiched by the first region and the fourth region,
   (B-3) a gate region of the second transistor is formed on a barrier layer formed on the surface region of the third region sandwiched by the first region and the fourth region,
   (C-1) gate regions of the junction-field-effect transistor are constituted of the fifth region and a portion of the first region facing the fifth region,
   (C-2) a channel region of the junction-field-effect transistor is constituted of part of the third region sandwiched by the fifth region and said portion of the first region,
   (C-3) source/drain regions of the junction-field-effect transistor are constituted of the third region extending from both ends of the channel region of the junction-field-effect transistor,
   (D) the gate region of the first transistor and the gate region of the second transistor are connected to a first memory-cell-selecting line,
   (E) the second region is connected to a predetermined potential,
   (F) the fourth region is connected to a second memory-cell-selecting line, and
   (G) the fifth region is connected to a second predetermined potential.

2. The semiconductor memory cell according to claim 1, wherein the fifth region is connected to the first region, in place of being connected to the second predetermined potential.

3. The semiconductor memory cell according to claim 1 or 2, wherein a junction portion of the third region and the fourth region forms a diode, and one source/drain region of the junction-field-effect transistor is connected to the second memory-cell-selecting line through the diode.

4. The semiconductor memory cell according to claim 1, wherein a diode is formed on the surface region of the third region corresponding to one source/drain region of the junction-field-effect transistor, and one source/drain region of the junction-field-effect transistor is connected to the second predetermined potential through the diode.

5. The semiconductor memory cell according to claim 1 or 2, wherein a region containing a high concentration of an impurity having a first conductivity type is formed under the first region.

6. The semiconductor memory cell according to claim 1 or 2, wherein the semiconductor memory cell is formed in a well of the second conductivity type.

7. The semiconductor memory cell according to claim 1 or 2, wherein the semiconductor memory cell is formed on an insulator.

8. A semiconductor memory cell comprising a first transistor of a first conductivity type for read-out, a second transistor of a second conductivity type for write-in, and a junction-field-effect transistor of a first conductivity type for current control, said semiconductor memory cell having;

(a) a first semi-conductive region having a second conductivity type, (b) a second semi-conductive region formed in a surface region of the first region, said second region having a first conductivity type, (c) a third semi-conductive region formed in a surface region of the first region and spaced from the second region, said third region having the first conductivity type, (d) a fourth semi-conductive or conductive region formed in a surface region of the third region, said fourth region forming a rectifier junction together with the third region, and (e) a fifth semi-conductive or conductive region formed in a surface region of the second region, said fifth region forming a rectifier junction together with the second region, wherein;

(A-1) source/drain regions of the first transistor are constituted of the second region and the third region, (A-2) a channel forming region of the first transistor is constituted of a surface region of the first region sandwiched by the second region and the third region, (A-3) a gate region of the first transistor is formed on a barrier layer formed on the surface region of the first region sandwiched by the second region and the third region, (B-1) source/drain regions of the second transistor are constituted of the first region and the fourth region, (B-2) a channel forming region of the second transistor is constituted of a surface region of the third region sandwiched by the first region and the fourth region, (B-3) a gate region of the second transistor is formed on a barrier layer formed on the surface region of the third region sandwiched by the first region and the fourth region, (C-1) gate regions of the junction-field-effect transistor are constituted of the fifth region and a portion of the first region facing the fifth region, (C-2) a channel region of the junction-field-effect transistor is constituted of part of the second region sandwiched by the fifth region and said portion of the first region, (C-3) source/drain regions of the junction-field-effect transistor are constituted of the second region extending from both ends of the channel region of the junction-field-effect transistor, (D) the gate region of the first transistor and the gate region of the second transistor are connected to a first memory-cell-selecting line, (E) the second region is connected to a predetermined potential, (F) the fourth region is connected to a second memory-cell-selecting line, and (G) the fifth region is connected to a second predetermined potential.

9. The semiconductor memory cell according to claim 8, wherein the fifth region is connected to the first region, in place of being connected to the second predetermined potential.

10. The semiconductor memory cell according to claim 8 or 9, wherein a junction portion of the third region and the fourth region forms a diode, and one source/drain region of the first transistor is connected to the second memory-cell-selecting line through the diode.

11. The semiconductor memory cell according to claim 8 or 9, wherein a region containing a high concentration of an impurity having a first conductivity type is formed under the first region.

12. The semiconductor memory cell according to claim 8 or 9, wherein the semiconductor memory cell is formed in a well of the second conductivity type.

13. The semiconductor memory cell according to claim 8 or 9, wherein the semiconductor memory cell is formed on an insulator.

14. A semiconductor memory cell comprising a first transistor of a first conductivity type for read-out, a second transistor of a second conductivity type for write-in, and a junction-field-effect transistor of a first conductivity type for current control, said semiconductor memory cell having;

(a) a first semi-conductive region having a second conductivity type, (b) a second semi-conductive or conductive region formed in a surface region of the first region, said second region forming a rectifier junction together with the first region, (c) a third semi-conductive region formed in a surface region of the first region and spaced from the second region, said third region having a first conductivity type, (d) a fourth semi-conductive region formed in a surface region of the third region, said fourth region having the second conductivity type, and (e) a gate region shared by the first transistor and the second transistor and formed on a barrier layer so as to bridge the second region and the third region and so as to bridge the first region and the fourth region, wherein;

(A-1) source/drain regions of the first transistor are constituted of the second region and a surface region of the third region which surface region is sandwiched by the first region and the fourth region, (A-2) a channel forming region of the first transistor is constituted of a surface region of the first region sandwiched by the second region and the third region, (B-1) source/drain regions of the second transistor are constituted of the first region and the fourth region, (B-2) a channel forming region of the second transistor is constituted of a surface region of the third region which surface region corresponds to one source/drain region of the first transistor and is sandwiched by the first region and the fourth region, (C-1) gate regions of the junction-field-effect transistor are constituted of the fourth region and a portion of the first region facing the fourth region, (C-2) a channel region of the junction-field-effect transistor is constituted of part of the third region positioned under one source/drain region of the second transistor and sandwiched by the first region and the fourth region, (C-3) one source/drain region of the junction-field-effect transistor is constituted of a surface region of the third region which surface region extends from one end of the channel region of the junction-field-effect transistor, corresponds to one source/drain region of the first transistor, corresponds to the channel forming region of the second transistor and is sandwiched by the first region and the fourth region, (C-4) the other source/drain region of the junction-field-effect transistor is constituted of the third region extending from the other end of the channel region of the junction-field-effect transistor, (D) the gate region is connected to a first memory-cell-selecting line, (E) the second region is connected to a predetermined potential, and (F) the fourth region is connected to a second memory-cell-selecting line.

15. The semiconductor memory cell according to claim 14, wherein the semiconductor memory cell further has a fifth conductive region which is formed in a surface region of the third region and forms a rectifier junction together with the third region, a diode is formed of the fifth region and the third region, and the third region corresponding to the other source/drain region of the junction-field-effect transistor is connected to the second memory-cell-selecting line through the diode.

16. The semiconductor memory cell according to claim 14, wherein a region containing a high concentration of an impurity having a first conductivity type is formed under the first region.

17. The semiconductor memory cell according to claim 14, wherein the semiconductor memory cell is formed in a well of the second conductivity type.

18. The semiconductor memory cell according to claim 14, wherein the semiconductor memory cell is formed on an insulator.

19. A semiconductor memory cell comprising a first transistor of a first conductivity type for read-out, a second transistor of a second conductivity type for write-in, and a junction-field-effect transistor of a first conductivity type for current control, said semiconductor memory cell having;

(a) a first semi-conductive region having a second conductivity type, (b) a second semi-conductive region formed in a surface region of the first region, said second region having a first conductivity type, (c) a third semi-conductive region formed in a surface region of the first region and spaced from the second region, said third region having the first conductivity type, (d) a fourth semi-conductive or conductive region formed in a surface region of the third region, said fourth region forming a rectifier junction together with the third region, and (e) a fifth semi-conductive or conductive region formed in a surface region of the second regions, said fifth region forming a rectifier junction together with the second region, and (f) a gate region shared by the first transistor and the second transistor and formed on a barrier layer so as to bridge the second region and the third region and so as to bridge the first region and the fourth region, wherein;

(A-1) source/drain regions of the first transistor are constituted of the second region and a surface region of the third region which surface region is sandwiched by the first region and the fourth region, (A-2) a channel forming region of the first transistor is constituted of a surface region of the first region sandwiched by the second region and the third region, (B-1) source/drain regions of the second transistor are constituted of the first region and the fourth region, (B-2) a channel forming region of the second transistor is constituted of a surface region of the third region which surface region corresponds to one source/drain region of the first transistor and is sandwiched by the first region and the fourth region, (C-1) gate regions of the junction-field-effect transistor are constituted of the fifth region and a portion of the first region facing the fifth region, (C-2) a channel region of the junction-field-effect transistor is constituted of part of the second region sandwiched by the fifth region and said portion of the first region, (C-3) one source/drain region of the junction-field-effect transistor is constituted of the second region which extends from one end of the channel region of the junction-field-effect transistor and corresponds to one source/drain region of the first transistor, (C-4) the other source/drain region of the junction-field-effect transistor is constituted of the second region extending from the other end of the channel region of the junction-field-effect transistor, (D) the gate region is connected to a first memory-cell-selecting line, (E) the second region is connected to a predetermined potential, (F) the fourth region is connected to a second memory-cell-selecting line, and (G) the fifth region is connected to a second predetermined potential.

20. The semiconductor memory cell according to claim 19, wherein the semiconductor memory cell further has a sixth conductive region formed in a surface region of the third region, said sixth region forming a rectifier junction together with the third region, a diode is formed of the sixth region and the third region, and the third region corresponding to the other source/drain region of the first transistor is connected to the second memory-cell-selecting line through the diode.

21. The semiconductor memory cell according to claim 19, wherein the fifth region is connected to the first region, in place of being connected to the second predetermined potential.

22. The semiconductor memory cell according to claim 21, wherein the semiconductor memory cell further has a sixth conductive region formed in a surface region of the third region, said sixth region forming a rectifier junction together with the third region, a diode is formed of the sixth region and the third region, and the third region corresponding to the other source/drain region of the first transistor is connected to the second memory-cell-selecting line through the diode.

23. The semiconductor memory cell according to claim 19 or 21, wherein a region containing a high concentration of an impurity having a first conductivity type is formed under the first region.

24. The semiconductor memory cell according to claim 19 or 21, wherein the semiconductor memory cell is formed in a well of the second conductivity type.

25. The semiconductor memory cell according to claim 19 or 21, wherein the semiconductor memory cell is formed on an insulator.

26. A semiconductor memory cell comprising a first transistor of a first conductivity type for read-out, a second transistor of a second conductivity type for write-in, a junction-field-effect transistor of a first conductivity type for current control, and a third transistor of a second conductivity type for write-in, said semiconductor memory cell having;
- (a) a first semi-conductive region having a second conductivity type,
- (b) a second semi-conductive region formed in a surface region of the first region, said second region having a first conductivity type,
- (c) a third semi-conductive region formed in a surface region of the first region and spaced from the second region, said third region having the first conductivity type,
- (d) a fourth semi-conductive or conductive region formed in a surface region of the third region, said fourth region forming a rectifier junction together with the third region,
- (e) a fifth semi-conductive or conductive region formed in a surface region of the second regions, said fifth region forming a rectifier junction together with the second region, and
- (f) a gate region shared by the first transistor, the second transistor and the third transistor and formed on a barrier layer so as to bridge the first region and the fourth region, so as to bridge the second region and the third region and so as to bridge the third region and the fifth region, wherein;
- (A-1) source/drain regions of the first transistor are constituted of the second region and a surface region of the third region which surface region is sandwiched by the first region and the fourth region,
- (A-2) a channel forming region of the first transistor is constituted of a surface region of the first region sandwiched by the second region and the third region,
- (B-1) source/drain regions of the second transistor are constituted of the first region and the fourth region,
- (B-2) a channel forming region of the second transistor is constituted of a surface region of the third region which surface region corresponds to one source/drain region of the first transistor and is sandwiched by the first region and the fourth region,
- (C-1) gate regions of the junction-field-effect transistor are constituted of the fifth region and a portion of the first region facing the fifth region,
- (C-2) a channel region of the junction-field-effect transistor is constituted of part of the second region sandwiched by the fifth region and said portion of the first region,
- (C-3) one source/drain region of the junction-field-effect transistor is constituted of the second region which extends from one end of the channel region of the junction-field-effect transistor and corresponds to one source/drain region of the first transistor,
- (C-4) the other source/drain region of the junction-field-effect transistor is constituted of the second region extending from the other end of the channel region of the junction-field-effect transistor,
- (D-1) one source/drain region of the third transistor is constituted of the surface region of the first region corresponding to the channel forming region of the first transistor,
- (D-2) the other source/drain region of the third transistor is constituted of the fifth region,
- (D-3) a channel forming region of the third transistor is constituted of the second region corresponding to one source/drain region of the first transistor,
- (E) the gate region is connected to a first memory-cell-selecting line,
- (F) the second region is connected to a predetermined potential, and
- (G) the fourth region is connected to a second memory-cell-selecting line.

27. The semiconductor memory cell according to claim 26, wherein a region containing a high concentration of an impurity having a first conductivity type is formed under the first region.

28. The semiconductor memory cell according to claim 26, wherein the semiconductor memory cell is formed in a well of the second conductivity type.

29. The semiconductor memory cell according to claim 26, wherein the semiconductor memory cell is formed on an insulator.

30. A semiconductor memory cell comprising a first transistor of a first conductivity type for read-out, a second transistor of a second conductivity type for write-in, and a junction-field-effect transistor of a first conductivity type for current control, said semiconductor memory cell having;
- (a) a third semi-conductive region having a first conductivity type,
- (b) a fourth semi-conductive or conductive region formed in a surface region of the third region, said fourth region forming a rectifier junction together with the third region,
- (c) a first semi-conductive region formed in a surface region of the third region and spaced from the fourth region, said first region having a second conductivity type,
- (d) a second semi-conductive region formed in a surface region of the first region, said second region having the first conductivity type,
- (e) a fifth semi-conductive or conductive region formed in a surface region of the second region, said fifth region forming a rectifier junction together with the second region, and
- (f) a gate region shared by the first transistor and the second transistor and formed on a barrier layer so as to bridge the second region and the third region and so as to bridge the first region and the fourth region, wherein;
- (A-1) source/drain regions of the first transistor are constituted of the second region and the third region,
- (A-2) a channel forming region of the first transistor is constituted of a surface region of the first region sandwiched by the second region and the third region,
- (B-1) source/drain regions of the second transistor are constituted of the first region and the fourth region,
- (B-2) a channel forming region of the second transistor is constituted of a surface region of the third region sandwiched by the first region and the fourth region, (C-1) gate regions of the junction-field-effect transistor are constituted of the fifth region and a portion of the first region facing the fifth region, (C-2) a channel region of the junction-field-effect transistor is constituted of part of the second region sandwiched by the fifth region and said portion of the first region, (C-3) source/drain regions of the junction-field-effect transistor are constituted of the second region extending from both ends of the channel region of the junction-field-effect transistor, (D) the gate region is connected to a first memory-cell-selecting line, (E) the second region is connected to a predetermined potential, (F) the fourth region is connected to a second memory-cell-selecting line, and (G) the fifth region is connected to a second predetermined potential.

31. The semiconductor memory cell according to claim 30, wherein the fifth region is connected to the first region, in place of being connected to the second predetermined potential.

32. The semiconductor memory cell according to claim 30 or 31, wherein a junction portion of the third region and the fourth region forms a diode, and one source/drain region of the first transistor is connected to the second memory-cell-selecting line through the diode.

33. The semiconductor memory cell according to claim 30 or 31, wherein the semiconductor memory cell further has a sixth conductive region formed in a surface region of the third region, said sixth region forming a rectifier junction together with the third region, a diode is formed of the sixth region and the third region, and the third region corresponding to the other source/drain region of the first transistor is connected to the second memory-cell-selecting line through the diode.

34. The semiconductor memory cell according to claim 30 or 31, wherein a region containing a high concentration of an impurity having a first conductivity type is formed under the first region.

35. The semiconductor memory cell according to claim 30 or 31, wherein the semiconductor memory cell is formed in a well of the first conductivity type.

36. The semiconductor memory cell according to claim 30 or 31, wherein the semiconductor memory cell is formed on an insulator.

37. A semiconductor memory cell comprising a first transistor of a first conductivity type for read-out, a second transistor of a second conductivity type for write-in, a junction-field-effect transistor of a first conductivity type for current control, and a third transistor of a second conductivity type for write-in, said semiconductor memory cell having;

(a) a third semi-conductive region having a first conductivity type, (b) a fourth semi-conductive or conductive region formed in a surface region of the third region, said fourth region forming a rectifier junction together with the third region, (c) a first semi-conductive region formed in a surface region of the third region and spaced from the fourth region, said first region having a second conductivity type, (d) a second semi-conductive region formed in a surface region of the first region, said second region having the first conductivity type, (e) a fifth semi-conductive or conductive region formed in a surface region of the second region, said fifth region forming a rectifier junction together with the second region, and (f) a gate region shared by the first transistor, the second transistor and the third transistor and formed on a barrier layer so as to bridge the first region and the fourth region, so as to bridge the second region and the third region and so as to bridge the third region and the fifth region, wherein;

(A-1) source/drain regions of the first transistor are constituted of the second region and a surface region of the third region which surface region is sandwiched by the first region and the fourth region, (A-2) a channel forming region of the first transistor is constituted of a surface region of the first region sandwiched by the second region and the third region, (B-1) source/drain regions of the second transistor are constituted of the first region and the fourth region, (B-2) a channel forming region of the second transistor is constituted of a surface region of the third region which surface region corresponds to one source/drain region of the first transistor and is sandwiched by the first region and the fourth region, (C-1) gate regions of the junction-field-effect transistor are constituted of the fifth region and a portion of the first region facing the fifth region, (C-2) a channel region of the junction-field-effect transistor is constituted of part of the second region sandwiched by the fifth region and said portion of the first region, (C-3) one source/drain region of the junction-field-effect transistor is constituted of the second region which extends from one end of the channel region of the junction-field-effect transistor and corresponds to one source/drain region of the first transistor, (C-4) the other source/drain region of the junction-field-effect transistor is constituted of the second region extending from the other end of the channel region of the junction-field-effect transistor, (D-1) one source/drain region of the third transistor is constituted of the surface region of the first region corresponding to the channel forming region of the first transistor, (D-2) the other source/drain region of the third transistor is constituted of the fifth region, (D-3) a channel forming region of the third transistor is constituted of the second region corresponding to one source/drain region of the first transistor, (E) the gate region is connected to a first memory-cell-selecting line, (F) the second region is connected to a predetermined potential, and (G) the fourth region is connected to a second memory cell-selecting line.

38. The semiconductor memory cell according to claim 37, wherein a junction portion of the third region and the fourth region forms a diode, and one source/drain region of the first transistor is connected to the second memory-cell-selecting line through the diode.

39. The semiconductor memory cell according to claim 37, wherein the semiconductor memory cell further has a sixth conductive region formed in a surface region of the third region, said sixth region forming a rectifier junction together with the third region,
    a diode is formed of the sixth region and the third region, and
    the third region corresponding to the other source/drain region of the first transistor is connected to the second memory-cell-selecting line through the diode.

40. The semiconductor memory cell according to claim 37, wherein a region containing a high concentration of an impurity having a first conductivity type is formed under the first region.

41. The semiconductor memory cell according to claim 37, wherein the semiconductor memory cell is formed in a well of the first conductivity type.

42. The semiconductor memory cell according to claim 37, wherein the semiconductor memory cell is formed on an insulator.

43. A method for manufacturing a semiconductor memory cell comprising a first transistor of a first conductivity type for read-out, a second transistor of a second conductivity type for write-in, and a junction-field-effect transistor of a first conductivity type for current control,
said semiconductor memory cell having;
    (a) a first semi-conductive region having a second conductivity type,
    (b) a second semi-conductive or conductive region formed in a surface region of the first region, said second region forming a rectifier junction together with the first region,
    (c) a third semi-conductive region formed in a surface region of the first region and spaced from the second region, said third region having a first conductivity type,
    (d) a fourth semi-conductive region formed in a surface region of the third region, said fourth region having the second conductivity type, and
    (e) a gate region shared by the first transistor and the second transistor and formed on a barrier layer so as to bridge the second region and the third region and so as to bridge the first region and the fourth region,
the first transistor having;
    (A-1) source/drain regions constituted of the second region and a surface region of the third region which surface region is sandwiched by the first region and the fourth region, and
    (A-2) a channel forming region constituted of a surface region of the first region sandwiched by the second region and the third region, the second transistor having;
    (B-1) source/drain regions constituted of the first region and the fourth region, and
    (B-2) a channel forming region constituted of a surface region of the third region which surface region corresponds to one source/drain region of the first transistor and is sandwiched by the first region and the fourth region, and
the junction-field-effect transistor having;
    (C-1) gate regions constituted of the fourth region and a portion of the first region facing the fourth region,
    (C-2) a channel region constituted of part of the third region positioned under one source/drain region of the second transistor and sandwiched by the first region and the fourth region,
    (C-3) one source/drain region constituted of a surface region of the third region which surface region extends from one end of the channel region of the junction-field-effect transistor, corresponds to one source/drain region of the first transistor, corresponds to the channel forming region of the second transistor and is sandwiched by the first region and the fourth region, and
    (C-4) the other source/drain region constituted of the third region extending from the other end of the channel region of the junction-field-effect transistor,
said method comprising;
    (1) forming the barrier layer on the surface of the first region, and then, forming the gate region on the barrier layer, and
    (2) forming the first region, the third region and the fourth region by ion implantation in an arbitrary order so as to optimize a distance between the facing gate regions of the junction-field-effect transistor and so as to optimize impurity concentrations of the facing gate regions and the channel region of the junction-field-effect transistor.

44. A method for manufacturing a semiconductor memory cell comprising a first transistor of a first conductivity type for read-out, a second transistor of a second conductivity type for write-in, and a junction-field-effect transistor of a first conductivity type for current control,
said semiconductor memory cell having;
    (a) a first semi-conductive region having a second conductivity type,
    (b) a second semi-conductive region formed in a surface region of the first region, said second region having a first conductivity type,
    (c) a third semi-conductive region formed in a surface region of the first region and spaced from the second region, said third region having the first conductivity type,
    (d) a fourth semi-conductive or conductive region formed in a surface region of the third region, said fourth region forming a rectifier junction together with the third region,
    (e) a fifth semi-conductive or conductive region formed in a surface region of the second regions, said fifth region forming a rectifier junction together with the second region, and
    (f) a gate region shared by the first transistor and the second transistor and formed on a barrier layer so as to bridge the second region and the third region and so as to bridge the first region and the fourth region,
the first transistor having;
    (A-1) source/drain regions constituted of the second region and a surface region of the third region which surface region is sandwiched by the first region and the fourth region,
    (A-2) a channel forming region constituted of a surface region of the first region sandwiched by the second region and the third region,
the second transistor having;
    (B-1) source/drain regions constituted of the first region and the fourth region,
    (B-2) a channel forming region constituted of a surface region of the third region which surface region corresponds to one source/drain region of the first transistor and is sandwiched by the first region and the fourth region, and the junction-field-effect transistor having;

(C-1) gate regions constituted of the fifth region and a portion of the first region facing the fifth region, (C-2) a channel region constituted of part of the second region sandwiched by the fifth region and said portion of the first region, (C-3) one source/drain region constituted of the second region which extends from one end of the channel region of the junction-field-effect transistor and corresponds to one source/drain region of the first transistor, and (C-4) the other source/drain region constituted of the second region extending from the other end of the channel region of the junction-field-effect transistor, said method comprising;

(1) forming the barrier layer on the surface of the first region, and then, forming the gate region on the barrier layer, and (2) forming the first region, the second region and the fifth region by ion implantation in an arbitrary order so as to optimize a distance between the facing gate regions of the junction-field-effect transistor and so as to optimize impurity concentrations of the facing gate regions and the channel region of the junction-field-effect transistor.

* * * * *